US009136297B2

(12) United States Patent
Kurokawa

(10) Patent No.: US 9,136,297 B2
(45) Date of Patent: Sep. 15, 2015

(54) METHOD FOR DRIVING SEMICONDUCTOR DEVICE

(75) Inventor: Yoshiyuki Kurokawa, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 436 days.

(21) Appl. No.: 13/570,458

(22) Filed: Aug. 9, 2012

(65) Prior Publication Data

US 2013/0044917 A1   Feb. 21, 2013

(30) Foreign Application Priority Data

Aug. 19, 2011   (JP) ................. 2011-179737
Aug. 26, 2011   (JP) ................. 2011-184370
Sep. 8, 2011    (JP) ................. 2011-196463

(51) Int. Cl.
*G06K 9/00*       (2006.01)
*H01L 27/146*     (2006.01)
*G01S 17/89*      (2006.01)
*G01S 7/483*      (2006.01)

(52) U.S. Cl.
CPC .......... *H01L 27/14632* (2013.01); *G01S 7/483* (2013.01); *G01S 17/89* (2013.01); *H01L 27/14643* (2013.01)

(58) Field of Classification Search
None
See application file for complete search history.

(56) References Cited

U.S. PATENT DOCUMENTS

| 4,438,455 A | 3/1984 | Tabei |
| 5,422,483 A * | 6/1995 | Ando et al. ............... 250/339.02 |
| 5,731,856 A | 3/1998 | Kim et al. |

(Continued)

FOREIGN PATENT DOCUMENTS

| EP | 1737044 A | 12/2006 |
| EP | 2226847 A | 9/2010 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

(Continued)

*Primary Examiner* — Nancy Bitar
(74) *Attorney, Agent, or Firm* — Eric J. Robinson; Robinson Intellectual Property Law Office, P.C.

(57) ABSTRACT

A method for driving a semiconductor device which enables three-dimensional imaging is provided. The method for driving the semiconductor device also enables a reduction in the size of a pixel, two-dimensional imaging concurrently with the three-dimensional imaging, and/or accurate three-dimensional imaging of a fast-moving object. The distance from a light source to an object is measured by performing a first imaging and a second imaging with respect to the timings of the first irradiation and the second irradiation, respectively. A first photosensor absorbing visible light and a second photosensor absorbing infrared light are overlapped with each other and enable the two-dimensional imaging and the three-dimensional imaging, respectively, to be performed concurrently. Adjacent photosensors detect light reflected off substantially the same point of an object, preventing a reduction in the accuracy of the three-dimensional imaging of a fast-moving object.

20 Claims, 19 Drawing Sheets

(56) References Cited

U.S. PATENT DOCUMENTS

| | | | |
|---|---|---|---|
| 5,744,864 A | 4/1998 | Cillessen et al. | |
| 5,965,875 A | 10/1999 | Merrill | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,747,638 B2 | 6/2004 | Yamazaki et al. | |
| 7,049,190 B2 | 5/2006 | Takeda et al. | |
| 7,061,014 B2 | 6/2006 | Hosono et al. | |
| 7,064,346 B2 * | 6/2006 | Kawasaki et al. | 257/43 |
| 7,105,868 B2 | 9/2006 | Nause et al. | |
| 7,211,825 B2 | 5/2007 | Shih et al. | |
| 7,271,835 B2 | 9/2007 | Iizuka et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,411,620 B2 | 8/2008 | Taniguchi et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,525,523 B2 | 4/2009 | Yamazaki et al. | |
| 7,663,165 B2 | 2/2010 | Mouli | |
| 7,674,650 B2 | 3/2010 | Akimoto et al. | |
| 7,732,819 B2 | 6/2010 | Akimoto et al. | |
| 7,893,932 B2 * | 2/2011 | Kobashi | 345/207 |
| 8,803,164 B2 * | 8/2014 | Kurokawa et al. | 257/80 |
| 8,987,651 B2 * | 3/2015 | Kurokawa | 250/214 R |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0209651 A1 | 11/2003 | Iwasaki | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0157760 A1 * | 7/2006 | Hayashi et al. | 257/293 |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0018075 A1 | 1/2007 | Cazaux et al. | |
| 2007/0024187 A1 | 2/2007 | Shin et al. | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0054319 A1 | 3/2008 | Mouli | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0296568 A1 | 12/2008 | Ryu et al. | |
| 2009/0068773 A1 | 3/2009 | Lai et al. | |
| 2009/0073325 A1 | 3/2009 | Kuwabara et al. | |
| 2009/0101948 A1 | 4/2009 | Park et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0228841 A1 * | 9/2009 | Hildreth | 715/863 |
| 2009/0278122 A1 | 11/2009 | Hosono et al. | |
| 2009/0280600 A1 | 11/2009 | Hosono et al. | |
| 2009/0295769 A1 | 12/2009 | Yamazaki et al. | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0117991 A1 | 5/2010 | Koyama et al. | |
| 2010/0182282 A1 | 7/2010 | Kurokawa et al. | |
| 2011/0109591 A1 | 5/2011 | Kurokawa et al. | |
| 2011/0109592 A1 | 5/2011 | Kurokawa et al. | |
| 2012/0032193 A1 | 2/2012 | Kurokawa et al. | |
| 2012/0056861 A1 | 3/2012 | Kurokawa et al. | |
| 2012/0085890 A1 | 4/2012 | Kurokawa | |
| 2013/0044917 A1 * | 2/2013 | Kurokawa | 382/106 |
| 2013/0162778 A1 * | 6/2013 | Kurokawa | 348/46 |
| 2013/0234027 A1 * | 9/2013 | Kurokawa | 250/338.4 |
| 2013/0250274 A1 * | 9/2013 | Kurokawa | 356/5.01 |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

(56) References Cited

OTHER PUBLICATIONS

Ikeda.T et al., "Full-Functional System Liquid Crystal Display Using CG-Silicon Technology,", SID Digest '04 : SID International Symposium Digest of Technical Papers, 2004, vol. 35, pp. 860-863.
Nomura.K et al., "Room-Temperature Fabrication of Transparent Flexible Thin-Film Transistors Using Amorphous Oxide Semiconductors,", Nature, Nov. 25, 2004, vol. 432, pp. 488-492.
Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.
Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.
Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.
Prins.M et al., "A Ferroelectric Transparent Thin-Film Transistor,", Appl. Phys. Lett. (Applied Physics Letters), Jun. 17, 1996, vol. 68, No. 25, pp. 3650-3652.
Nakamura.M et al., "The phase relations in the $In_2O_3$—$Ga_2ZnO_4$—$ZnO$ system at 1350° C.,", Journal of Solid State Chemistry, Aug. 1, 1991, vol. 93, No. 2, pp. 298-315.
Kimizuka.N et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—$ZnO$ System,", Journal of Solid State Chemistry, Apr. 1, 1995, vol. 116, No. 1, pp. 170-178.
Nomura.K et al., "Thin-Film Transistor Fabricated in Single-Crystalline Transparent Oxide Semiconductor,", Science, May 23, 2003, vol. 300, No. 5623, pp. 1269-1272.
Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630.
Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.
Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.
Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters), Sep. 13, 2004, vol. 85, No. 11, pp. 1993-1995.
Li.C et al., "Modulated Structures of Homologous Compounds $InMO_3(ZnO)_m$ (M=In,Ga; m=Integer) Described by Four-Dimensional Superspace Group,", Journal of Solid State Chemistry, 1998, vol. 139, pp. 347-355.
Son.K et al., "42.4L: Late-News Paper: 4 Inch QVGA AMOLED Driven by the Threshold Voltage Controlled Amorphous GIZO ($Ga_2O_3$—$In_2O_3$—$ZnO$) TFT,", SID Digest '08 : SID International Symposium Digest of Technical Papers, May 20, 2008, vol. 39, pp. 633-636.
Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.
Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.
Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.
Tsuda.K et al., "Ultra Low Power Consumption Technologies for Mobile TFT-LCDs,", IDW '02 : Proceedings of the 9th International Display Workshops, Dec. 4, 2002, pp. 295-298.
Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.
Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.
Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.
Park.J et al., "High performance amorphous oxide thin film transistors with self-aligned top-gate structure,", IEDM 09: Technical Digest of International Electron Devices Meeting, Dec. 7, 2009, pp. 191-194.
Kurokawa.Y et al., "UHF RFCPUS on Flexible and Glass Substrates for Secure RFID Systems,", Journal of Solid-State Circuits, 2008, vol. 43, No. 1, pp. 292-299.
Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.
Coates.D et al., "Optical Studies of the Amorphous Liquid—Cholesteric Liquid Crystal Transition:The "Blue Phase",", Physics Letters, Sep. 10, 1973, vol. 45A, No. 2, pp. 115-116.
Cho.D et al., "21.2:Al and Sn-doped Zinc Indium Oxide Thin Film Transistors for AMOLED Back-Plane," SID Digest '09 : SID International Symposium Digest of Technical Papers, May 31, 2009, pp. 280-283.
Lee.M et al., "15.4:Excellent Performance of Indium—Oxide-Based Thin-Film Transistors by DC Sputtering," SID Digest '09 : SID International Symposium Digest of Technical Papers, May 31, 2009, pp. 191-193.
Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.
Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.
Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.
Park.S et al., "Challenge to Future Displays: Transparent AM-OLED Driven by PEALD Grown ZnO TFT,", IMID '07 Digest, 2007, pp. 1249-1252.
Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.
Osada.T et al., "Development of Driver-Integrated Panel using Amorphous In—Ga—Zn—Oxide TFT,", AM-FPD '09 Digest of Technical Papers, Jul. 1, 2009, pp. 33-36.
Hirao.T et al., "Novel Top-Gate Zinc Oxide Thin-Film Transistors (ZnO TFTs) for AMLCDs,", Journal of the SID, 2007, vol. 15, No. 1, pp. 17-22.
Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.
Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.
Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.
Miyasaka.M, "Suftla Flexible Microelectronics on Their Way to Business,", SID Digest '07 : SID International Symposium Digest of Technical Papers, 2007, vol. 38, pp. 1673-1676.

(56) References Cited

OTHER PUBLICATIONS

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel, YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Brown.C et al., "31.3: A System LCD with Integrated 3-Dimensional Input Device,", SID Digest '10 : SID International Symposium Digest of Technical Papers, 2010, pp. 453-456.

Tanaka.K et al., "45.5: A System LCD with Optical Input Function using Infra-Red Backlight Subtraction Scheme,", SID Digest '10 : SID International Symposium Digest of Technical Papers, 2010, pp. 680-683.

Jeon.S et al., "180nm Gate Length Amorphous InGaZnO Thin Film Transistor for High Density Image Sensor Applications,", IEDM 10: Technical Digest of International Electron Devices Meeting, Dec. 6, 2010, pp. 504-507.

Kim.S et al., "A Three-Dimensional Time-of-Flight CMOS Image Sensor With Pinned-Photodiode Pixel Structure,", IEEE Electron Device Letters, Nov. 1, 2010, vol. 31, No. 11, pp. 1272-1274.

Kim.S et al., "A 640×480 Image Sensor with Unified Pixel Architecture for 2D/3D Imaging in 0.11 μm CMOS," 2011 Symposium on VLSI Technology: Digest of Technical Papers, Jun. 15, 2011, pp. 92-93.

* cited by examiner

FIG. 5
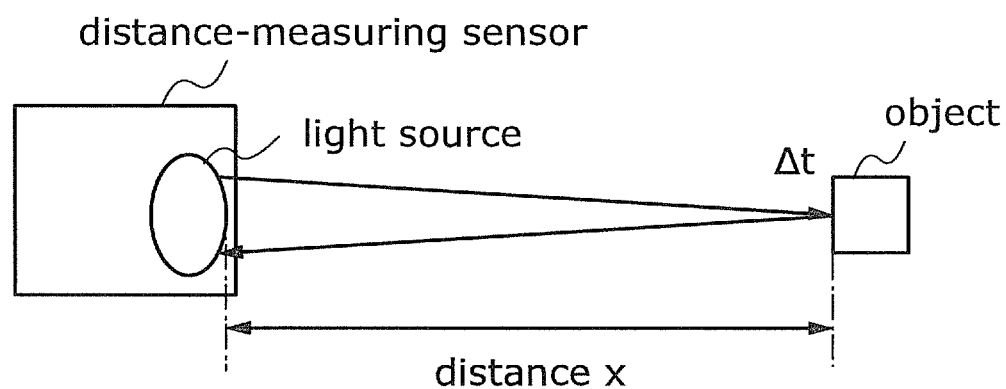
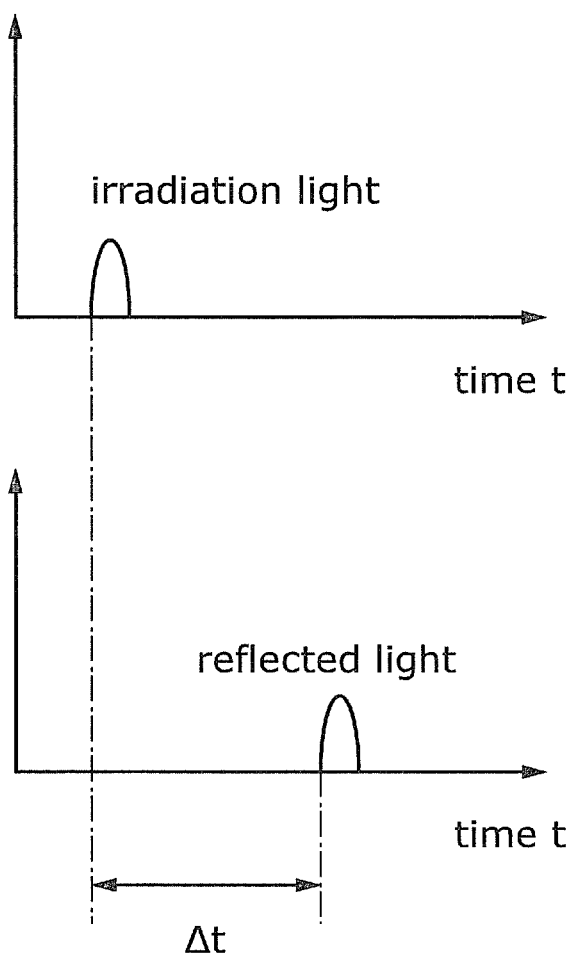

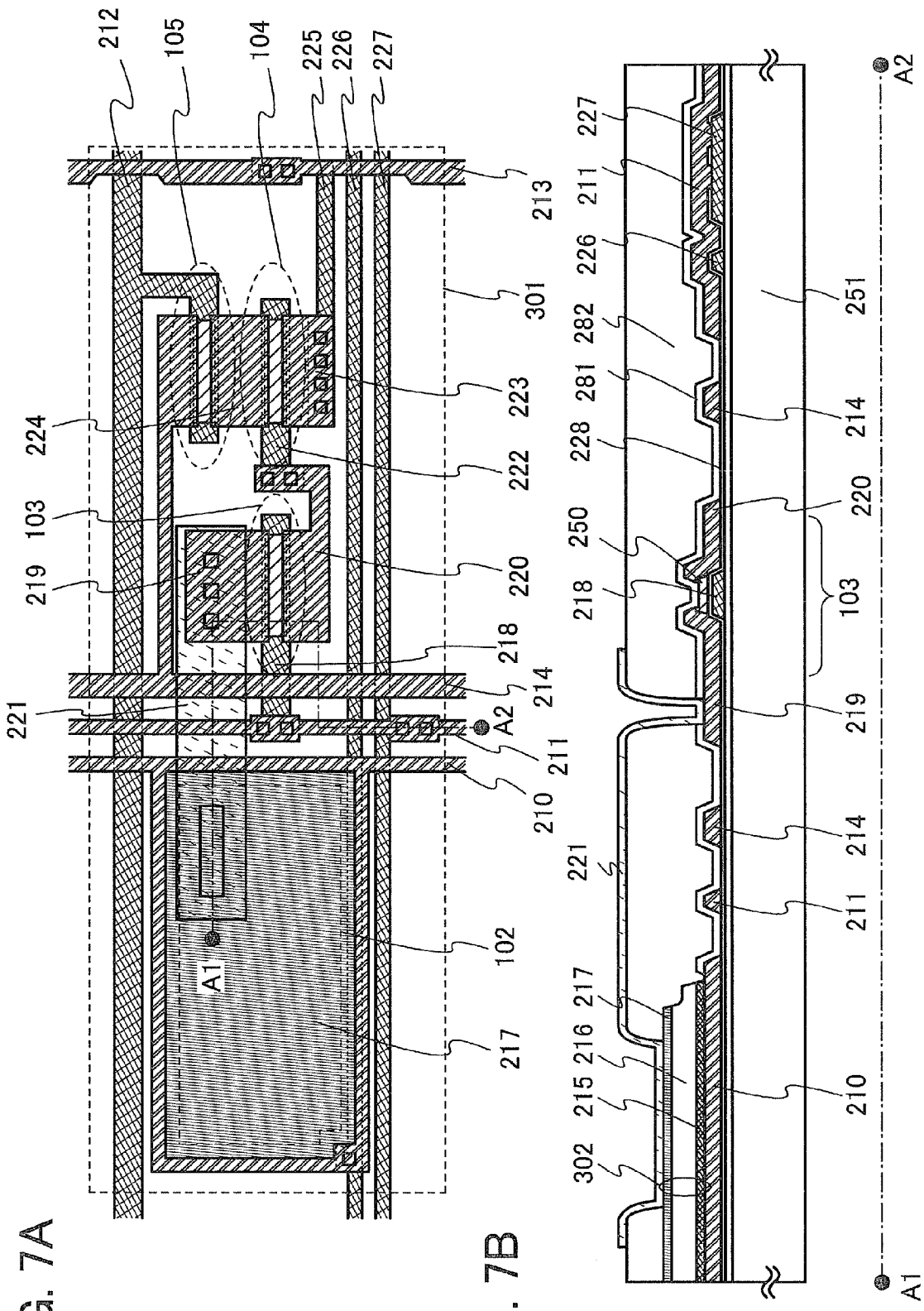

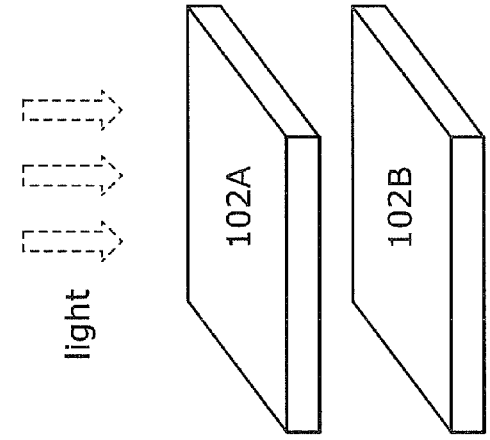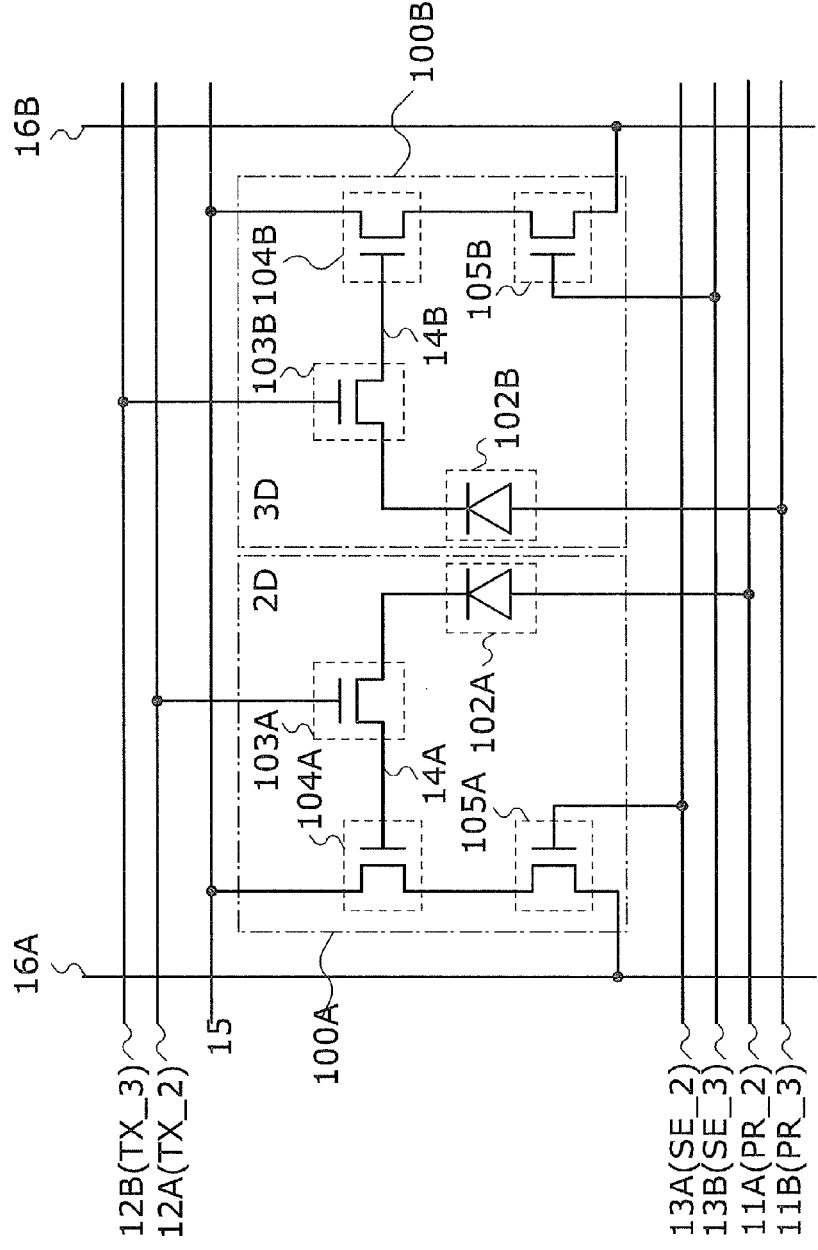

METHOD FOR DRIVING SEMICONDUCTOR DEVICE

BACKGROUND OF THE INVENTION

1. Field of the Invention

The present invention relates to a method for driving a semiconductor device including a photosensor, particularly to a method for driving the semiconductor device using the time of flight (TOF) method.

2. Description of the Related Art

There has been increasing interest in three-dimensional distance-measuring sensors which can detect the distance from a light source to an object with a detection signal dependent on the time difference between the arrival times of light. Three-dimensional distance-measuring sensors are expected to have a wide range of applications such as virtual keyboards, devices for input of information obtained by gesture recognition and the like, visual sensors in various robots, security systems, sensors for smart air bags, and sensors for cars.

Moving body detecting sensors are used for crime prevention, such as intruder detection, and detection of unusual events, such as falls in a restroom or bathroom, in consideration of, for example, the advance of the aging society and consumer needs that require safer and more comfortable living environments. In order to detect the conditions of a moving person or object more accurately, a technique for obtaining accurate information on a moving body (e.g., the presence, position, motion, and size of an object) has been developed.

The TOF method is a method in which time difference between the time at which light emitted from a light source (a distance-measuring sensor), called "irradiation light", arrives at an object and the time at which light reflected off the object, called "reflected light", arrives at the distance-measuring sensor is detected, and the distance from the light source to the object is obtained by calculation. The distance from the light source to the object (distance x) can be expressed by Equation 1, where c is the speed of light ($3 \times 10^8$ m/s), and $\Delta t$ is the time difference (see FIG. 5).

$$x = \frac{(c \times \Delta t)}{2} \quad \text{[Equation 1]}$$

As an example of a three-dimensional distance-measuring sensor, Non Patent Document 1 discloses a three-dimensional distance-measuring device that performs three-dimensional distance measurement by performing, with the TOF method, three-dimensional imaging in which a period for detecting reflected infrared light is divided into two periods to obtain different detection signals.

According to Non Patent Document 2, two-dimensional imaging that provides two-dimensional information (e.g. the intensity of light reflected off an object and the color of the object) and three-dimensional imaging that provides three-dimensional information (the distance from a light source to an object) are alternately performed every frame period using the structure of a photosensor according to Non Patent Document 1. The three-dimensional imaging is performed with the TOF method by emitting infrared light more than once.

REFERENCE

Non Patent Document

[Non Patent Document 1] S. J. Kim et al, "A Three-Dimensional Time-of-Flight CMOS Image Sensor With Pinned-Photodiode Pixel Structure", IEEE Electron Device Letter, Vol. 31, No. 11, November 2010.

[Non Patent Document 2] S. J. Kim et al, "A 640×480 Image Sensor with Unified Pixel Architecture for 2D/3D Imaging in 0.11 µm CMOS", 2011 Symposium on VLSI Circuits Digest of Technical Papers, pp. 92-93.

SUMMARY OF THE INVENTION

In CMOS image sensors, pixels are required to be reduced in size. In a general photosensor in a CMOS image sensor, charge generated by photoelectric conversion performed with a photodiode is transmitted to and stored in a storage node, is amplified, and then is read as a detection signal.

Non Patent Document 1 proposes a method in which the distance from a light source to an object is measured using the TOF method in such a manner that an imaging period is controlled such that reflected infrared light is detected during two imaging periods: an imaging period where an irradiation period overlaps with a reflection period, and an imaging period where an irradiation period does not overlap with a reflection period. To achieve this method, however, a photosensor of the general type including an additional transistor needs to be used. An increase in the number of elements in a photosensor inhibits a reduction in pixel size.

In the method proposed by Non Patent Document 1, infrared light is emitted twice to obtain different detection signals, but it is difficult to detect reflected infrared light without interruption. In other words, there is a time difference between the end of the first imaging and the initiation of the next imaging. For this reason, the method is not suitable for detection of the position of a moving body. In particular, when an object moves fast, the accuracy of position detection is significantly decreased.

In the method proposed by Non Patent Document 2, the frame period needs to be switched between two-dimensional imaging and three-dimensional imaging. Therefore, there is a time difference between the time at which information is obtained by two-dimensional imaging and the time at which information is obtained by three-dimensional imaging; thus, it is difficult to obtain both pieces of information concurrently.

Moreover, when the channel width of a storage transistor electrically connected to a photodiode is increased, giving a high priority to efficiency of transmitting charge, the off-state current of the transistor increases and the charge retention characteristics of a photosensor degrade.

In view of the above problems, an object is to provide a method for driving a semiconductor device, which enables a reduction in the size of a pixel and three-dimensional imaging.

Another object is to provide a method for driving a semiconductor device, which enables a reduction in the size of a pixel and enables two-dimensional imaging and three-dimensional imaging to be performed concurrently.

Another object is to provide a method for driving a semiconductor device, which enables a reduction in the size of a pixel and accurate detection of the position of a moving body.

Another object is to provide a method for driving a semiconductor device with excellent charge retention characteristics.

The distance from a light source to an object is measured in the following manner: a first irradiation and a second irradiation are performed for the same length of time at different timings; a first imaging and a second imaging are performed with respect to the timings of the first irradiation and the second irradiation, respectively; a first detection signal dependent on the time difference between the arrival times of light is obtained through the first imaging; a second detection signal dependent on the time difference between the arrival times of light is obtained through the second imaging. The potential of a gate electrode of a transistor that changes the amount of charge stored in a node in a photosensor is controlled, achieving three-dimensional imaging and a reduction in the size of the pixels in the semiconductor device.

One embodiment of the present invention is a method for driving a semiconductor device, including the steps of: performing a first irradiation and a second irradiation of an object with light from a light source for the same length of time at different timings; detecting, with a photodiode, first reflected light from the object generated by the first irradiation and second reflected light from the object generated by the second irradiation; performing a first imaging by applying a high potential to a gate electrode of a transistor during a period which starts after the initiation of the first irradiation and in which a first irradiation period and a first reflection period overlap with each other, the transistor changing an amount of charge in a node with photocurrent from the photodiode; performing a second imaging by applying the high potential to the gate electrode during a period that starts after the end of the second irradiation and that is included in a second reflection period; obtaining a first detection signal S1 by the first imaging, and a second detection signal S2 by the second imaging, the first detection signal S1 and the second detection signal S2 being expressed using a time difference between a time at which the first irradiation period starts and a time at which the first reflection period starts Δt and a proportionality constant α; and obtaining, with the first detection signal and the second detection signal, a distance x from the light source to the object by using the following equation:

$$x = \frac{(c \times T \times S2)}{2 \times (S1 + S2)},$$

where T is the first irradiation period and c is a speed of light.

One embodiment of the present invention is a method for driving a semiconductor device, including the steps of: performing a first irradiation and a second irradiation of an object with light from a light source for the same length of time at different timings; detecting, with a photodiode, first reflected light from the object generated by the first irradiation and second reflected light from the object generated by the second irradiation; performing a first imaging by applying a high potential to a gate electrode of a transistor during a period which starts after the initiation of the first irradiation and in which a first irradiation period and a first reflection period overlap with each other, the transistor changing an amount of charge in a node with photocurrent from the photodiode, the first imaging involving a large amount of change in the amount of charge stored in the node electrically connected to one of a source electrode and a drain electrode of the transistor; performing a second imaging by applying the high potential to the gate electrode during a period that starts after the end of the second irradiation and is included in a second reflection period, the second imaging involving a small amount of change in the amount of charge stored in the node electrically connected to the one of the source electrode and the drain electrode of the transistor; obtaining a first detection signal S1 by the first imaging, and a second detection signal S2 by the second imaging, the first detection signal S1 and the second detection signal S2 being expressed using a time difference between a time at which the first irradiation period starts and a time at which the first reflection period starts Δt and a proportionality constant α; and obtaining, with the first detection signal and the second detection signal, a distance x from the light source to the object by using the following equation:

$$x = \frac{(c \times T \times S2)}{2 \times (S1 + S2)},$$

where T is the first irradiation period and c is a speed of light.

The distance from a light source to an object is measured in the following manner: a first irradiation and a second irradiation are performed for the same length of time at different timings; a first imaging and a second imaging are performed with respect to the timings of the first irradiation and the second irradiation, respectively; a first detection signal dependent on the time difference between the arrival times of light is obtained through the first imaging; a second detection signal dependent on the time difference between the arrival times of light is obtained through the second imaging. Further, a third imaging is performed during a period including the first imaging period and the second imaging period, to obtain a third detection signal. Moreover, a first photosensor absorbing visible light and transmitting infrared light and a second photosensor absorbing infrared light are provided so as to overlap with each other. The first photosensor first absorbs visible light, and the second photosensor absorbs mainly infrared light. Thus, the size of the pixels in the semiconductor device can be reduced, and two-dimensional imaging and three-dimensional imaging can be performed concurrently.

One embodiment of the present invention is a method for driving a semiconductor device including: a first photodiode including a first semiconductor layer absorbing visible light and transmitting first infrared light and second infrared light; and a second photodiode including a second semiconductor layer absorbing the first infrared light and the second infrared light. The first photodiode and the second photodiode overlap with each other, the method comprising the steps of: performing a first infrared light irradiation and a second infrared light irradiation of an object with light from a light source for the same length of time at different timings; absorbing the visible light with the first photodiode; applying a high potential to a gate electrode of a first transistor during at least a first period starting before the first photodiode is irradiated with reflected light resulting from the first infrared light and being reflected off the object and terminating after the first photodiode is irradiated with reflected light resulting from the second infrared light and being reflected off the object, the first transistor changing an amount of charge in a first node with photocurrent from the first photodiode; obtaining two-dimensional information of the object by detecting the visible light during the first period; absorbing the first infrared light and the second infrared light with the second photodiode; applying a high potential to a gate electrode of a second transistor during a second period which starts after the initiation of the first infrared light irradiation and in which a first infrared light irradiation period and a first infrared light reflection period overlap with each other, the second transistor changing an amount of charge in a second node with photocurrent from the second photodiode; obtaining a first detection signal S1 by detecting the first infrared light during the second period; applying the high potential to the gate electrode of the second transistor during a third period that starts after the end of the second infrared light irradiation and is included in a second infrared light reflection period, the second transistor changing the amount of charge in the second node with photocurrent from the second photodiode; obtaining a second detection signal S2 by detecting the second infrared light during the third period; and obtaining three-dimensional information of the object by detecting, with the first detection signal S1 and the second detection signal S2, a distance x from the light source to the object by the following equation:

$$x = \frac{(c \times T \times S2)}{2 \times (S1 + S2)},$$

where T is the first infrared light irradiation period and c is a speed of light. The first detection signal S1 and the second detection signal S2 are expressed using, a time difference between a time at which the first infrared light irradiation starts and a time at which the first infrared light reflection period starts Δt and a proportionality constant α.

In the above, the first semiconductor layer may include amorphous silicon.

In the above, the second semiconductor layer may include crystalline silicon or single crystal silicon.

The object is irradiated with light from the light source. The first photodiode and the second photodiode adjacent to each other absorb reflected light. The first imaging, which is performed with the first photosensor including the first photodiode, and the second imaging, which is performed with the second photosensor including the second photodiode, are sequentially performed. During the first imaging period, light reflected off the object during light irradiation is detected with the first photosensor, so that a first detection signal is obtained. During the second imaging period, light reflected off the object after the end of the light irradiation is detected with the second photosensor, so that a second detection signal is obtained. Thus, there is no time difference between the termination of the first imaging and the initiation of the second imaging. Therefore, even when the object is a moving body, the distance from the light source to the object can be measured without decreasing the accuracy of position detection.

One embodiment of the present invention is a method for driving a semiconductor device, including the steps of: subjecting an object to light irradiation, the object being irradiated with light from a light source; absorbing, with a first photodiode and a second photodiode adjacent to each other, light reflected off the same point of the object; performing a first imaging by applying a high potential to a gate electrode of a first transistor during a first period which starts after the initiation of the light irradiation and in which a light irradiation period and a reflection period overlap with each other, the first transistor changing an amount of charge in a first node with photocurrent from the first photodiode; obtaining a first detection signal S1 by detecting the reflected light entering the first photodiode during the first period; performing a second imaging by applying the high potential to a gate electrode of a second transistor that changes an amount of charge stored in a second node, the application being performed with photocurrent from the second photodiode during a second period that starts after the end of the light irradiation and that is included in the reflection period; obtaining a second detection signal S2 by detecting the reflected light entering the second photodiode during the second period; and obtaining the first detection signal S1 by the first imaging, and the second detection signal S2 by the second imaging, the first detection signal S1 and the second detection signal S2 being expressed using a time difference between a time at which the irradiation period starts and a time at which the reflection period starts Δt and a proportionality constant α; and detecting, with the first detection signal and the second detection signal, a distance x from the light source to the object by the following equation:

$$x = \frac{(c \times T \times S2)}{2 \times (S1 + S2)},$$

where T is the irradiation period and c is a speed of light.

In the above, the object may be a moving body.

In the above, the object may move fast.

In the above, a semiconductor layer in the transistor may include an oxide semiconductor material.

In the above, a semiconductor layer in the transistor may include a silicon material.

With the above structure, at least one of the above-described problems can be solved.

In this specification, "reflected light detection" refers to "net imaging". Therefore, "reflected light detection start time" refers to "net imaging start time", but is different from "imaging start time". Similarly, "reflected light detection end time" refers to "net imaging end time", but is different from "imaging end time".

In this specification, "first imaging" refers to "first net imaging", while "second imaging" refers to "second net imaging".

According to one embodiment of the present invention, the potential of a gate electrode of a transistor that changes the amount of charge stored in a node is controlled with photocurrent generated by a photodiode in response to incident light; thus, the photosensor can be composed of fewer elements and three-dimensional imaging is achieved, resulting in a reduction in the size of the pixels in the semiconductor device. Further, the first photodiode absorbing visible light and the second photodiode absorbing infrared light are provided so as to overlap with each other; therefore, two-dimensional imaging and three-dimensional imaging can be performed concurrently. Furthermore, the potentials of the gate electrodes of transistors electrically connected to adjacent photodiodes are controlled, so that three-dimensional imaging of a moving body can be achieved. Increasing the retention characteristics of the transistors can improve the performances of the photosensors and provides a driving method advantageous in the TOF method.

BRIEF DESCRIPTION OF THE DRAWINGS

FIG. 5 is a diagram illustrating the TOF method.
FIGS. 7A and 7B are a top view and a cross-sectional view of the photosensor.
FIGS. 10A and 10B are diagrams of photosensors.

DETAILED DESCRIPTION OF THE INVENTION

Figure 1:
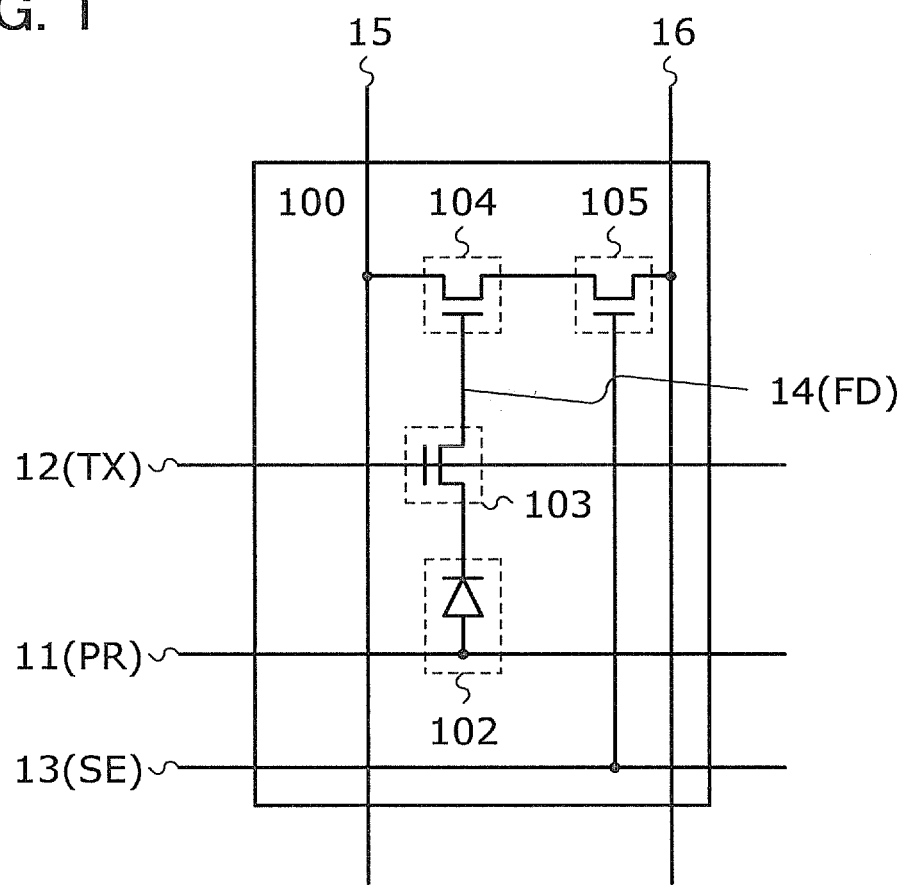
FIG. 1 is a diagram of a photosensor.

Embodiments will be described in detail with reference to the drawings. Note that the present invention is not limited to the following description, and it will be easily understood by those skilled in the art that modes and details thereof can be variously changed without departing from the spirit and the scope of the present invention. Therefore, the present invention should not be construed as being limited to the description in the following embodiments. Note that in the structures of the invention described below, the same portions or portions having similar functions are denoted by the same reference numerals in different drawings, and description of such portions is not repeated.

Embodiment 1

In this embodiment, a method for driving a semiconductor device using the TOF method is described with reference to FIG. 1, FIG. 2, FIG. 3, and FIG. 4. Specifically, a description is given of a method for driving a semiconductor device, in which the distance from a light source to an object is measured in the following manner. A first imaging and a second imaging are performed with respect of the timings of a first irradiation period and a second irradiation period (which have the same length of time and are performed at different timings), respectively. A first detection signal dependent on the time difference between the arrival times of light is obtained through a first reflected light detection based on a first reflection, and a second detection signal dependent on the time difference between the arrival times of light is obtained through a second reflected light detection based on a second reflection.

A semiconductor device according to one embodiment of the invention disclosed in this specification includes a photosensor composed of three transistors and one photodiode. FIG. 1 is an example of a circuit diagram illustrating a configuration of a photosensor 100 included in the semiconductor device. The photosensor 100 includes a photodiode 102, a transistor 103, a transistor 104, and a transistor 105.

A first signal line 11 is a reset signal line (PR). A second signal line 12 is a charge storage signal line (TX). A third signal line 13 is a selection signal line (SE). A fifth signal line 15 is a photosensor reference signal line. A sixth signal line 16 is a photosensor output signal line.

In the photosensor 100, one electrode of the photodiode 102 is electrically connected to the first signal line 11. The other electrode of the photodiode 102 is electrically connected to one of a source electrode and a drain electrode of the transistor 103. The other of the source electrode and the drain electrode of the transistor 103 is electrically connected to a gate electrode of the transistor 104 and the node 14. One of a source electrode and a drain electrode of the transistor 104 is electrically connected to the fifth signal line 15. One of a source electrode and a drain electrode of the transistor 105 is electrically connected to the sixth signal line 16. The other of the source electrode and the drain electrode of the transistor 104 is electrically connected to the other of the source electrode and the drain electrode of the transistor 105. A gate electrode of the transistor 103 is electrically connected to the second signal line 12. A gate electrode of the transistor 105 is electrically connected to the third signal line 13.

FIG. 1 illustrates a configuration where an anode of the photodiode 102 is electrically connected to the first signal line 11 and a cathode of the photodiode 102 is electrically connected to one of the source electrode and the drain electrode of the transistor 103; however, the present invention is not limited to this. The cathode of the photodiode 102 may be electrically connected to the first signal line 11, and the anode of the photodiode 102 may be electrically connected to one of the source electrode and the drain electrode of the transistor 103.

The photodiode 102 is a photoelectric converter that generates photocurrent dependent on light entering the photodiode. Therefore, when light reflected off an object is detected, photocurrent flows through the photodiode 102.

The transistor 103 serves as a transistor that controls the net imaging period. In one embodiment of the present invention, positive charge is accumulated in the node 14 by setting the potentials of the first signal line 11 and the gate electrode of the transistor 103 (the second signal line 12) from low to high. Imaging is started by setting the potential of the first signal line 11 from high to low while the potential of the gate electrode of the transistor 103 (the second signal line 12) is held high. Negative charge is accumulated in the node 14 in accordance with light entering the photodiode 102. The imaging terminates when the potential of the gate electrode of the transistor 103 (the second signal line 12) is set from high to low.

According to this embodiment, during the first imaging, the potentials of the first signal line 11 and the second signal line 12 are controlled such that detection of the first reflected light starts when the first imaging starts and the first irradiation terminates when the first imaging terminates. During the second imaging, the potentials of the first signal line 11 and the second signal line 12 are controlled such that the second irradiation terminates when the second imaging starts and detection of the second reflected light terminates when the second imaging terminates.

In other words, the potentials of the first signal line 11 and the second signal line 12 may be controlled such that the gate electrode of the transistor 103 is high during a period where the first irradiation period overlaps with the first reflection period, during a period which starts after the initiation of the second irradiation and where the second irradiation period does not overlap with the second reflection period, during a first reflected light detection period, and during a second reflected light detection period.

The transistor 104 serves as a transistor that amplifies charge accumulated in the node 14. The transistor 105 serves as a transistor that controls the output of the photosensor. A signal is read when the signal input to the gate electrode of the transistor 105 (the potential of the third signal line 13) goes from low to high.

As described above, the photosensor 100 includes four elements: one photodiode and three transistors. Since the photosensor can be composed of fewer elements, high integration of the photosensor and a reduction in pixel size can be facilitated.

Note that a semiconductor layer in the transistor 103 is preferably an oxide semiconductor layer. In order to hold charge, which is generated when the photodiode 102 is irradiated with light, in the node 14 for a long period of time, the transistor 103 electrically connected to the photodiode needs to be a transistor with extremely low off-state current. Therefore, when the semiconductor layer is formed of an oxide semiconductor material, performance of the photosensor 100 can be increased.

When a high priority is given to reducing the time required for accumulating charge, which is generated when the photodiode 102 is irradiated with light, in the node 14, the semiconductor layer in the transistor 103 may be formed of a material such as amorphous silicon, microcrystalline silicon, polycrystalline silicon, or single crystal silicon. Such material provides a transistor with high mobility, enabling charge to be accumulated in the node 14 in a short time.

A method for driving a semiconductor device including the photosensor 100 is described. With the driving method, the distance from a light source to an object can be measured by three-dimensional imaging using the TOF method.

The driving method is described in detail with reference to timing charts of FIG. 2 and FIG. 3. First, a description is given with reference to FIG. 2 of the operation of the photosensor 100. Next, a description is given with reference to FIG. 3 of the features of the driving method and a distance measuring method achieved by three-dimensional imaging using the TOF method.

Figure 2:
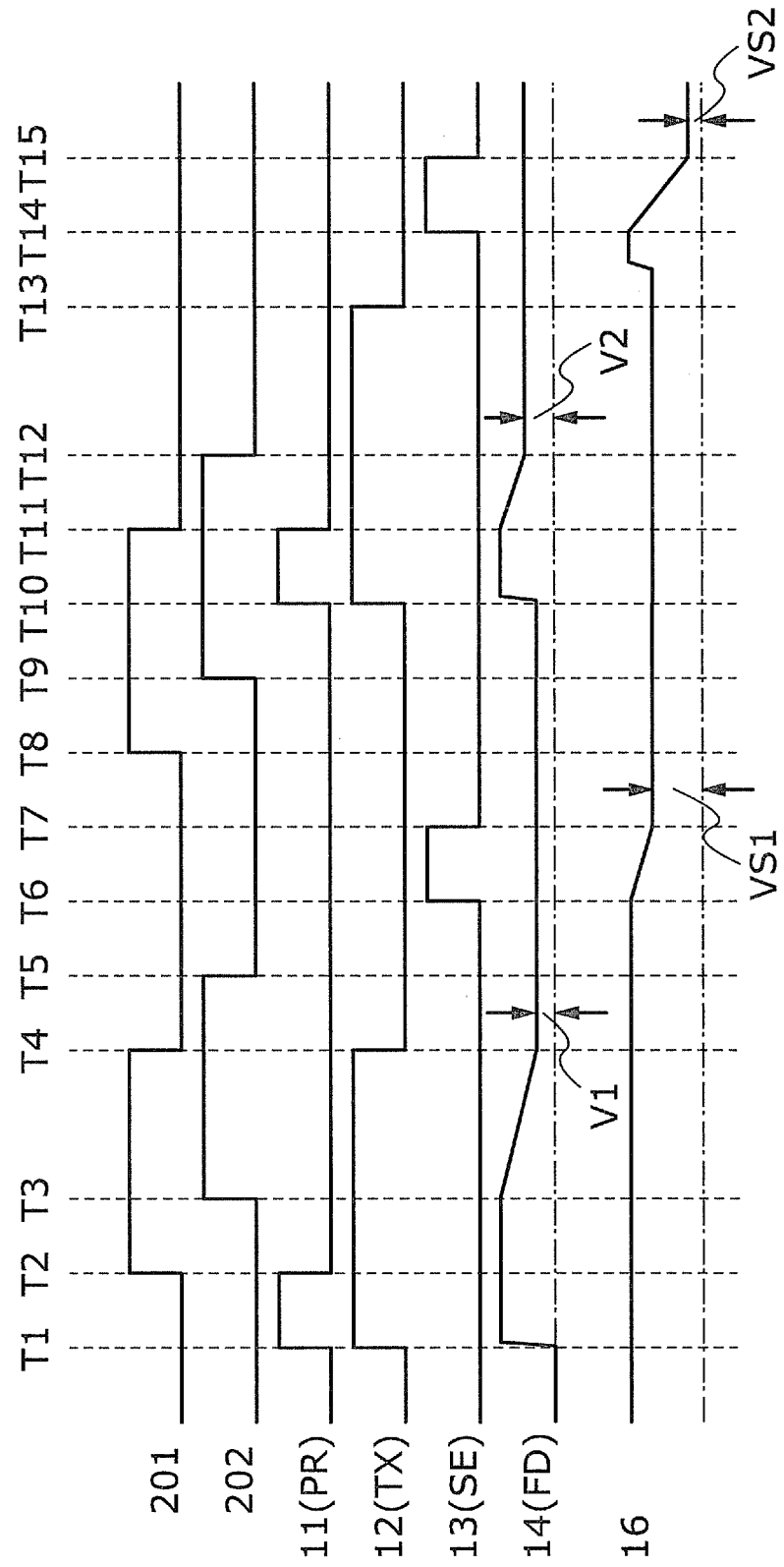
FIG. 2 is a chart illustrating pulses for the photosensor.
Figure 3:
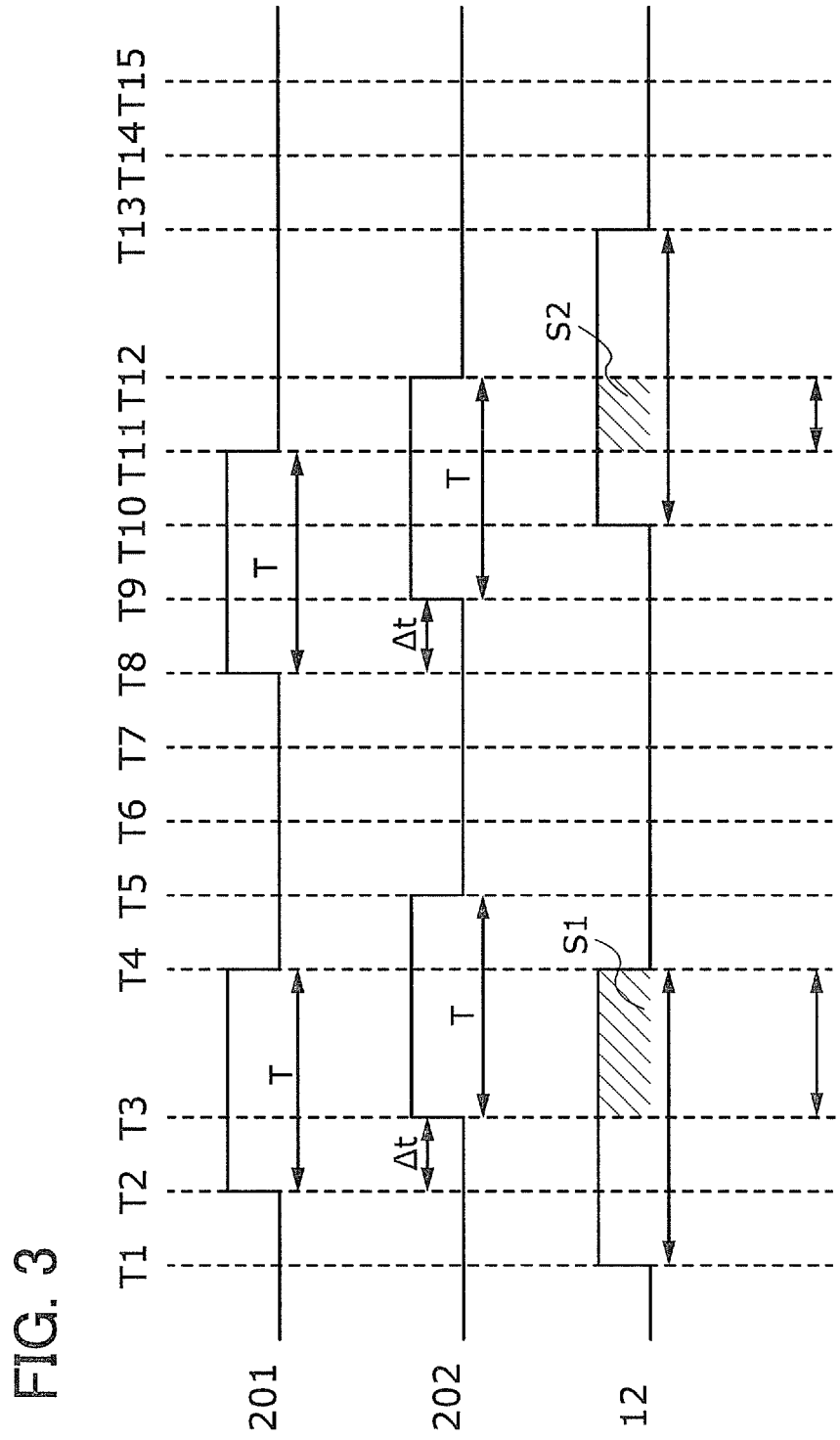
FIG. 3 is a chart illustrating pulses for the photosensor.

In the timing charts of FIG. 2 and FIG. 3, the high level of a pulse 201 and a pulse 202 represents "irradiation", while the low level thereof represents "non-irradiation". The high level of the other pulses represents a high potential, while the low level thereof represents a low potential.

FIG. 2 is a timing chart of the photosensor 100. During a period from time T1 to time T15, the object is irradiated with light from the light source twice (the first irradiation and the second irradiation). Note that the second irradiation and first irradiation are performed for the same length of time at different timings. The distance from a light source to an object is unchanged during the first irradiation and during the second irradiation. The period between time T2 and time T3 (time difference) and the period between time T8 and T9 (time difference) have the same length of time.

At the time T1, the first signal line 11 is brought high. Further, the second signal line 12 is brought high (a first reset). At this time, electrical continuity between the photodiode 102 and the transistor 103 is established and the node 14 goes high.

At the time T2, the first irradiation in which the object is irradiated with light from the light source starts. The pulse 201 goes from low (non-irradiation) to high (irradiation). The time T2 is a first irradiation start time. Further, the first signal line 11 is brought low, and the second signal line 12 is held high.

At the time T3, first irradiation light emitted from the light source is reflected off the object, and first reflected light starts to enter the semiconductor device. The pulse 202 goes from low (non-irradiation) to high (irradiation). The time T3 is a first reflection start time.

The time T3 is also a first reflected light detection start time. Detection of reflected light can be started at the time T3.

From the time T3 to the time T4 (during the first reflected light detection, i.e. the first net imaging), the potential of the node 14 changes according to the intensity of the first reflected light. The potential of the node 14 starts to decrease from high owing to the off-state current of the photodiode 102. The off-state current is proportional to irradiation time and the intensity of light entering the photodiode 102 (reflected light).

Here, a description is given of a relation between a change in the potential of the node 14, irradiation time, and the intensity of light entering the photodiode 102 (reflected light). If the detection period is fixed, as the intensity of the light increases, the amount of change in the potential of the node 14 increases. If the light intensity is fixed, as the length of the light detection period increases, the amount of change in the potential of the node 14 increases. Therefore, as the intensity of the light increases and the length of the light detection period increases, the off-state current of the photodiode 102 increases and the amount of change in the potential of the node 14 increases.

At the time T4, the first irradiation in which the object is irradiated with light from the light source terminates. The pulse 201 goes from high (irradiation) to low (non-irradiation). The time T4 is a first irradiation end time. The second signal line 12 is brought low. At this time, the first imaging terminates. Note that the first imaging end time coincides with the first irradiation end time. The time T4 is also a first reflected light detection end time.

The potential of the node 14 becomes constant after the time T4. The potential of the node 14 at the time T4 (V1) is dependent on photocurrent generated by the photodiode 102 during the first reflected light detection. This means that the potential of the node 14 is determined by light intensity and the like.

The first detection signal is determined by the potential of the node 14 at the time T4 (V1). As the length of the first reflected light detection period increases, the amount of change in the potential of the node 14 increases, so that the potential of the node 14 at the time T4 (V1) is low.

Note that all of the light entering the photodiode 102 from the time T1 to the time T4 corresponds to the first reflected light, i.e., light reflected off an object irradiated with light from the light source.

At the time T5, entrance of the first reflected light reflected off the object to the semiconductor device terminates. The pulse 202 goes from high (irradiation) to low (non-irradiation). The time T5 is a first reflection end time.

When the second signal line 12 is brought low, parasitic capacitance between the second signal line 12 and the node 14 causes a change in the potential of the node 14. A significant change in the potential inhibits obtainment of accurate photocurrent generated by the photodiode 102 through the first imaging. Therefore, effective methods of reducing the influence of parasitic capacitance are, for example, to reduce the gate-source capacitance of the transistor 103 or the gate-drain capacitance of the transistor 103 and to connect a storage capacitor to the node 14. The photosensor 100 according to one embodiment of the present invention employs these methods, so that a change in the potential of the node 14 due to parasitic capacitance can be made negligible.

At the time T6, the third signal line 13 is brought high (a first read starts). At this time, the transistor 105 conducts. Moreover, electrical continuity between the fifth signal line 15 and the sixth signal line 16 is established through the transistor 104 and the transistor 105. Then, the potential of the sixth signal line 16 decreases. Note that the sixth signal line 16 is precharged high before the time T6.

Figure 4:
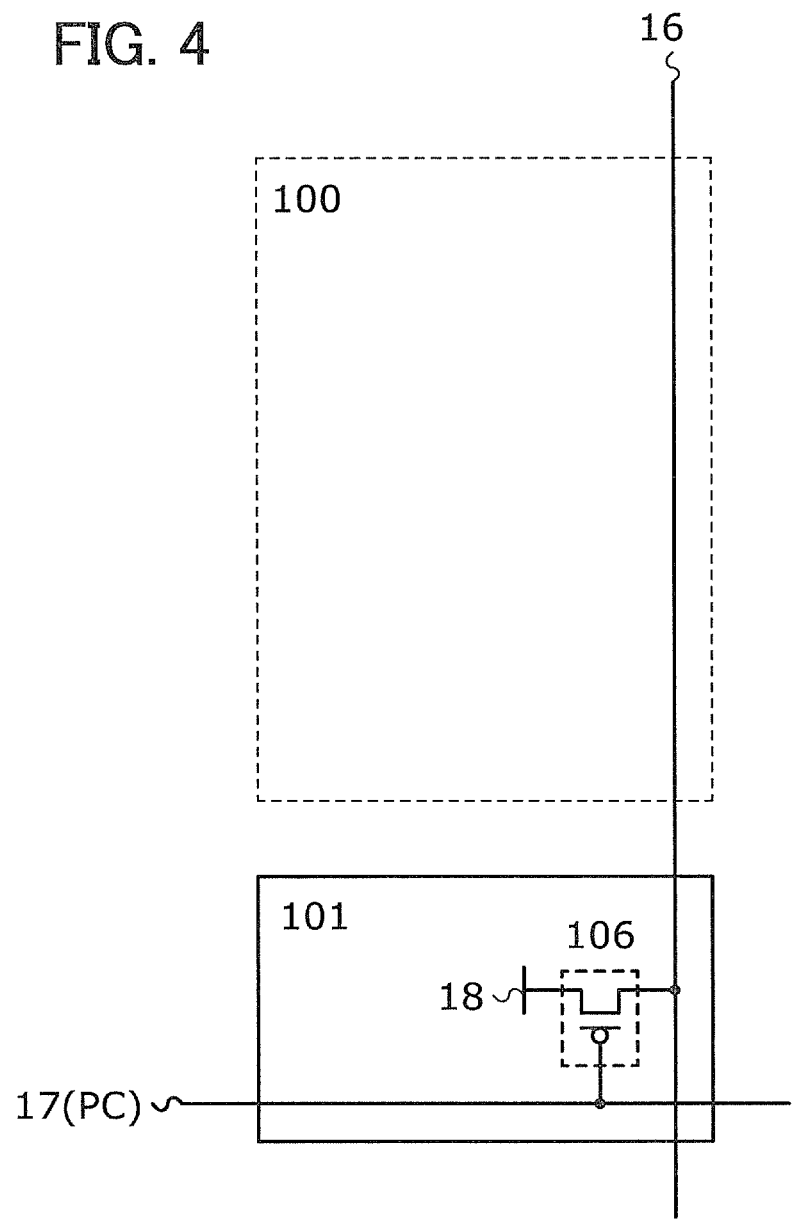
FIG. 4 is a diagram of a read circuit.

There is no limitation on the configuration of a read circuit with which the sixth signal line 16 is precharged. As illustrated in FIG. 4, a read circuit 101 can be composed of one p-channel transistor 106. A seventh signal line 17 is a precharge signal line. A node 18 is a high potential supply line. A gate electrode of the transistor 106 is electrically connected to the seventh signal line 17. One of a source electrode and a drain electrode of the transistor 106 is electrically connected to the sixth signal line 16. The other of the source electrode and the drain electrode of the transistor 106 is electrically connected to the node 18.

At the time T7, the third signal line 13 is brought low (the first read terminates). Then, the transistor 105 is turned off, and the potential of the sixth signal line 16 becomes constant. The potential of the sixth signal line 16 at the time T7 ($V_{S1}$) is dependent on the speed at which the potential of the sixth signal line 16 changes during a period from the time T6 to the time T7.

Note that the speed at which the potential of the sixth signal line 16 changes is dependent on the source-drain current of the transistor 104, i.e., irradiation time and the intensity of light entering the photodiode 102 (reflected light) in the first imaging. If the irradiation time is fixed, as the light intensity increases, the speed at which the potential of the sixth signal line 16 changes decreases. If the light intensity is fixed, as the length of the light detection period increases, the speed at which the potential of the sixth signal line 16 changes decreases. As the speed at which the potential of the sixth signal line 16 changes decreases, the potential of the sixth signal line 16 at the time T7 ($V_{S1}$) increases.

For this reason, by obtaining the potential of the sixth signal line 16 at the time T7 ($V_{S1}$) by the first reflected light detection, the amount of light entering the photodiode 102 (reflected light) during the first imaging period (the product of time and the intensity of such light) can be detected; thus, a detection signal S1 is produced. Assuming that the light intensity during the first irradiation is fixed and only the first reflected light enters the photodiode, the potential of the sixth signal line 16 ($V_{S1}$) is substantially proportional to the length of the first reflected light detection period.

The following describes the relation between the potential of the node 14 and the potential of the sixth signal line 16. When the intensity of light entering the photodiode 102 (reflected light) is high, the amount of change in the potential of the node 14 during a certain period is large (the potential of the node 14 at the time T4 is at a low value). At this time, the resistance of a channel of the transistor 104 increases, so that the speed at which the potential of the sixth signal line 16 changes becomes low. Consequently, the amount of change in the potential of the sixth signal line 16 during a certain period is small (the potential of the sixth signal line 16 at the time T7 is at a high value).

At the time T8, the second irradiation in which the object is irradiated with light from the light source starts. The pulse 201 goes from low (non-irradiation) to high (irradiation). The time T8 is a second irradiation start time.

At the time T9, second irradiation light emitted from the light source is reflected off the object, and second reflected light starts to enter the semiconductor device. The pulse 202 goes from low (non-irradiation) to high (irradiation). The time T9 is a second reflection start time.

At the time T10, the first signal line 11 is brought high, and the second signal line 12 is brought high (a second reset). At this time, electrical continuity between the photodiode 102 and the transistor 103 is established and the node 14 goes high.

At the time T11, the second irradiation in which the object is irradiated with light from the light source terminates. The pulse 201 goes from high (irradiation) to low (non-irradiation). The time T11 is a second irradiation end time. The first signal line 11 is brought low, and the second signal line 12 is held high. Note that the second imaging start time coincides with the second irradiation end time. The time T11 is also a second reflected light detection start time.

From the time T11 to the time T12 (during the second reflected light detection, i.e. the second net imaging), the potential of the node 14 changes according to the second reflected light. The potential of the node 14 starts to decrease from high owing to the off-state current of the photodiode 102. The off-state current is proportional to irradiation time and the intensity of light entering the photodiode 102 (reflected light). Therefore, the potential of the node 14 changes according to the intensity of the reflected light and the length of the reflected light detection period.

Note that this embodiment shows, as an example, the case where the second reflected light detection period (from the time T11 to the time T12) is shorter than the first reflected light detection period (from the time T3 to the time T4). Therefore, the amount of change in the potential of the node 14 during the second imaging is smaller than that of change in the potential of the node 14 during the first imaging.

At the time T12, entrance of the second reflected light reflected off the object to the semiconductor device terminates. The pulse 202 goes from high (irradiation) to low (non-irradiation). The time T12 is a second reflection end time. The time T12 is also a second reflected light detection end time.

The potential of the node 14 becomes constant after the time T12. The potential of the node 14 at the time T12 (V2) is dependent on photocurrent generated by the photodiode 102 during the second reflected light detection. This means that the potential of the node 14 is determined by light intensity and the like.

The first detection signal is determined by the potential of the node 14 at the time T12 (V2). As the length of the second reflected light detection period increases, the amount of change in the potential of the node 14 decreases, so that the potential of the node 14 at the time T12 (V2) is high.

At the time T13, the second signal line 12 is brought low.

In this manner, the potentials of the first signal line 11 and the second signal line 12 are controlled such that the second imaging starts when the second irradiation terminates and the second imaging terminates when the detection of the second reflected light terminates.

Note that all of the light entering the photodiode 102 from the time T10 to the time T13 corresponds to the second reflected light, i.e., light reflected off an object irradiated with light from the light source.

At the time T14, the third signal line 13 is brought high (a second read starts). At this time, the transistor 105 conducts. Moreover, electrical continuity between the fifth signal line 15 and the sixth signal line 16 is established through the transistor 104 and the transistor 105. Then, the potential of the sixth signal line 16 starts to decrease. Note that the sixth signal line 16 is precharged high before the time T6.

At the time T15, the third signal line 13 is brought low (the second read terminates). Then, the transistor 105 is turned off, and the potential of the sixth signal line 16 becomes constant. The potential of the sixth signal line 16 at the time T15 ($V_{S2}$) is dependent on the speed at which the potential of the sixth signal line 16 changes during a period from the time T14 to the time T15.

If the light intensity is fixed, as the length of the reflected light detection period decreases, the speed at which the potential of the sixth signal line 16 changes increases. As the speed at which the potential of the sixth signal line 16 increases, the potential of the sixth signal line 16 at the time T15 ($V_{S2}$) decreases.

For this reason, by obtaining the potential of the sixth signal line 16 at the time T15 ($V_{S2}$) by the second reflected light detection, the amount of light entering the photodiode 102 (reflected light) during the second imaging period (the product of time and the intensity of such light) can be detected; thus, a detection signal S2 is produced. Assuming that the light intensity during the second irradiation is fixed and only the second reflected light enters the photodiode, the potential of the sixth signal line 16 ($V_{S2}$) is substantially proportional to the length of the second reflected light detection period.

Note that in this embodiment, the second reflected light detection period (from the time T11 to the time T12) is shorter than the first reflected light detection period (from the time T3 to the time T4), so that the potential of the sixth signal line 16 at the time T15 ($V_{S2}$) is lower than the potential of the sixth signal line 16 at the time T7 ($V_{S1}$).

FIG. 3 shows the pulse 201, the pulse 202, and the pulse 12 for the photosensor 100. A description is first given of the features of the driving method with reference to FIG. 3. The main feature of the driving method according to one embodiment of the present invention is to optimize the timing of the net imaging period by controlling the potentials of the first signal line 11 and the second signal line 12, for the first reflected light detection and the second reflected light detection.

A description is given with comparison among the pulses in FIG. 3, dividing the time into the following periods: irradiation periods, reflection periods, imaging periods, storage periods, and reflected light detection periods.

As the pulse 201 shows, the time T2 is the first irradiation start time, the time T4 is the first irradiation end time, and a period from the time T2 to the time T4 is the first irradiation period. The time T8 is the second irradiation start time, the time T11 is the second irradiation end time, and a period from the time T8 to the time T11 is the second irradiation period. In one embodiment of the present invention, the first irradiation period and the second irradiation period need to be of the same length of time.

As the pulse 202 shows, the time T3 is the first reflection start time, the time T5 is the first reflection end time, and a period from the time T3 to the time T5 is the first reflection period. The time T9 is the second reflection start time, the time T12 is the second reflection end time, and a period from the time T9 to the time T12 is the second reflection period. The reflection period and the irradiation period are of the same length of time.

In other words, the first irradiation period and the second irradiation period are of the same length of time, and the first reflection period and the second reflection period are of the same length of time.

As the pulse 12 shows, the time T1 is the first storage start time, the time T4 is the first storage end time, and a period from the time T1 to the time T4 is the first storage period. The time T3 is the first imaging start time, the time T4 is the first imaging end time, and a period from the time T3 to the time T4 is the first imaging period. Further, the time T3 is the first reflected light detection start time, the time T4 is the first reflected light detection end time, and a period from the time T3 to the time T4 is the first reflected light detection period.

The first storage period should be started at least before the initiation of the first reflection period. Moreover, the first imaging should be terminated when the first irradiation period terminates. The potentials of the first signal line 11 and the second signal line 12 are controlled such that the timing of the imaging period is determined as described above.

As the pulse 12 shows, the time T10 is the second storage start time, the time T13 is the second storage end time, and a period from the time T10 to the time T13 is the second storage period. The time T11 is the second imaging start time, the time T12 is the second imaging end time, and a period from the time T11 to the time T12 is the second imaging period. Further, the time T11 is the second reflected light detection start time, the time T12 is the second reflected light detection end time, and a period from the time T11 to the time T12 is the second reflected light detection period.

The second imaging should be started when the second irradiation period terminates. Moreover, the second storage period should be terminated at least after the end of the second reflection period. The potentials of the first signal line 11 and the second signal line 12 are controlled such that the timing of the imaging period is determined as described above.

In other words, the timing of the first imaging period is determined with respect to the timing of the first reflection period and the timing of the second imaging period is determined with respect to the timing of the second reflection period; thus, the reflected light detection is divided into two periods.

Note that the first reflected light detection period corresponds to a period which starts after the initiation of the first irradiation period and in which the first irradiation period overlaps with the first reflection period. The first reflected light detection period is the first net imaging period. The second reflected light detection period corresponds to a period in the second reflection period which starts after the second irradiation period. The second reflected light detection period is the second net imaging period. The first detection signal dependent on the time difference between the arrival times of light is obtained through the first reflected light detection. The second detection signal dependent on the time difference between the arrival times of light is obtained through the second reflected light detection. Thus, the distance from the semiconductor device to the object can be measured.

Next, a distance measuring method achieved by three-dimensional imaging using the TOF method is described. A description is given with reference to equations of a method for measuring the distance from the semiconductor device to the object by using the first detection signal S1 that is obtained through the first reflected light detection and is dependent on the time difference between the arrival times of light, and the second detection signal S2 that is obtained through the second reflected light detection and is dependent on the time difference between the arrival times of light.

Here, assuming that the light intensity during the first irradiation and the second irradiation is constant and the photodiode 102 is irradiated with only the first reflected light during the first imaging period and the second reflected light during the second imaging period, the potential of the sixth signal line 16 ($V_{S1}$) is substantially proportional to the length of the first reflected light detection period and the potential of the sixth signal line 16 ($V_{S2}$) is substantially proportional to the length of the second reflected light detection period.

In other words, the first detection signal S1 obtained through the first imaging is dependent on the first reflected light detection period, and the second detection signal S2 obtained through the second imaging is dependent on the second reflected light detection period.

The first detection signal S1 and the second detection signal S2 can respectively be expressed by Equations 6 and 7 where α is a proportionality constant, T is an irradiation period, and Δt is a time difference.

$$S1 = \alpha \times (T - \Delta t) \qquad \text{[Equation 6]}$$

$$S2 = \alpha \times (\Delta t) \qquad \text{[Equation 7]}$$

Erasure of the proportionality constant α using Equations 6 and 7 gives the time difference Δt.

$$\Delta t = \frac{(T \times S2)}{(S1 + S2)} \quad \text{[Equation 8]}$$

The distance x from the semiconductor device to the object can be obtained using Equation 9 derived from Equations 1 and 8.

$$x = \frac{(c \times T \times S2)}{2 \times (S1 + S2)} \quad \text{[Equation 9]}$$

This shows that the distance x from the semiconductor device to the object can be obtained by obtaining the first detection signal S1 and the second detection signal S2.

A third imaging may be performed with the photosensor 100 during a period in which the light source does not emit light. In this case, a third detection signal S3 is obtained through the third imaging. A value obtained by subtracting the third detection signal S3 from the first detection signal S1, and a value obtained by subtracting the third detection signal S3 from the second detection signal S2 are applied to the detection signal S1 and the detection signal S2 in Equation 9, respectively; thus, the influence of natural light can be eliminated.

The above description shows that the photosensor can be composed of fewer elements, and a semiconductor device including the photosensor, which operates with an improved driving method, can achieve three-dimensional imaging using the TOF method and serve as a distance measuring device. Therefore, a problem of an increased number of elements for the photosensor which occurs with the TOF method can be solved and a semiconductor device advantageous in reducing pixel size can be achieved.

This embodiment can be implemented in combination with any of the other embodiments in this specification as appropriate.

Embodiment 2

This embodiment describes in detail the configuration of the photosensor 100 shown in Embodiment 1. A description is given with reference to FIG. 6A of an example of the configuration of a semiconductor device including photosensors 100 arranged in a matrix with m rows and n columns. An example of the configuration different from that illustrated in FIG. 6A is described with reference to FIG. 6B.

Figure 6A:
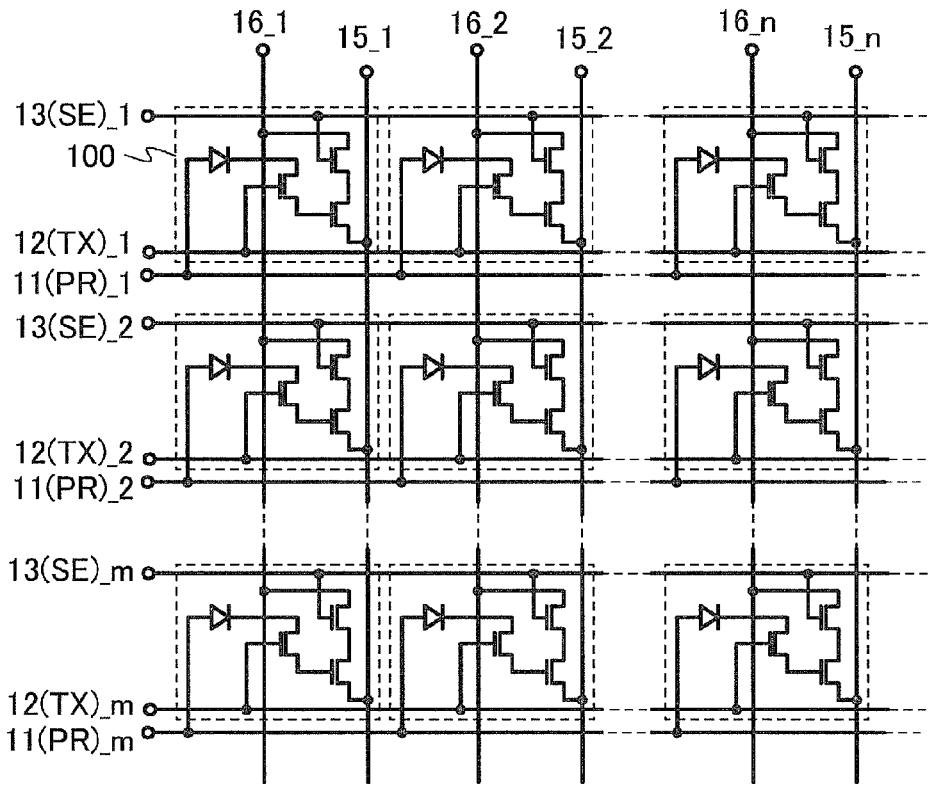
FIGS. 6A and 6B are circuit diagrams of a plurality of photosensors arranged in a matrix.

In FIG. 6A, a plurality of photosensors 100 is arranged in a matrix of m rows (m is a natural number of 2 or more) and n columns (n is a natural number of 2 or more). The photosensors 100 in each row are electrically connected to a corresponding one of a plurality of first signal lines 11(PR) denoted by 11(PR)_1 to 11(PR)_m, a corresponding one of a plurality of second signal lines 12(TX) denoted by 12(TX)_1 to 12(TX)_m, and a corresponding one of a plurality of third signal lines 13(SE) denoted by 13(SE)_1 to 13(SE)_m. The photosensors 100 in each column are electrically connected to a corresponding one of a plurality of photosensor output signal lines denoted by 16_1 to 16_n, and a corresponding one of a plurality of photosensor reference signal lines denoted by 15_1 to 15_n.

In FIG. 6A, the photosensors in each row share a second signal line 12(TX), a first signal line 11(PR), and a third signal line 13(SE). The photosensors in each column share a photosensor output signal line and a photosensor reference signal line. However, the present invention is not limited to this. A plurality of second signal lines 12(TX) may be provided in each row and electrically connected to different photosensors 100. A plurality of first signal lines 11(PR) may be provided in each row and electrically connected to different photosensors 100. A plurality of third signal lines 13(SE) may be provided in each row and electrically connected to different photosensors 100. A plurality of photosensor output signal lines may be provided in each column and electrically connected to different photosensors 100. A plurality of photosensor reference signal lines may be provided in each column and electrically connected to different photosensors 100.

In FIG. 6A, the photosensors in each column share a photosensor reference signal line; however, the present invention is not limited to this. A photosensor reference signal line may be shared by the photosensors in each row.

A second signal line 12(TX) can be shared by the photosensors 100 that concurrently perform the reset operation and the accumulation operation among the photosensors 100 arranged in a matrix with m rows and n columns. A first signal line 11(PR) can be shared by the photosensors that concurrently perform the reset operation and the accumulation operation among the photosensors 100 arranged in a matrix with m rows and n columns.

As described above, wirings are shared between photosensors to reduce the number of wirings, so that a driver circuit for driving the photosensors 100 arranged in a matrix with m rows and n columns can be simplified.

Figure 6B:
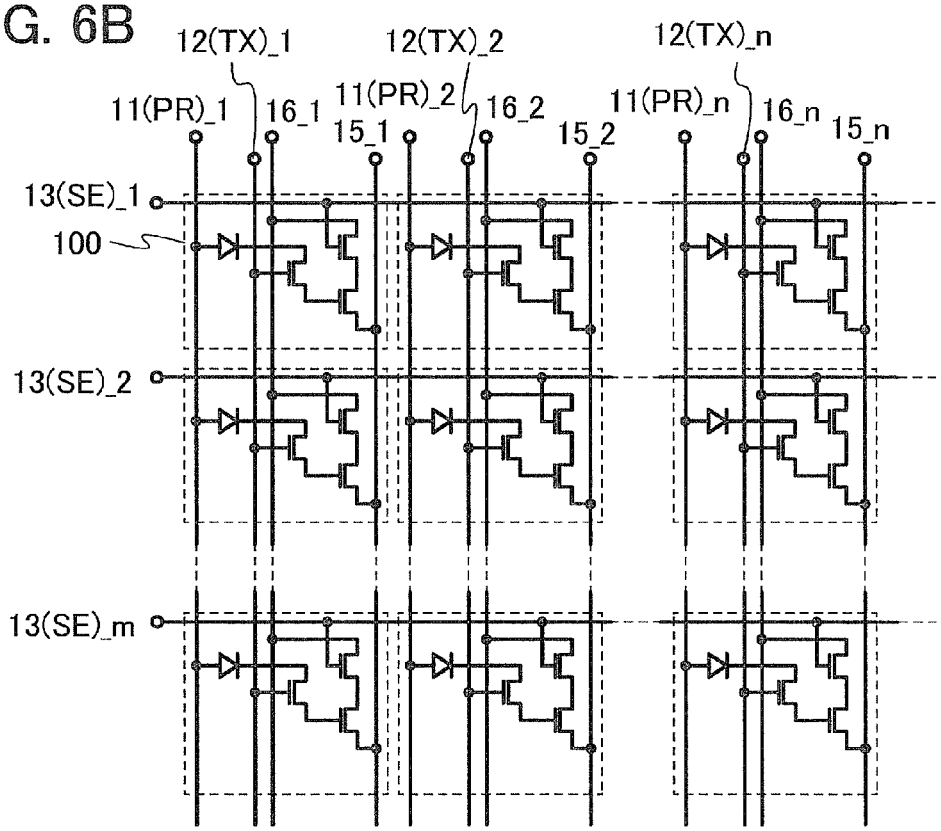

Next, a description is given with reference to FIG. 6B of an example of the configuration of a semiconductor device including photosensors 100 arranged in a matrix with m rows and n columns, which is different from that in FIG. 6A.

In FIG. 6B, a plurality of photosensors 100 is arranged in a matrix of m rows and n columns. The photosensors 100 in each row are electrically connected to a corresponding one of a plurality of third signal lines 13(SE) denoted by 13(SE)_1 to 13(SE)_m. The photosensors 100 in each column are electrically connected to a corresponding one of a plurality of first signal lines 11(PR) denoted by 11(PR)_1 to 11(PR)_n, a corresponding one of a plurality of second signal lines 12(TX) denoted by 12(TX)_1 to 12(TX)_n, a corresponding one of a plurality of photosensor output signal lines denoted by 16_1 to 16_n, and a corresponding one of a plurality of photosensor reference signal lines denoted by 15_1 to 15_n.

In FIG. 6B, the photosensors in each row share a third signal line 13(SE), and the photosensors in each column share a first signal line 11(PR), a second signal line 12(TX), a photosensor output signal line, and a photosensor reference signal line. However, the present invention is not limited to this.

In FIG. 6B, the photosensors in each column share a photosensor reference signal line; however, the present invention is not limited to this. A photosensor reference signal line may be shared by the photosensors in each row.

A second signal line 12(TX) can be shared by the photosensors that concurrently perform the reset operation and the accumulation operation among the photosensors 100 arranged in a matrix with m rows and n columns. A first signal line 11(PR) can be shared by the photosensors that concurrently perform the reset operation and the accumulation operation among the photosensors 100 arranged in a matrix with m rows and n columns.

As described above, wirings are shared between photosensors to reduce the number of wirings, so that a driver circuit for driving the photosensors 100 arranged in a matrix with m rows and n columns can be simplified.

FIG. 7A is a top view of the photosensor 100. FIG. 7B is a cross-sectional view taken along line A1-A2 shown in FIG. 7A.

The photosensor 100 includes a conductive film 210 serving as a first signal line 11(PR), a conductive film 211 serving as a second signal line 12(TX), a conductive film 212 serving as a third signal line 13(SE), a conductive film 213 serving as a fifth signal line 15 (photosensor reference signal line), and a conductive film 214 serving as a sixth signal line 16 (photosensor output signal line).

The photodiode 102 included in the photosensor 100 includes a p-type semiconductor film 215, an i-type semiconductor film 216, and an n-type semiconductor film 217 which are sequentially stacked. The conductive film 210 is electrically connected to the p-type semiconductor film 215 serving as the anode of the photodiode 102.

A conductive film 218 included in the photosensor 100 serves as the gate electrode of the transistor 103 and is electrically connected to the conductive film 211. A conductive film 219 included in the photosensor 100 serves as one of a source electrode and a drain electrode of the transistor 103. A conductive film 220 included in the photosensor 100 serves as the other of the source electrode and the drain electrode of the transistor 103. A conductive film 221 included in the photosensor 100 is electrically connected to the n-type semiconductor film 217 and the conductive film 219. A conductive film 222 included in the photosensor 100 serves as the gate electrode of the transistor 104 and is electrically connected to the conductive film 220.

A conductive film 223 included in the photosensor 100 serves as one of a source electrode and a drain electrode of the transistor 104. A conductive film 224 included in the photosensor 100 serves as the other of the source electrode and the drain electrode of the transistor 104 and one of a source electrode and a drain electrode of the transistor 105. The conductive film 214 serves as the other of the source electrode and the drain electrode of the transistor 105. The conductive film 212 also serves as the gate electrode of the transistor 105. A conductive film 225 included in the photosensor 100 is electrically connected to the conductive film 223 and the conductive film 213.

Note that in FIGS. 7A and 7B, a conductive film 226 included in the photosensor 100 is electrically connected to the conductive film 210 serving as the first signal line 11(PR). A conductive film 227 included in the photosensor 100 is electrically connected to the conductive film 211 serving as the second signal line 12(TX).

The conductive film 212, the conductive film 218, the conductive film 222, the conductive film 225, the conductive film 226, and the conductive film 227 can be formed by processing one conductive film formed over an insulating surface into a desired shape. A gate insulating film 228 is formed over the conductive film 212, the conductive film 218, the conductive film 222, the conductive film 225, the conductive film 226, and the conductive film 227. The conductive film 210, the conductive film 211, the conductive film 213, the conductive film 214, the conductive film 219, the conductive film 220, the conductive film 223, and the conductive film 224 can be formed by processing one conductive film formed over the gate insulating film 228 into a desired shape.

An insulating film 281 and an insulating film 282 are formed over the conductive film 210, the conductive film 211, the conductive film 213, the conductive film 214, the conductive film 219, the conductive film 220, the conductive film 223, and the conductive film 224. The conductive film 221 is formed over the insulating film 281 and the insulating film 282.

An active layer 250 in the transistor 103 is preferably formed of an oxide semiconductor. In order to hold charge, which is generated when light is emitted from the substrate 251 side, for a long period of time, the transistor 103 electrically connected to the photodiode 102 needs to be a transistor with extremely low off-state current. Therefore, when the active layer 250 is formed of an oxide semiconductor material, performance of the photosensor 100 can be increased.

Note that in the case where the transistor 103 is a bottom-gate transistor, it is preferable to employ a structure in which the active layer 250 is provided over the conductive film 218 serving as the gate electrode as illustrated in FIG. 7B. The use of this structure can prevent the oxide semiconductor in the active layer 250 from deteriorating due to light entering from the substrate 251 side and thus can prevent deterioration of characteristics such as a shift of the threshold voltage of the transistor 103. Note that also in the case of the transistor 104 and the transistor 105, the use of this structure produces similar effects.

Here, in the structure where the second signal line 12(TX) is extended in the row direction as illustrated in FIG. 6A, the third signal line 13(SE) that is also extended in the row direction and parallel to the second signal line 12(TX) exists. When part of the third signal line 13(SE), which is electrically connected to the gate electrode of the transistor 105, is used as the gate electrode of the transistor 105, the second signal line 12(TX) parallel to the third signal line 13(SE) is generally formed in the same layer and of the same material as the gate electrode of the transistor 105. In general, however, a material for a gate electrode of a transistor has higher resistance than that for a source electrode or a drain electrode thereof. Therefore, the second signal line 12(TX) tends to have high resistance.

In the structure in FIG. 6B, in contrast, the second signal line 12(TX) is extended in the column direction. Thus, the second signal line 12(TX) can be formed using a conductive film that is formed in a layer different from that where the third signal line 13(SE) extended in the row direction is formed. For example, as illustrated in FIGS. 7A and 7B, the second signal line 12(TX) can be formed using the conductive film 211 that is formed in a layer different from that where the conductive films (the conductive films 212, 218, and 222) forming the gate electrodes of the transistors (the transistors 103, 104, and 105) included in the photosensor 100. The conductive film 211 can be formed in the same layer as the source and drain electrodes of the transistors (the transistors 103, 104, and 105) in the photosensor 100, that is, the conductive films 214, 219, 220, and 224, and formed of the same material as the source and drain electrodes. Therefore, the resistance of the second signal line 12(TX) in this structure is lower than that in the structure illustrated in FIG. 6A.

This embodiment can be implemented in combination with any of the other embodiments in this specification as appropriate.

Embodiment 3

This embodiment will explain a method for forming a photosensor including a transistor whose channel is formed in a semiconductor film of single crystal silicon or the like and a transistor whose channel is formed in an oxide semiconductor layer.

Figure 8A:
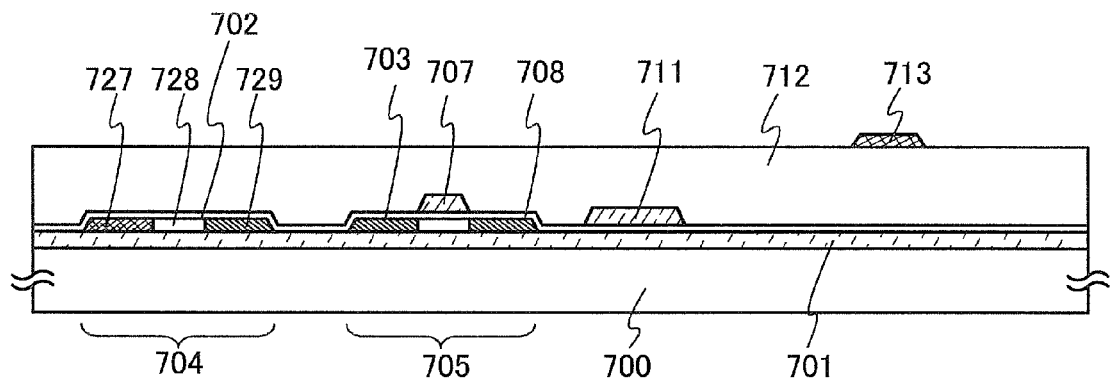
FIGS. 8A to 8C are cross-sectional views illustrating a method for manufacturing the photosensor.

As illustrated in FIG. 8A, a photodiode 704 and an n-channel transistor 705 are formed over an insulating surface of a substrate 700 by a known CMOS fabrication method. In this embodiment, the case where the photodiode 704 and the n-channel transistor 705 are formed with a single crystal semiconductor film that is separated from a single crystal semiconductor substrate is given as an example. As the single crystal semiconductor substrate, a silicon substrate can be used, for example.

A specific example of a method for forming the single crystal semiconductor film will be briefly described. First, an ion beam including ions that are accelerated by an electric field enters the single crystal semiconductor substrate, and a fragile layer which is weakened by local disorder of the crystal structure is formed in a region at a certain depth from the surface of the semiconductor substrate. The depth at which the fragile layer is formed can be adjusted by the acceleration energy of the ion beam and the angle at which the ion beam enters. Then, the semiconductor substrate and the substrate 700 over which an insulating film 701 is formed are attached to each other so that the insulating film 701 is sandwiched therebetween. After the semiconductor substrate and the substrate 700 over which the insulating film 701 is formed overlap with each other, a pressure of about 1 N/cm$^2$ to 500 N/cm$^2$, preferably about 11 N/cm$^2$ to 20 N/cm$^2$ is applied to part of the semiconductor substrate and the substrate 700 over which the insulating film 701 is formed, to attach the substrates. When the pressure is applied, bonding between the semiconductor substrate and the insulating film 701 starts from the portion to which the pressure is applied, which results in bonding of the entire surface where the semiconductor substrate and the insulating film 701 are in close contact with each other. Next, heat treatment is performed, whereby very small voids that exist in the fragile layer are combined, so that the very small voids increase in volume. As a result, the single crystal semiconductor film which is part of the semiconductor substrate is separated from the semiconductor substrate along the fragile layer. The heat treatment is performed at a temperature not exceeding the strain point of the substrate 700. Then, the single crystal semiconductor film is processed into a desired shape by etching or the like, so that an island-shaped semiconductor film 702 and an island-shaped semiconductor film 703 can be formed.

The photodiode 704 is formed using the island-shaped semiconductor film 702 over the insulating film 701. The n-channel transistor 705 is formed using the island-shaped semiconductor film 703 over the insulating film 701. The photodiode 704 is a lateral junction type photodiode in which a region 727 having p-type conductivity, a region 728 having i-type conductivity, and a region 729 having n-type conductivity are formed in the island-shaped semiconductor film 702. The n-channel transistor 705 includes a gate electrode 707. The n-channel transistor 705 also includes a pair of regions in the island-shaped semiconductor film 703, which has n-type conductivity and is placed so that a region overlapping with the gate electrode 707 is sandwiched therebetween. In addition, the n-channel transistor 705 includes an insulating film 708 between the island-shaped semiconductor film 703 and the gate electrode 707. In the n-channel transistor 705, the insulating film 708 functions as a gate insulating film.

Note that the region 728 having i-type conductivity refers to a region of the semiconductor film which contains an impurity imparting p-type or n-type conductivity at a concentration of $1 \times 10^{20}$ cm$^{-3}$ or less and has photoconductivity 100 or more times as high as dark conductivity. The region 728 having i-type conductivity includes, in its category, a region that contains an impurity element belonging to Group 13 or Group 15 of the periodic table. The region 728 having i-type conductivity has weak n-type electric conductivity when an impurity element for controlling valence electrons is not added intentionally. Therefore, the region 728 having i-type conductivity includes, in its category, a region to which an impurity element imparting p-type conductivity is added intentionally or unintentionally at the same time as film formation or after the film formation.

There is no particular limitation on a material used for the substrate 700; a light-transmitting material is used for the substrate 700 in the case of using a transmissive or transflective liquid crystal element. Moreover, the material used for the substrate 700 needs to have heat resistance at least high enough to withstand heat treatment performed later. For example, a glass substrate manufactured by a fusion method or a float method, a quartz substrate, or a ceramic substrate can be used as the substrate 700. As the glass substrate, in the case where the temperature of heat treatment to be performed later is high, a glass substrate having a strain point of 730° C. or higher is preferably used. Although a substrate formed of a flexible synthetic resin such as plastic generally has a lower resistance temperature than the aforementioned substrates, the substrate can be used as long as it can be resistant to a processing temperature during formation steps.

Note that although the case where the photodiode 704 and the n-channel transistor 705 are formed using the single crystal semiconductor film is described as an example in this embodiment, the present invention is not limited to this structure. For example, a polycrystalline semiconductor film or a microcrystalline semiconductor film that is formed over the insulating film 701 by vapor deposition may be used. Alternatively, the above semiconductor film may be crystallized with a known technique. Examples of the known technique of crystallization of a semiconductor film are a laser crystallization method using a laser beam and a crystallization method using a catalytic element. Alternatively, it is possible to use a combination of a crystallization method using a catalytic element and a laser crystallization method. In the case where a heat-resistant substrate such as a quartz substrate is used, it is possible to combine any of the following crystallization methods: a thermal crystallization method using an electrically heated oven, a lamp annealing crystallization method using infrared light, a crystallization method using a catalytic element, and a high-temperature annealing method at approximately 950° C.

As illustrated in FIG. 8A, after a conductive film is formed over the insulating film 708, the conductive film is processed into a desired shape by etching or the like, whereby a wiring 711 is formed together with the gate electrode 707.

Next, as illustrated in FIG. 8A, an insulating film 712 is formed so as to cover the photodiode 704, the n-channel transistor 705, the wiring 711, and the gate electrode 707. Note that although the case where a single-layer insulating film is used as the insulating film 712 is described as an example in this embodiment, the insulating film 712 is not necessarily a single-layer film and may be a stack including two or more insulating films.

The insulating film 712 is formed using a material that can withstand a temperature of heat treatment in a later formation step. Specifically, it is preferable to use a material such as silicon oxide, silicon nitride, silicon nitride oxide, silicon oxynitride, aluminum nitride, or aluminum oxide for the insulating film 712.

Note that in this specification, oxynitride refers to a material containing a higher quantity of oxygen than that of nitrogen, and nitride oxide refers to a material containing a higher quantity of nitrogen than that of oxygen.

A surface of the insulating film 712 may be planarized by CMP or the like.

Next, as illustrated in FIG. 8A, a gate electrode 713 is formed over the insulating film 712.

The gate electrode 713 can be formed with a single-layer structure or a stacked structure using a metal material such as molybdenum, titanium, chromium, tantalum, tungsten, neodymium, or scandium, an alloy material that contains any of these metals as a main component, or nitride of any of these metals. Note that aluminum or copper can also be used as the metal material if it can withstand the temperature of heat treatment performed in a later step. Aluminum and copper are preferably used in combination with a refractory metal material in order to avoid problems of heat resistance and corrosion. Examples of the refractory metal material include molybdenum, titanium, chromium, tantalum, tungsten, neodymium, scandium, and the like.

For example, as a two-layer structure of the gate electrode 713, the following structures are preferable: a two-layer structure in which a molybdenum film is stacked over an aluminum film; a two-layer structure in which a molybdenum film is stacked over a copper film; a two-layer structure in which a titanium nitride film or a tantalum nitride film is stacked over a copper film; and a two-layer structure in which a titanium nitride film and a molybdenum film are stacked. As a three-layer structure of the gate electrode 713, the following structure is preferable: a stacked structure in which an aluminum film, an alloy film of aluminum and silicon, an alloy film of aluminum and titanium, or an alloy film of aluminum and neodymium is used as a middle layer and any of a tungsten film, a tungsten nitride film, a titanium nitride film, and a titanium film is used as a top layer and a bottom layer.

Further, a light-transmitting oxide conductive film of indium oxide, indium tin oxide, indium zinc oxide, zinc oxide, zinc aluminum oxide, zinc aluminum oxynitride, zinc gallium oxide, or the like can be used as the gate electrode 713.

The thickness of the gate electrode 713 is in the range of 10 nm to 400 nm, preferably 100 nm to 200 nm. In this embodiment, a 150-nm-thick conductive film for the gate electrode is formed by sputtering using a tungsten target, and then the conductive film is processed (patterned) into a desired shape by etching, whereby the gate electrode 713 is formed. The gate electrode 713 preferably has tapered end portions because coverage of the gate electrode with a gate insulating film stacked thereover is improved. Note that a resist mask may be formed by an inkjet method. Formation of the resist mask by an inkjet method needs no photomask; thus, manufacturing cost can be reduced.

Figure 8B:
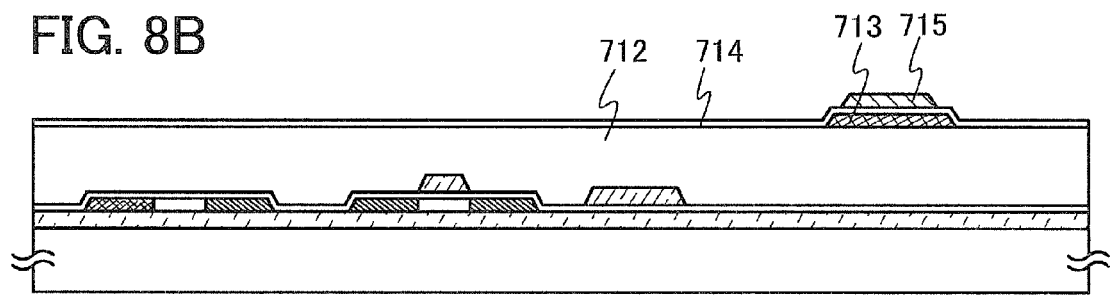

Next, as illustrated in FIG. 8B, a gate insulating film 714 is formed over the gate electrode 713, and after that, an oxide semiconductor layer 715 is formed over the gate insulating film 714 in a position overlapping with the gate electrode 713.

The gate insulating film 714 can be formed with a single-layer structure or a stacked structure using one or more selected from a silicon oxide film, a silicon nitride film, a silicon oxynitride film, a silicon nitride oxide film, an aluminum oxide film, an aluminum nitride film, an aluminum oxynitride film, an aluminum nitride oxide film, a hafnium oxide film, and a tantalum oxide film formed by plasma CVD, sputtering, or the like. It is preferable that the gate insulating film 714 contains as little impurities such as moisture, hydrogen, or oxygen as possible. In the case of forming a silicon oxide film by sputtering, a silicon target or a quartz target is used as a target, and oxygen or a mixed gas of oxygen and argon is used as a sputtering gas.

An oxide semiconductor layer that is made to be an i-type or substantially i-type oxide semiconductor layer (an oxide semiconductor layer that is highly purified) by removal of impurities is extremely sensitive to an interface state and interface electric charge. Therefore, the interface between the oxide semiconductor layer 715 that is highly purified and the gate insulating film 714 is important. Consequently, the gate insulating film 714 that is in contact with the oxide semiconductor layer 715 needs to have high quality.

For example, high-density plasma-enhanced CVD using microwaves (e.g., a frequency of 2.45 GHz) is preferable because a dense high-quality insulating film having high withstand voltage can be formed. When a highly purified oxide semiconductor layer and the high-quality gate insulating film are in close contact with each other, the interface state density can be reduced and favorable interface characteristics can be obtained.

Needless to say, a different film formation method such as sputtering or plasma CVD can be used as long as a high-quality insulating film can be formed as the gate insulating film 714. Alternatively, it is possible to form an insulating film whose film quality and characteristics of the interface with the oxide semiconductor layer 715 are improved by heat treatment performed after deposition. In any case, any insulating film can be used as long as it has a reduced interface state density with the oxide semiconductor layer and can form a favorable interface as well as having a favorable film quality as the gate insulating film.

The gate insulating film 714 may have a structure in which an insulating film formed using a material with high barrier properties and an insulating film with a low nitrogen content, such as a silicon oxide film or a silicon oxynitride film, are stacked. In this case, the insulating film such as a silicon oxide film or a silicon oxynitride film is formed between the insulating film with high barrier properties and the oxide semiconductor layer. Examples of the insulating film with high barrier properties are a silicon nitride film, a silicon nitride oxide film, an aluminum nitride film, and an aluminum nitride oxide film. The formation of the insulating film using a material with high barrier properties can prevent impurities in an atmosphere, such as moisture or hydrogen, or impurities in the substrate, such as an alkali metal or a heavy metal, from entering the oxide semiconductor layer, the gate insulating film 714, or the interface between the oxide semiconductor layer and another insulating film and the vicinity thereof. In addition, the insulating film with a low nitrogen content, such as a silicon oxide film or a silicon oxynitride film, is formed so as to be in contact with the oxide semiconductor layer, so that the insulating film with high barrier properties can be prevented from being in direct contact with the oxide semiconductor layer.

For example, a gate insulating film 714 with a thickness of 100 nm may be formed in the following manner: a silicon nitride film ($SiN_y$ (y>0)) with a thickness of 50 nm to 200 nm is formed by sputtering as a first gate insulating film, and a silicon oxide film ($SiO_x$ (x>0)) with a thickness of 5 nm to 300 nm is stacked over the first gate insulating film as a second gate insulating film. The thickness of the gate insulating film 714 is set as appropriate depending on characteristics needed for the transistor and may be approximately 350 nm to 400 nm.

In this embodiment, the gate insulating film 714 in which a 100-nm-thick silicon oxide film formed by sputtering is stacked over a 50-nm-thick silicon nitride film formed by sputtering is formed.

Note that the gate insulating film 714 is in contact with the oxide semiconductor layer formed later. Hydrogen contained in the oxide semiconductor adversely affects characteristics of the transistor; therefore, it is preferable that the gate insulating film 714 do not contain hydrogen, a hydroxyl group, and moisture. In order that the gate insulating film 714 contains as little hydrogen, a hydroxyl group, and moisture as possible, it is preferable that impurities adsorbed on the substrate 700, such as moisture or hydrogen, be eliminated and removed by preheating the substrate 700, over which the gate electrode 713 is formed, in a preheating chamber of a sputtering apparatus, as a pretreatment for film formation. The temperature for the preheating is 100° C. to 400° C., preferably 150° C. to 300° C. As an exhaustion unit provided in the preheating chamber, a cryopump is preferable. Note that this preheating treatment can be skipped.

The oxide semiconductor layer 715 can be formed by processing an oxide semiconductor film formed over the gate insulating film 714 into a desired shape. The thickness of the oxide semiconductor film is 2 nm to 200 nm, preferably 3 nm to 50 nm, further preferably 3 nm to 20 nm. The oxide semiconductor film is formed by sputtering using an oxide semiconductor target. Moreover, the oxide semiconductor film can be formed by sputtering in a rare gas (e.g., argon) atmosphere, an oxygen atmosphere, or a mixed atmosphere of a rare gas (e.g., argon) and oxygen.

Note that before the oxide semiconductor film is formed by sputtering, dust attached to a surface of the gate insulating film 714 is preferably removed by reverse sputtering in which an argon gas is introduced and plasma is generated. The reverse sputtering refers to a method in which, without application of voltage to a target side, an RF power source is used for application of voltage to a substrate side in an argon atmosphere to generate plasma in the vicinity of the substrate to modify a surface. Note that the reverse sputtering may be performed in a nitrogen atmosphere, a helium atmosphere, or the like instead of an argon atmosphere. Alternatively, the reverse sputtering may be performed in an argon atmosphere to which oxygen, nitrous oxide, or the like is added. Alternatively, the reverse sputtering may be performed in an argon atmosphere to which chlorine, carbon tetrafluoride, or the like is added.

The oxide semiconductor film preferably contains at least indium (In) or zinc (Zn). In particular, In and Zn are preferably contained. As a stabilizer for reducing a variation in electric characteristics of a transistor including the oxide semiconductor, gallium (Ga) is preferably additionally contained. Tin (Sn) is preferably contained as a stabilizer. Hafnium (Hf) is preferably contained as a stabilizer. Aluminum (Al) is preferably contained as a stabilizer.

As another stabilizer, one or more lanthanoids selected from lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) may be contained.

As the oxide semiconductor, for example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used.

Note that here, for example, an In—Ga—Zn-based oxide means an oxide containing In, Ga, and Zn as its main component, and there is no particular limitation on the ratio of In, Ga, and Zn. The In—Ga—Zn-based oxide may contain a metal element other than In, Ga, and Zn.

For example, it is possible to use an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the above compositions. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the above compositions may be used.

Without limitation to the above, an oxide semiconductor with an appropriate composition ratio can be used in accordance with desired semiconductor electric characteristics (e.g., mobility, threshold voltage, and variation). In order to obtain needed semiconductor electric characteristics, an oxide semiconductor preferably has appropriate carrier concentration, impurity concentration, defect density, atomic ratio of a metal element to oxygen, interatomic distance, density, or the like.

The oxide semiconductor may be single crystal or non-single-crystal. A non-single-crystal oxide semiconductor may be amorphous or polycrystalline. Further, the oxide semiconductor may have an amorphous structure including a portion having crystallinity or a non-amorphous structure.

In this embodiment, an In—Ga—Zn-based oxide semiconductor thin film with a thickness of 30 nm, which is obtained by sputtering using a target including indium (In), gallium (Ga), and zinc (Zn), is used as the oxide semiconductor film. As the target, a target having a composition in an atomic ratio of In:Ga:Zn=1:1:0.5, In:Ga:Zn=1:1:1, or In:Ga:Zn=1:1:2 can be used, for example. The filling rate of the target including In, Ga, and Zn is 90% or higher and 100% or lower, and preferably 95% or higher and lower than 100%. With the use of the target with high filling rate, a dense oxide semiconductor film is formed.

In this embodiment, the oxide semiconductor film is formed over the substrate 700 in such a manner that the substrate is held in the treatment chamber kept at reduced pressure, a sputtering gas from which hydrogen and moisture have been removed is introduced into the treatment chamber while residual moisture therein is removed, and the above target is used. The substrate temperature may be 100° C. to 600° C., preferably 200° C. to 400° C. in the film formation. By forming the oxide semiconductor film in a state where the substrate is heated, the concentration of impurities included in the formed oxide semiconductor film can be reduced. In addition, damage by sputtering can be reduced. In order to remove residual moisture in the treatment chamber, an entrapment vacuum pump is preferably used. For example, a cryopump, an ion pump, or a titanium sublimation pump is preferably used. The exhaustion unit may be a turbo pump provided with a cold trap. In a deposition chamber which is evacuated with the cryopump, for example, a hydrogen atom, a compound containing a hydrogen atom, such as water ($H_2O$) (preferably, a compound containing a carbon atom as well), and the like are removed, whereby the concentration of impurities contained in the oxide semiconductor film formed in the deposition chamber can be reduced.

As one example of the deposition conditions, the distance between the substrate and the target is 100 mm, the pressure is 0.6 Pa, the direct-current (DC) power is 0.5 kW, and the atmosphere is an oxygen atmosphere (the proportion of the oxygen flow rate is 100%). Note that a pulsed direct-current (DC) power source is preferable because dust generated in deposition can be reduced and the film thickness can be made uniform.

In order that the oxide semiconductor film contains as little hydrogen, a hydroxyl group, and moisture as possible, it is preferable that impurities adsorbed on the substrate 700, such as moisture or hydrogen, be eliminated and removed by preheating the substrate 700, over which films up to the gate insulating film 714 are formed, in a preheating chamber of a sputtering apparatus, as a pretreatment for film formation. The temperature for the preheating is 100° C. to 400° C., preferably, 150° C. to 300° C. As an evacuation means in the preheating chamber, a cryopump is preferably provided. Note that this preheating treatment can be skipped. This preheating may be similarly performed on the substrate 700 over which films up to conductive films 720 and 721 are formed, before an insulating film 722 is formed in a later step.

Note that etching for forming the oxide semiconductor layer 715 may be wet etching, dry etching, or both dry etching and wet etching. As an etching gas for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferably used. Moreover, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, parallel plate RIE (reactive ion etching) or ICP (inductively coupled plasma) etching can be used. In order to etch the films into desired shapes, the etching conditions (e.g., the amount of electric power applied to a coil-shaped electrode, the amount of electric power applied to an electrode on the substrate side, and the temperature of the electrode on the substrate side) are adjusted as appropriate.

As an etchant used for wet etching, a mixed solution of phosphoric acid, acetic acid, and nitric acid, organic acid such as citric acid or oxalic acid, or the like can be used. In this embodiment, ITO-07N (produced by Kanto Chemical Co., Inc.) is used.

A resist mask used for forming the oxide semiconductor layer 715 may be formed by an inkjet method. Formation of the resist mask by an inkjet method needs no photomask; thus, production costs can be reduced.

Note that it is preferable that reverse sputtering be performed before the formation of a conductive film in a subsequent step to remove a resist residue or the like left over surfaces of the oxide semiconductor layer 715 and the gate insulating film 714.

Note that the oxide semiconductor layer formed by sputtering or the like sometimes contains a large amount of moisture or hydrogen (including a hydroxyl group) as impurities. Moisture and hydrogen easily form a donor level and thus serve as impurities in the oxide semiconductor. In one embodiment of the present invention, in order to reduce impurities such as moisture or hydrogen in the oxide semiconductor layer (perform dehydration or dehydrogenation), the oxide semiconductor layer 715 is subjected to heat treatment in a reduced-pressure atmosphere, an inert gas atmosphere of nitrogen, a rare gas, or the like, an oxygen gas atmosphere, or an ultra-dry air atmosphere (with a moisture content of 20 ppm (−55° C. by conversion into a dew point) or less, preferably 1 ppm or less, further preferably 10 ppb or less, in the case where measurement is performed by a dew point meter of a cavity ring down laser spectroscopy (CRDS) method).

Heat treatment performed on the oxide semiconductor layer 715 can eliminate moisture or hydrogen in the oxide semiconductor layer 715. Specifically, heat treatment is performed at a temperature higher than or equal to 250° C. and lower than or equal to 750° C., preferably higher than or equal to 400° C. and lower than the strain point of the substrate. For example, heat treatment may be performed at 500° C. for approximately 3 minutes to 6 minutes. When an RTA method is used for the heat treatment, dehydration or dehydrogenation can be performed in a short time; therefore, treatment can be performed even at a temperature higher than the strain point of a glass substrate.

In this embodiment, an electrical furnace which is one of heat treatment apparatuses is used.

Note that a heat treatment apparatus is not limited to an electrical furnace, and may include a device for heating an object to be processed by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object by heat treatment, for example, nitrogen or a rare gas such as argon is used.

Note that it is preferable that in the heat treatment, moisture, hydrogen, or the like be not contained in nitrogen or a rare gas such as helium, neon, or argon. The purity of nitrogen or the rare gas such as helium, neon, or argon which is introduced into a heat treatment apparatus is preferably 6N (99.9999%) or higher, further preferably 7N (99.99999%) or higher (i.e., the impurity concentration is preferably 1 ppm or lower, further preferably 0.1 ppm or lower).

Through the above process, the concentration of hydrogen in the oxide semiconductor layer 715 can be reduced, and the oxide semiconductor layer 715 can be highly purified. Accordingly, the oxide semiconductor layer 715 can be stable. In addition, heat treatment at a temperature that is lower than or equal to the glass transition temperature makes it possible to form the oxide semiconductor layer 715 with extremely low carrier density and a wide band gap. Thus, the transistor can be formed using a large-sized substrate, so that the productivity can be increased. Further, by using the highly purified oxide semiconductor layer 715 in which the hydrogen concentration is reduced, a transistor with high withstand voltage and extremely low off-state current can be formed. The above heat treatment can be performed at any time as long as it is performed after the oxide semiconductor film is formed.

Note that in the case where the oxide semiconductor film is heated, depending on a material or heating conditions of the oxide semiconductor film, plate-shaped crystals are sometimes formed on the top surface of the oxide semiconductor film. The plate-shaped crystals are preferably single crystals that are c-axis-oriented in a direction substantially perpendicular to the surface of the oxide semiconductor film. If the plate-shaped crystals are not single crystals, they are preferably polycrystals where a-b planes of the crystals are aligned or the a-axes or the b-axes are aligned in the channel formation region and the crystals are oriented in the c-axis (the direction substantially perpendicular to the surface of the oxide semiconductor film). Note that in the case where a surface of the layer placed below the oxide semiconductor film is uneven, the plate-shaped crystals are polycrystals; therefore, the surface of the layer placed below the oxide semiconductor film is preferably as even as possible.

Next, the insulating film 708, the insulating film 712, and the gate insulating film 714 are partly etched, whereby contact holes reaching the island-shaped semiconductor film 702, the island-shaped semiconductor film 703, and the wiring 711 are formed.

Figure 8C:
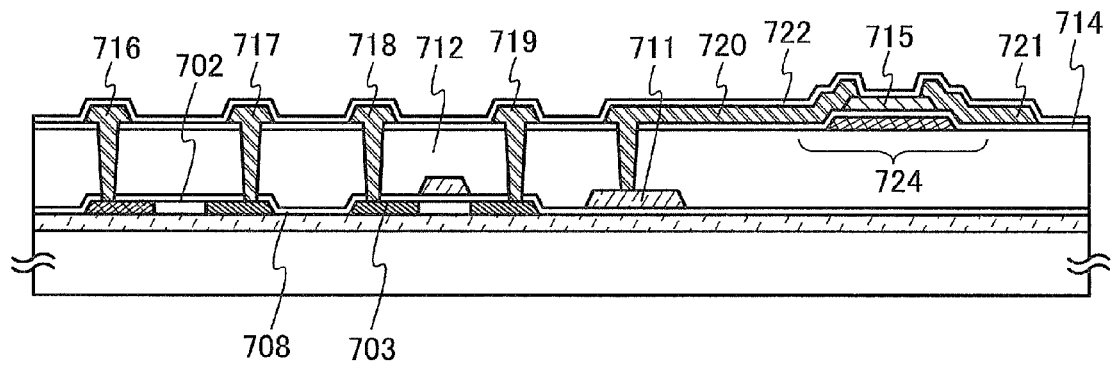

Then, a conductive film is formed so as to cover the oxide semiconductor layer 715 by sputtering or vacuum evaporation. After that, the conductive film is patterned by etching or the like, so that conductive films 716, 717, 718, 719, 720, and 721 each of which functions as a source electrode, a drain electrode, or a wiring are formed as illustrated in FIG. 8C.

Note that the conductive films 716 and 717 are in contact with the island-shaped semiconductor film 702. The conductive films 718 and 719 are in contact with the island-shaped semiconductor film 703. The conductive film 720 is in contact with the wiring 711 and the oxide semiconductor layer 715. The conductive film 721 is in contact with the oxide semiconductor layer 715.

As a material of the conductive film for forming the conductive films 716 to 721, any of the following materials can be used, for example: an element selected from aluminum, chromium, copper, tantalum, titanium, molybdenum, or tungsten; an alloy containing any of these elements; and an alloy film containing the above elements in combination. Alternatively, the conductive film may have a structure in which a film of a refractory metal such as chromium, tantalum, titanium, molybdenum, or tungsten is stacked over or below a metal film of aluminum, copper, or the like. Aluminum and copper are preferably used in combination with a refractory metal material in order to avoid problems of heat resistance and corrosion. As the refractory metal material, molybdenum, titanium, chromium, tantalum, tungsten, neodymium, scandium, yttrium, or the like can be used.

The conductive films 716 to 721 may have a single-layer structure or a stacked structure including two or more layers. For example, the conductive films 716 to 721 may have a single-layer structure of an aluminum film containing silicon; a two-layer structure of an aluminum film and a titanium film stacked thereover; or a three-layer structure in which a titanium film, an aluminum film, and a titanium film are stacked in this order.

The conductive film for forming the conductive films 716 to 721 may be formed using a conductive metal oxide. As a conductive metal oxide, indium oxide, tin oxide, zinc oxide, indium tin oxide, indium zinc oxide, or the metal oxide material to which silicon or silicon oxide is added can be used.

In the case where heat treatment is performed after formation of the conductive film, the conductive film preferably has heat resistance high enough to withstand the heat treatment.

Note that the materials and etching conditions are adjusted as appropriate so that the oxide semiconductor layer 715 is not removed as much as possible in etching of the conductive film. Depending on etching conditions, an exposed portion of the island-shaped oxide semiconductor layer 715 is partly etched and thus a groove (a recessed portion) is formed in some cases.

In this embodiment, a titanium film is used as the conductive film. For that reason, wet etching can be selectively performed on the conductive film by using a solution containing ammonia and hydrogen peroxide water (i.e., ammonia hydrogen peroxide mixture); in this case, the oxide semiconductor layer 715 is partly etched. Specifically, a solution in which hydrogen peroxide water of 31 wt %, ammonia water of 28 wt %, and water are mixed at a volume ratio of 5:2:2 is used as the ammonia hydrogen peroxide mixture. Alternatively, dry etching may be performed on the conductive film with the use of a gas containing chlorine ($Cl_2$), boron trichloride ($BCl_3$), or the like.

In order to reduce the number of photomasks and steps in a photolithography process, etching may be performed with the use of a resist mask formed using a multi-tone mask through which light is transmitted so as to have a plurality of intensities. A resist mask formed with the use of a multi-tone mask has a plurality of thicknesses and further can be changed in shape by etching; therefore, the resist mask can be used in a plurality of etching steps for processing into different patterns. That is, a resist mask corresponding to at least two kinds of different patterns can be formed by one multi-tone mask. Thus, the number of light-exposure masks can be reduced and the number of corresponding photolithography steps can be also reduced, whereby the process can be simplified.

Next, plasma treatment using a gas such as $N_2O$, $N_2$, or Ar is performed. Through this plasma treatment, water or the like adsorbed on an exposed surface of the oxide semiconductor layer 715 is removed. Plasma treatment may be performed using a mixture gas of oxygen and argon.

After the plasma treatment, as illustrated in FIG. 8C, the insulating film 722 is formed so as to cover the conductive films 716 to 721 and the oxide semiconductor layer 715. The insulating film 722 preferably contains as little impurities such as moisture, hydrogen, and oxygen as possible. The insulating film 722 may be a single-layer insulating film or a stack of a plurality of insulating films. If hydrogen is contained in the insulating film 722, hydrogen might enter the oxide semiconductor layer or extract oxygen from the oxide semiconductor layer, thereby causing reduction in resistance of a back channel portion of the oxide semiconductor layer (making the back channel portion have n-type conductivity), which might result in formation of parasitic channel. Therefore, it is important that a film formation method in which hydrogen is not used be employed in order to form the insulating film 722 containing as little hydrogen as possible. A material with high barrier properties is preferably used for the insulating film 722. For example, as an insulating film with high barrier properties, a silicon nitride film, a silicon nitride oxide film, an aluminum nitride film, an aluminum nitride oxide film, or the like can be used. In the case of using a stack of a plurality of insulating films, an insulating film with a low nitrogen content, such as a silicon oxide film or a silicon oxynitride film, is formed on the side closer to the oxide semiconductor layer 715 than the insulating film with high barrier properties. Then, the insulating film with high barrier properties is formed so as to overlap with the conductive films 716 to 721 and the oxide semiconductor layer 715 with the insulating film with a low nitrogen content sandwiched therebetween. By using the insulating film with high barrier properties, impurities such as moisture or hydrogen can be prevented from entering the oxide semiconductor layer 715, the gate insulating film 714, or the interface between the oxide semiconductor layer 715 and another insulating film and the vicinity thereof. In addition, the insulating film with a low nitrogen content, such as a silicon oxide film or a silicon oxynitride film, is formed so as to be in contact with the oxide semiconductor layer 715, so that the insulating film with high barrier properties can be prevented from being in direct contact with the oxide semiconductor layer 715.

In this embodiment, the insulating film 722 is formed with a structure in which a 100-nm-thick silicon nitride film formed by sputtering is stacked over a 200-nm-thick silicon oxide film formed by sputtering. The substrate temperature in film formation may be higher than or equal to room temperature and lower than or equal to 300° C. and in this embodiment, is 100° C.

After the insulating film 722 is formed, heat treatment may be performed. The heat treatment is performed at preferably 200° C. to 400° C. (e.g., 250° C. to 350° C.) in a nitrogen atmosphere, an atmosphere of ultra-dry air, or a rare gas (e.g., argon or helium) atmosphere. The water content in the gas is preferably 20 ppm or less, more preferably 1 ppm or less, further preferably 10 ppb or less. In this embodiment, for example, heat treatment is performed at 250° C. for one hour in a nitrogen atmosphere. Alternatively, RTA treatment for a short time at a high temperature may be performed before the formation of the conductive films 716 to 721, in a manner similar to that of the previous heat treatment performed on the oxide semiconductor layer for reduction of moisture or hydrogen. Even when oxygen defects are generated in the oxide semiconductor layer 715 because of the previous heat treatment performed on the oxide semiconductor layer, by performing heat treatment after the insulating film 722 containing oxygen is provided, oxygen is supplied to the oxide semiconductor layer 715 from the insulating film 722. By supplying oxygen to the oxide semiconductor layer 715, oxygen defects that serve as donors can be reduced in the oxide semiconductor layer 715. As a result, the oxide semiconductor layer 715 can be made to be substantially i-type and variation in electric characteristics of the transistor due to oxygen vacancy can be reduced; thus, the electrical characteristics can be improved. There is no particular limitation on the timing of this heat treatment as long as it is after the formation of the insulating film 722. When this heat treatment doubles as another step such as heat treatment for formation of a resin film or heat treatment for reduction of the resistance of a transparent conductive film, the oxide semiconductor layer 715 can be made to be substantially i-type without increase in the number of steps.

Further, oxygen vacancies that serve as donors in the oxide semiconductor layer 715 may be reduced by performing heat treatment on the oxide semiconductor layer 715 in an oxygen atmosphere so that oxygen is added to the oxide semiconductor. The heat treatment is performed at a temperature of, for example, higher than or equal to 100° C. and lower than 350° C., preferably higher than or equal to 150° C. and lower than 250° C. It is preferable that an oxygen gas used for the heat treatment under an oxygen atmosphere do not include water, hydrogen, or the like. The purity of oxygen gas which is introduced into a heat treatment apparatus is preferably 6N (99.9999%) or higher, further preferably 7N (99.99999%) or higher (i.e., the impurity concentration in the oxygen is preferably 1 ppm or lower, further preferably 0.1 ppm or lower).

Alternatively, an ion implantation method, an ion doping method, or the like may be employed to add oxygen to the oxide semiconductor layer 715 so that oxygen vacancies serving as donors are reduced. For example, oxygen which is made into a plasma state with a microwave at 2.45 GHz may be added to the oxide semiconductor layer 715.

Note that a backgate electrode may be formed in a position overlapping with the oxide semiconductor layer 715 by forming a conductive film over the insulating film 722 and then patterning the conductive film. In the case where the backgate electrode is formed, an insulating film is preferably formed to cover the backgate electrode. The backgate electrode can be formed using a material and a structure similar to those of the gate electrode 713 or the conductive films 716 to 721.

The thickness of the backgate electrode is 10 nm to 400 nm, preferably 100 nm to 200 nm. For example, the backgate electrode may be formed in such a manner that a conductive film in which a titanium film, an aluminum film, and a titanium film are stacked is formed, a resist mask is formed by photolithography or the like, and unnecessary portions are removed by etching so that the conductive film is processed (patterned) into a desired shape.

Through the above steps, a transistor 724 is formed.

The transistor 724 includes the gate electrode 713, the gate insulating film 714 over the gate electrode 713, the oxide semiconductor layer 715 that overlaps the gate electrode 713 with the gate insulating film 714 placed therebetween, and a pair of the conductive films 720 and 721 formed over the oxide semiconductor layer 715. Further, the insulating film 722 may be considered as a component of the transistor 724. The transistor 724 illustrated in FIG. 8C has a channel-etched structure in which part of the oxide semiconductor layer 715, which is placed between the conductive film 720 and the conductive film 721, is etched.

Although the transistor 724 is described as a single-gate transistor, a multi-gate transistor that includes a plurality of gate electrodes 713 electrically connected to each other and thus has a plurality of channel formation regions can be formed, if needed.

Further, an insulating film in contact with the oxide semiconductor layer 715 (which corresponds to the gate insulating film 714 and the insulating film 722 in this embodiment) may be formed using an insulating material containing a Group 13 element and oxygen. Many of oxide semiconductor materials contain elements of Group 13, and an insulating material containing an element of Group 13 is compatible with an oxide semiconductor. Thus, when an insulating material containing an element of Group 13 is used for the insulating film in contact with the oxide semiconductor layer, the state of the interface between the oxide semiconductor layer and the insulating film can be kept favorable.

An insulating material containing a Group 13 element refers to an insulating material containing one or plural kinds of Group 13 elements. Examples of the insulating material containing a Group 13 element are gallium oxide, aluminum oxide, aluminum gallium oxide, and gallium aluminum oxide. Here, aluminum gallium oxide refers to a material in which the aluminum content is higher than the gallium content in atomic percent (at. %), and gallium aluminum oxide refers to a material in which the gallium content is higher than or equal to the aluminum content in atomic percent (at. %).

For example, when a material containing gallium oxide is used for an insulating film that is in contact with an oxide semiconductor layer containing gallium, characteristics at the interface between the oxide semiconductor layer and the insulating film can be kept favorable. For example, the oxide semiconductor layer and an insulating film containing gallium oxide are provided in contact with each other, so that pile up of hydrogen at the interface between the oxide semiconductor layer and the insulating film can be reduced. Note that a similar effect can be obtained in the case where an element in the same group as a constituent element of the oxide semiconductor layer is used for the insulating film. For example, it is effective to form an insulating film with the use of a material containing aluminum oxide. Note that water is not likely to permeate an aluminum oxide; therefore, it is preferable to use a material containing aluminum oxide in terms of preventing entry of water to the oxide semiconductor layer.

The insulating film in contact with the oxide semiconductor layer 715 preferably contains oxygen in a proportion higher than that in the stoichiometric composition by heat treatment in an oxygen atmosphere or by oxygen doping treatment. Oxygen doping treatment refers to addition of oxygen into a bulk. Note that the term "bulk" is used in order to clarify that oxygen is added not only to a surface of a thin film but also to the inside of the thin film. In addition, "oxygen doping treatment" includes oxygen plasma doping treatment by which oxygen plasma is added to a bulk. The oxygen doping treatment may be performed by an ion implantation method or an ion doping method.

For example, in the case where the insulating film in contact with the oxide semiconductor layer 715 is formed using gallium oxide, the composition of gallium oxide can be set to be $Ga_2O_x$ ($x=3+\alpha$, where $0<\alpha<1$) by heat treatment in an oxygen atmosphere or by oxygen doping treatment.

In the case where the insulating film in contact with the oxide semiconductor layer 715 is formed using aluminum oxide, the composition of aluminum oxide can be set to be $Al_2O_x$ ($x=3+\alpha$, where $0<\alpha<1$) by heat treatment in an oxygen atmosphere or by oxygen doping treatment.

Moreover, in the case where the insulating film in contact with the oxide semiconductor layer 715 is formed using gallium aluminum oxide (aluminum gallium oxide), the composition of gallium aluminum oxide (aluminum gallium oxide) can be set to be $Ga_xAl_{2-x}O_{3+\alpha}$ ($0<x<2$, $0<\alpha<1$) by heat treatment in an oxygen atmosphere or by oxygen doping treatment.

By oxygen doping treatment, an insulating film that includes a region where the proportion of oxygen is higher than that in the stoichiometric composition can be formed. When the insulating film including such a region is in contact with the oxide semiconductor layer, oxygen that exists excessively in the insulating film is supplied to the oxide semiconductor layer, and oxygen vacancies in the oxide semiconductor layer or at the interface between the oxide semiconductor layer and the insulating film are reduced. Thus, the oxide semiconductor layer can be an i-type or substantially i-type oxide semiconductor.

The insulating film including a region where the proportion of oxygen is higher than that in the stoichiometric composition may be used as either the insulating film placed above the oxide semiconductor layer 715 or the insulating film placed below the oxide semiconductor layer 715 of the insulating films in contact with the oxide semiconductor layer 715; it is preferably used as both of the insulating films in contact with the oxide semiconductor layer 715. The above-described effect can be enhanced with a structure where the insulating films that include a region where the proportion of oxygen is higher than that in the stoichiometric composition are used as insulating films placed above and below and in contact with the oxide semiconductor layer 715, in order that the oxide semiconductor layer 715 is sandwiched therebetween.

The insulating films placed above and below the oxide semiconductor layer 715 may contain the same constituent element or different constituent elements. For example, both of the insulating films placed above and below the oxide semiconductor layer 715 may be formed using gallium oxide whose composition is $Ga_2O_x$ ($x=3+\alpha$, where $0<\alpha<1$). Alternatively, one of these insulating films may be formed using gallium oxide whose composition is $Ga_2O_x$ ($x=3+\alpha$, where $0<\alpha<1$) and the other thereof may be formed using aluminum oxide whose composition is $Al_2O_x$ ($x=3+\alpha$, where $0<\alpha<1$).

The insulating film in contact with the oxide semiconductor layer 715 may be a stack of insulating films each of which includes a region where the proportion of oxygen is higher than that in the stoichiometric composition. For example, the insulating film placed above the oxide semiconductor layer 715 may be formed as follows: gallium oxide whose composition is $Ga_2O_x$ ($x=3+\alpha$, where $0<\alpha<1$) is formed and gallium aluminum oxide (aluminum gallium oxide) whose composition is $Ga_xAl_{2-x}O_{3+\alpha}$ ($0<x<2$, $0<\alpha<1$) is formed thereover. Note that it is possible that the insulating film placed below the oxide semiconductor layer 715, or both of the insulating films placed above and below the oxide semiconductor layer 715 may be a stack of insulating films each of which includes a region where the proportion of oxygen is higher than that in the stoichiometric composition.

The photodiode 704 can be used as the photodiode 102 illustrated in FIG. 1, FIGS. 6A and 6B, and the like. The n-channel transistor 705 can be used as the transistors 104 and 105 illustrated in FIG. 1, FIGS. 6A and 6B, and the like. The transistor 724 can be used as the transistor 103 illustrated in FIG. 1, FIGS. 6A and 6B, and the like. Moreover, the transistor 724 may be used as the transistors 104 and 105 illustrated in FIG. 1, FIGS. 6A and 6B, and the like.

This embodiment can be implemented in combination with any of the embodiments.

Embodiment 4

In this embodiment, a transistor whose channel is formed in an oxide semiconductor layer and which has a structure different from that in Embodiment 3 will be described.

Figure 9A:
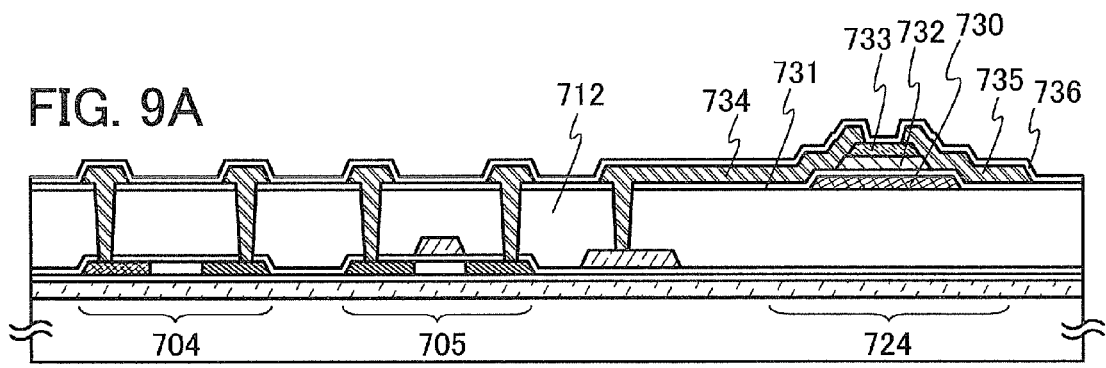
FIGS. 9A to 9D are cross-sectional views of photosensors.

A photosensor illustrated in FIG. 9A includes the photodiode 704 and the n-channel transistor 705 as in Embodiment 3. In addition, in FIG. 9A, a bottom-gate transistor 724 with a channel protective structure is formed over the photodiode 704 and the n-channel transistor 705.

The transistor 724 includes a gate electrode 730 formed over the insulating film 712, a gate insulating film 731 over the gate electrode 730, an oxide semiconductor layer 732 overlapping the gate electrode 730 with the gate insulating film 731 placed therebetween, a channel protective film 733 formed over the oxide semiconductor layer 732 in a position overlapping with the gate electrode 730, and a conductive film 734 and a conductive film 735 formed over the oxide semiconductor layer 732. The transistor 724 may further include, as its component, an insulating film 736 formed over the conductive films 734 and 735 and the channel protective film 733.

The channel protective film 733 can prevent the portion serving as a channel formation region in the oxide semiconductor layer 732 from being damaged in a later step (e.g., from being reduced in thickness due to plasma or an etchant in etching). Thus, the reliability of the transistor 724 can be improved.

The channel protective film 733 can be formed using an inorganic material containing oxygen (e.g., silicon oxide, silicon nitride oxide, silicon oxynitride, aluminum oxide, or aluminum oxynitride). The channel protective film 733 can be formed by vapor deposition such as plasma CVD or thermal CVD, or sputtering. After the deposition, the shape of the channel protective film 733 is processed by etching. Here, the channel protective film 733 is formed in such a manner that a silicon oxide film is formed by sputtering and processed by etching using a mask formed by photolithography.

By using an inorganic material containing oxygen for the channel protective film 733, oxygen can be supplied from the channel protective film 733 to the oxide semiconductor layer 732 and oxygen vacancies serving as donors can be reduced even when oxygen vacancies occur in the oxide semiconductor layer 732 by heat treatment for reducing moisture or hydrogen. Thus, the channel formation region can be made to be close to i-type and a variation in electric characteristics of the transistor 724 due to oxygen vacancies can be reduced, which results in improvement of the electric characteristics.

Figure 9B:
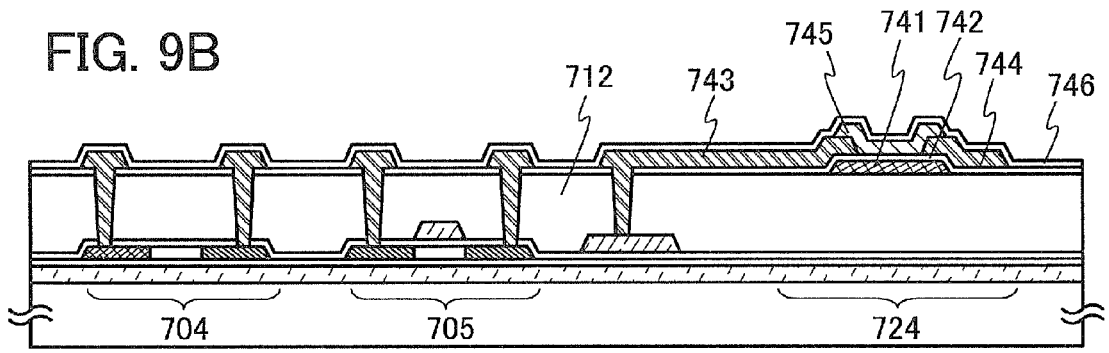

A photosensor illustrated in FIG. 9B includes the photodiode 704 and the n-channel transistor 705 as in Embodiment 3. In FIG. 9B, a bottom-contact transistor 724 is formed over the photodiode 704 and the n-channel transistor 705.

The transistor 724 includes a gate electrode 741 formed over the insulating film 712, a gate insulating film 742 over the gate electrode 741, a conductive film 743 and a conductive film 744 over the gate insulating film 742, and an oxide semiconductor layer 745 overlapping the gate electrode 741 with the gate insulating film 742 placed therebetween. Further, the transistor 724 may include an insulating film 746 formed over the oxide semiconductor layer 745, as its component.

Note that the transistor 724 illustrated in FIGS. 9A and 9B may further include a backgate electrode.

Figure 9C:
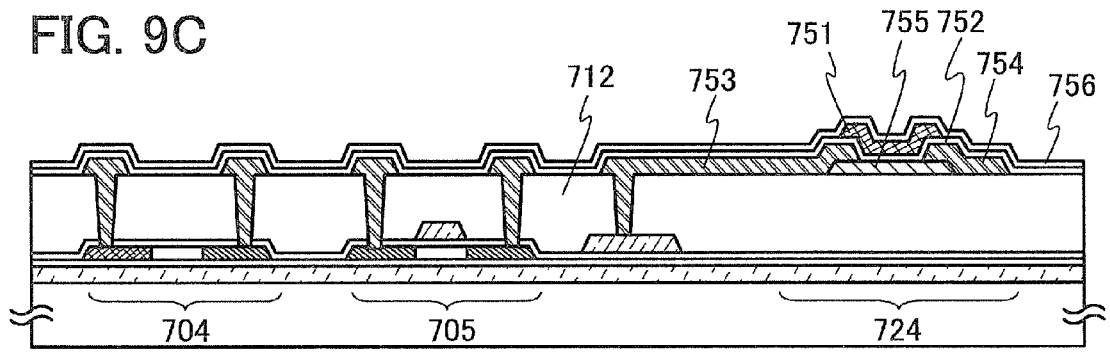

A photosensor illustrated in FIG. 9C includes the photodiode 704 and the n-channel transistor 705 as in Embodiment 3. In FIG. 9C, a top-contact transistor 724 is formed over the photodiode 704 and the n-channel transistor 705.

The transistor 724 includes an oxide semiconductor layer 755 formed over the insulating film 712, a conductive film 753 and a conductive film 754 over the oxide semiconductor layer 755, a gate insulating film 752 over the oxide semiconductor layer 755 and the conductive films 753 and 754, and a gate electrode 751 overlapping the oxide semiconductor layer 755 with the gate insulating film 752 placed therebetween. Further, an insulating film 756 formed over the gate electrode 751 may be included as a component of the transistor 724.

Figure 9D:
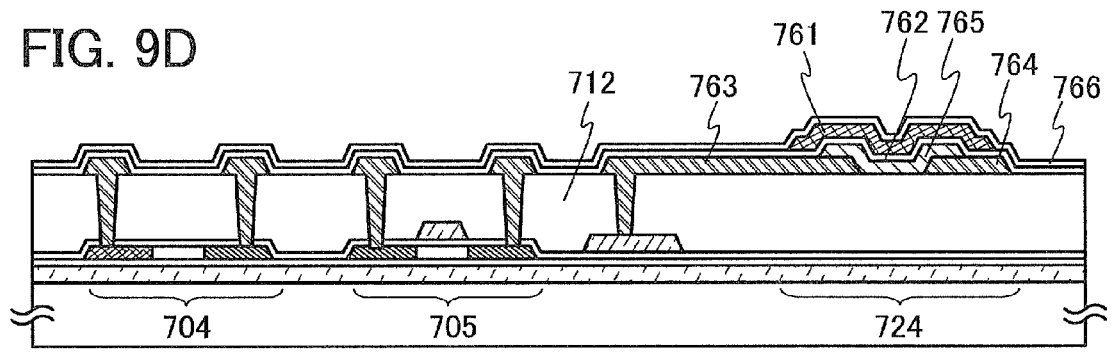

A photosensor illustrated in FIG. 9D includes the photodiode 704 and the n-channel transistor 705 as in Embodiment 3. In FIG. 9D, a top-contact transistor 724 is formed over the photodiode 704 and the n-channel transistor 705.

The transistor 724 includes a conductive film 763 and a conductive film 764 formed over the insulating film 712, an oxide semiconductor layer 765 over the conductive films 763 and 764, a gate insulating film 762 over the oxide semiconductor layer 765 and the conductive films 763 and 764, and a gate electrode 761 overlapping the oxide semiconductor layer 765 with the gate insulating film 762 placed therebetween. Further, an insulating film 766 formed over the gate electrode 761 may be included as a component of the transistor 724.

The photodiode 704 can be used as the photodiode 102 illustrated in FIG. 1, FIGS. 6A and 6B, and the like. The n-channel transistor 705 can be used as the transistors 104 and 105 illustrated in FIG. 1, FIGS. 6A and 6B, and the like. The transistor 724 can be used as the transistor 103 illustrated in FIG. 1, FIGS. 6A and 6B, and the like. Moreover, the transistor 724 may be used as the transistors 104 and 105 illustrated in FIG. 1, FIGS. 6A and 6B, and the like.

This embodiment can be implemented in combination with any of the embodiments.

Embodiment 5

This embodiment describes a method for driving a semiconductor device with which two-dimensional imaging and three-dimensional imaging can be performed concurrently by using the TOF method.

The configuration of a photosensor in this embodiment is the same as that of the photosensor described in Embodiment 1 with reference to FIG. 1. Specifically, a first photosensor and a second photosensor which have the same configuration as the photosensor described in Embodiment 1 with reference to FIG. 1 are provided so as to overlap with each other. A semiconductor layer in the first photosensor is formed of amorphous silicon or the like that absorbs visible light and transmits infrared light. A semiconductor layer in the second photosensor is formed of crystalline silicon, single crystal silicon, or the like that absorbs infrared light.

For three-dimensional imaging, the distance from a light source to an object is measured in the following manner. The first imaging and the second imaging are performed with respect to the timings of the first irradiation and the second irradiation (which have the same length of time and are performed at different timings), respectively. The first detection signal dependent on the time difference between the arrival times of light is obtained through the first reflected light detection in which the first reflected light resulting from the first irradiation is detected. The second detection signal dependent on the time difference between the arrival times of light is obtained through the second reflected light detection in which the second reflected light resulting from the second irradiation is detected. For two-dimensional imaging, the third imaging is performed to obtain the third detection signal, so that the lightness and color of the object can be obtained.

This embodiment describes a configuration in which a first photosensor 100A and a second photosensor 100B are provided so as to overlap with each other with reference to FIGS. 10A and 10B. Note that the first photosensor 100A and the second photosensor 100B have the same configuration as the photosensor 100; therefore, their detailed description is omitted.

FIG. 10A is an example of a circuit diagram illustrating the configurations of photosensors in a semiconductor device according to one embodiment of the present invention. As illustrated in FIG. 10A, the first photosensor 100A includes three transistors and one photodiode. The second photosensor 100B includes three transistors and one photodiode. As illustrated in FIG. 10A, the first photosensor 100A includes a first photodiode 102A, a transistor 103A, a transistor 104A, and a transistor 105A. The second photosensor 100B includes a second photodiode 102B, a transistor 103B, a transistor 104B, and a transistor 105B.

As illustrated in FIG. 10A, the first photosensor 100A and the second photosensor 100B are adjacent to each other. Specifically, as illustrated in FIG. 10B, the first photodiode 102A and the second photodiode 102B overlap with each other. Further, the first photodiode 102A is placed such that light entering the photosensors (including visible light and infrared light) enters the first photodiode 102A before entering the second photodiode 102B.

Note that light entering the photosensor 100 refers to reflected light. In this embodiment, light entering the first photodiode 102A refers to light reflected off an object on which light from a light source or natural light, or both (visible light) falls. Light entering the second photodiode 102B refers to light reflected off an object irradiated with light from the light source (infrared light).

When the first photosensor 100A and the second photosensor 100B are provided so as to overlap with each other, the sensors can share an area; therefore, the area of the semiconductor device which is occupied by the photosensors can be reduced. Thus, pixel size can be reduced.

Properties of a semiconductor layer in the first photodiode 102A are absorbing mainly visible light and transmitting most of infrared light. For example, the semiconductor layer in the first photodiode 102A may be formed of amorphous silicon or the like.

A property of a semiconductor layer in the second photodiode 102B is absorbing infrared light. For example, the semiconductor layer in the second photodiode 102B may be formed of crystalline silicon, single crystal silicon, or the like.

Therefore, the first photodiode 102A absorbs visible light earlier than the second photodiode 102B, so that the amount of visible light entering the second photodiode 102B can be reduced.

In other words, the first photosensor 100A utilizes visible light, while the second photosensor 100B utilizes infrared light.

In FIG. 10A, a signal line 11A is a reset signal line (PR_2). A signal line 12A is a charge storage signal line (TX_2). A signal line 13A is a selection signal line (SE_2). A signal line 16A is a photosensor output signal line. A signal line 11B is a reset signal line (PR_3). A signal line 12B is a charge storage signal line (TX_3). A signal line 13B is a selection signal line (SE_3). A signal line 16B is a photosensor output signal line. A signal line 15 is a photosensor reference signal line which can be shared by the first photosensor 100A and the second photosensor 100B.

In three-dimensional imaging, the potentials of the signal line 11B (PR_3) and the signal line 12B (TX_3) are controlled. Specifically, in the first imaging, the potentials of the signal line 11B and the signal line 12B are controlled such that the first imaging starts when the first infrared light reflection starts and the first imaging terminates when the first infrared light irradiation terminates. In the second imaging, the potentials of the signal line 11B and the signal line 12B are controlled such that the second imaging starts when the second infrared light irradiation terminates and the second imaging terminates when the second infrared light reflection terminates.

In two-dimensional imaging, the potentials of the signal line 11A (PR_2) and the signal line 12A (TX_2) are controlled. Specifically, in the third imaging, the potentials of the signal line 11A and the signal line 12A are controlled such that the third imaging starts at least before the initiation of the first imaging and the third imaging terminates at least after the end of the second imaging.

As described above, the first photosensor 100A and the second photosensor 100B each include four elements: one photodiode and three transistors. Since the photosensors can be formed by fewer elements, the photosensors can be highly integrated, facilitating the reduction of pixel size.

Next, a description is given of a method for driving a semiconductor device including photosensors having the configuration illustrated in FIG. 10A. With this driving method, two-dimensional imaging and three-dimensional imaging using the TOF method can be performed concurrently. Since the first photosensor 100A and the second photosensor 100B overlap with each other, it is possible to reduce pixel size and perform two-dimensional imaging utilizing the first photosensor 100A absorbing visible light, and three-dimensional imaging utilizing the second photosensor 100B absorbing infrared light.

The driving method will be specifically described with reference to timing charts of FIG. 11 and FIG. 12. First, the operation of the first photosensor 100A and the second photosensor 100B will be described with reference to FIG. 11. Features of the driving method and a method for performing two-dimensional imaging and three-dimensional imaging using the TOF method concurrently will be described with reference to FIG. 12.

Figure 11:
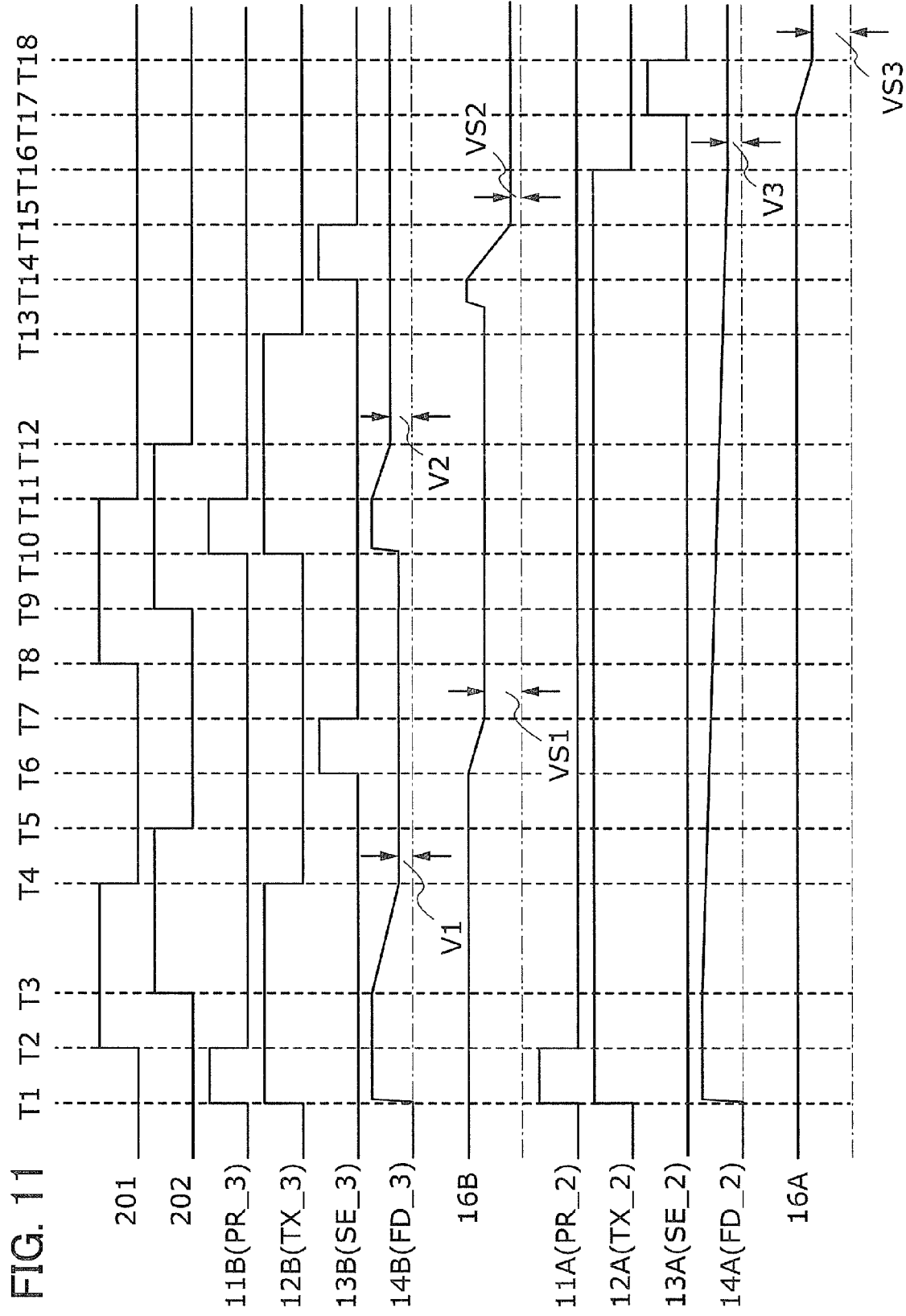
FIG. 11 is a chart illustrating pulses for the photosensors.

FIG. 11 is a timing chart of the first photosensor 100A and the second photosensor 100B. According to the driving method in this embodiment, two-dimensional imaging and three-dimensional imaging can be performed during a period from the time T1 to the time T18.

Figure 12:
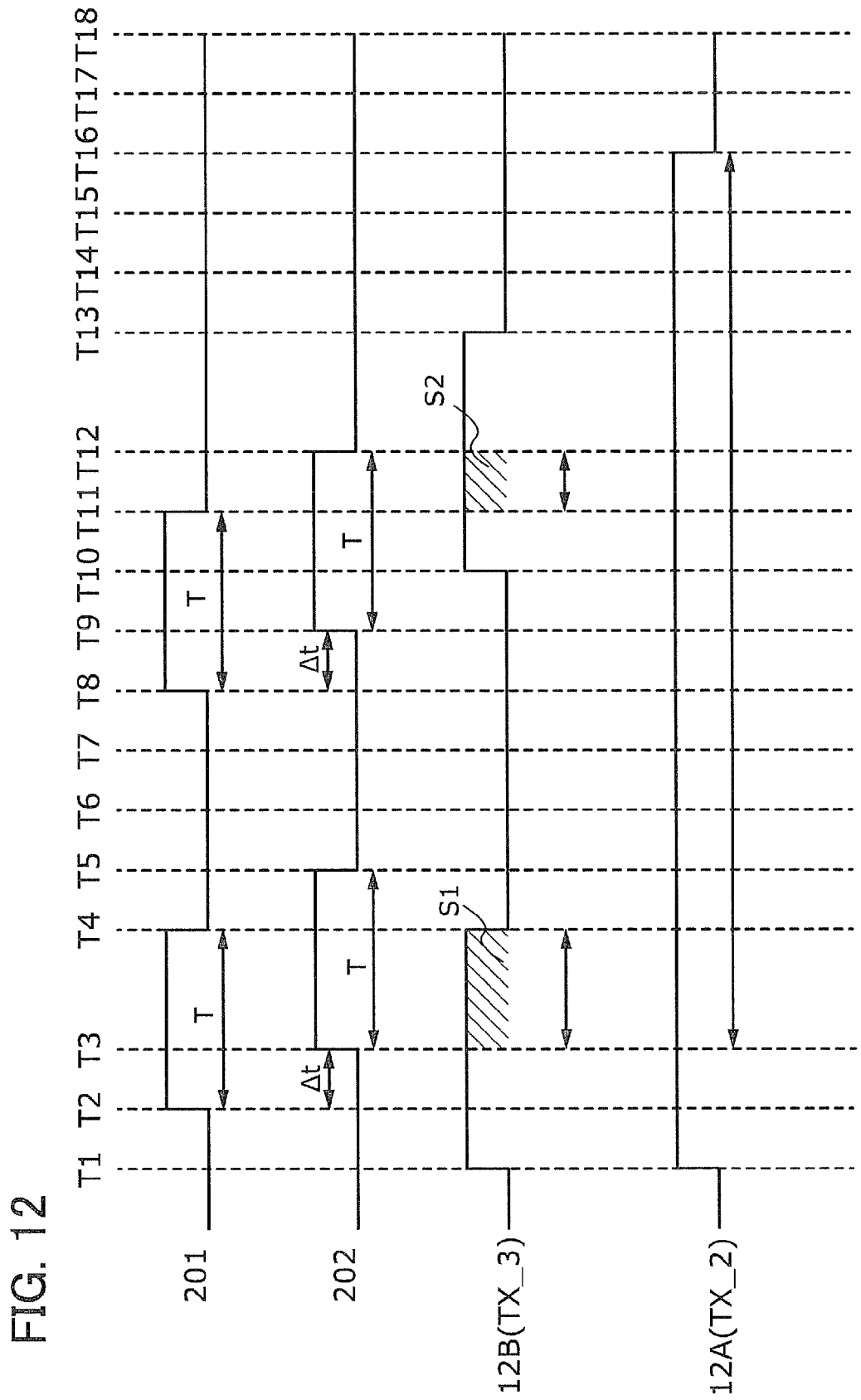
FIG. 12 is a chart illustrating pulses for the photosensors.

In the timing charts of FIG. 11 and FIG. 12, the high level of the pulse 201 and the pulse 202 represents "irradiation", while the low level thereof represents "non-irradiation". The high level of the other pulses represents a high potential, while the low level thereof represents a low potential.

In three-dimensional imaging, the object is irradiated with light from the light source twice (the first irradiation and the second irradiation). Note that the second irradiation and the first irradiation are performed for the same length of time at different timings. The distance from a light source to an object is unchanged during the first irradiation and during the second irradiation. The period between time T2 and time T3 (time difference) and the period between time T8 and T9 (time difference) have the same length of time.

At the time T1, the signal line 11B is brought high. Further, the signal line 12B is brought high (a first reset for three-dimensional imaging). At this time, electrical continuity between the second photodiode 102B and the transistor 103B is established and the node 14B goes high.

Similarly, the signal line 11A is brought high. Further, the signal line 12A is brought high (a first reset for two-dimensional imaging). At this time, electrical continuity between the first photodiode 102A and the transistor 103A is established and the node 14A goes high.

At the time T2, the first light irradiation in which the object is irradiated with light from the light source starts. The pulse 201 goes from low (non-irradiation) to high (irradiation). The time T2 is a first irradiation start time. Further, the signal line 11B is brought low, and the signal line 12B is held high.

Similarly, the signal line 11A is brought low, and the signal line 12B is held high. In this configuration, the first photodiode 102A absorbing visible light and the second photodiode 102B absorbing infrared light overlap with each other; therefore, the first imaging and the third imaging can be performed during the same period.

At the time T3, first irradiation light emitted from the light source is reflected off the object, and first reflected light (infrared light) starts to enter the semiconductor device. The pulse 202 goes from low (non-irradiation) to high (irradiation). The time T3 is a first reflection start time. The time T3 is also a first reflected light detection start time. Detection of reflected light can be started at the time T3. Further, the signal line 12A is held high.

From the time T3 to the time T4 (during the first reflected light detection period), the potential of the node 14B changes according to the intensity of the first reflected light. The potential of the node 14B starts to decrease from high owing to the off-state current of the second photodiode 102B. The off-state current is proportional to irradiation time and the intensity of reflected light entering the second photodiode 102B.

Similarly, the potential of the node 14A starts to decrease from high.

At the time T4, the first light irradiation in which the object is irradiated with light from the light source terminates. The pulse 201 goes from high (irradiation) to low (non-irradiation). The time T4 is a first irradiation end time. The signal line 12B is brought low. The time T4 is also a first reflected light detection end time. On the other hand, the signal line 12A is held high.

The potential of the node 14B becomes constant after the time T4. The potential of the node 14B at the time T4 (V1) is dependent on photocurrent generated by the photodiode 102 during the first reflected light detection. This means that the potential of the node 14B is determined by light intensity and the like. On the other hand, the potential of the node 14A keeps decreasing.

The first detection signal is determined by the potential of the node 14B at the time T4 (V1). As the length of the first reflected light detection period increases, the amount of change in the potential of the node 14B increases, so that the potential of the node 14B at the time T4 (V1) is low.

Note that from the time T1 to the time T4, all of the light entering the second photodiode 102B refers to light resulting from the first reflection, i.e., light reflected off an object irradiated with light from the light source. Note that the reflected light is infrared light.

Note that from the time T1 to the time T16, all of the light entering the first photodiode 102A refers to reflected light, i.e., light reflected off the object on which light from a light source or natural light, or both falls. Note that the reflected light is visible light.

At the time T5, entrance of reflected light resulting from the first reflection which is reflected off the object to the semiconductor device terminates. The pulse 202 goes from high (irradiation) to low (non-irradiation). The time T5 is a first reflection end time. On the other hand, the signal line 12A is held high.

When the signal line 12B is brought low, parasitic capacitance between the signal line 12B and the node 14B causes a change in the potential of the node 14B. A significant change in the potential inhibits obtainment of accurate photocurrent generated by the second photodiode 102B through the first and second imaging. Therefore, effective methods of reducing the influence of parasitic capacitance are, for example, to reduce the gate-source capacitance of the transistor 103B or the gate-drain capacitance of the transistor 103B and to connect a storage capacitor to the node 14B. The second photosensor 100B according to one embodiment of the present invention employs these methods, making a change in the potential of the node 14B due to parasitic capacitance negligible.

Note that the same method is employed in the case of the first photosensor 100A according to one embodiment of the present invention.

At the time T6, the signal line 13B is brought high (a first read starts). At this time, the transistor 105B conducts. Moreover, electrical continuity between the signal line 15B and the signal line 16B is established through the transistor 104B and the transistor 105B. Then, the potential of the signal line 16B starts to decrease. Note that the signal line 16B is precharged high before the time T6.

There is no limitation on the configuration of a read circuit with which the signal line 16B is precharged. The read circuit may have the configuration illustrated in FIG. 4.

At the time T7, the signal line 13B is brought low (the first read terminates). Then, the transistor 105B is turned off, and the potential of the signal line 16B becomes constant. The potential of the signal line 16B at the time T7 ($V_{S1}$) is dependent on the speed at which the potential of the signal line 16B changes during a period from the time T6 to the time T7.

By obtaining the potential of the signal line 16B at the time T7 ($V_{S1}$) by the first reflected light detection, the amount of reflected light entering the second photodiode 102B during the first imaging period (the product of time and the intensity of such light) can be detected; thus, a detection signal S1 is produced. Assuming that the light intensity during the first irradiation is fixed and only reflected light resulting from the first reflection enters the photodiode, the potential of the signal line 16B ($V_{S1}$) is substantially proportional to the length of the first reflected light detection period.

At the time T8, the second light irradiation in which the object is irradiated with light from the light source starts. The pulse 201 goes from low (non-irradiation) to high (irradiation). The time T8 is a second irradiation start time. Further, the signal line 12A is held high.

At the time T9, second irradiation light emitted from the light source is reflected off the object, and second reflected light starts to enter the semiconductor device. The pulse 202 goes from low (non-irradiation) to high (irradiation). The time T9 is a second reflection start time.

At the time T10, the signal line 11B is brought high, and the signal line 12B is brought high (a second reset for three-dimensional imaging). At this time, electrical continuity between the second photodiode 102B and the transistor 103B is established and the node 14B goes high.

At the time T11, the second light irradiation in which the object is irradiated with light from the light source terminates. The pulse 201 goes from high (irradiation) to low (non-irradiation). The time T11 is a second irradiation end time. The signal line 11B is brought low, and the signal line 12B is held high. The time T11 is also a second reflected light detection start time. Detection of reflected light can be started at the time T11. Further, the signal line 12A is held high.

From the time T11 to the time T12 (during the second reflected light detection period), the potential of the node 14B changes according to the second reflected light. The potential of the node 14B starts to decrease from high owing to the off-state current of the second photodiode 102B. The off-state current is proportional to irradiation time and the intensity of reflected light entering the second photodiode 102B. Therefore, the potential of the node 14B changes according to the intensity of the reflected light and the length of the reflected light detection period.

Note that this embodiment shows, as an example, the case where the second reflected light detection period (from the time T11 to the time T12) is shorter than the first reflected light detection period (from the time T3 to the time T4). Therefore, the amount of change in the potential of the node 14 during the second imaging is smaller than that of change in the potential of the node 14 during the first imaging.

At the time T12, entrance of reflected light resulting from the second reflection which is reflected off the object to the semiconductor device terminates. The pulse 202 goes from high (irradiation) to low (non-irradiation). The time T12 is a second reflection end time. The time T12 is also a second reflected light detection end time. On the other hand, the signal line 12A is held high.

The potential of the node 14B becomes constant after the time T12. The potential of the node 14B at the time T12 (V2) is dependent on photocurrent generated by the second photodiode 102B during the second reflected light detection. This means that the potential of the node 14B is determined by light intensity and the like. On the other hand, the potential of the node 14A keeps decreasing.

The second detection signal is determined by the potential of the node 14 at the time T12 (V2). As the length of the second reflected light detection period increases, the amount of change in the potential of the node 14 decreases, so that the potential of the node 14 at the time T12 (V2) is high.

At the time T13, the signal line 12B is brought low.

Note that all of the light entering the second photodiode 102B from the time T10 to the time T13 corresponds to reflected light resulting from the second reflection, i.e., light reflected off an object irradiated with light from the light source. Note that the reflected light is infrared light.

At the time T14, the signal line 13B is brought high (a second read starts). At this time, the transistor 105B conducts. Moreover, electrical continuity between the signal line 15B and the signal line 16B is established through the transistor 104B and the transistor 105B. Then, the potential of the signal line 16B decreases. Note that the signal line 16B is precharged high before the time T14.

At the time T15, the signal line 13B is brought low (the second read terminates). Then, the transistor 105B is turned off, and the potential of the signal line 16B becomes constant. The potential of the signal line 16B at the time T15 ($V_{S2}$) is dependent on the speed at which the potential of the signal line 16B changes during a period from the time T14 to the time T15.

For this reason, by obtaining the potential of the signal line 16B at the time T15 ($V_{S2}$) by the second reflected light detection, the amount of reflected light entering the second photodiode 102B during the second imaging period (the product of time and the intensity of such light) can be detected; thus, a detection signal S2 is produced. Assuming that the light intensity in the second irradiation is fixed and only reflected light resulting from the second reflection enters the photodiode, the potential of the signal line 16B ($V_{S2}$) is substantially proportional to the length of the second reflected light detection period.

Note that in this embodiment, the second reflected light detection period (from the time T11 to the time T12) is shorter than the first reflected light detection period (from the time T3 to the time T4), so that the potential of the signal line 16B at the time T15 ($V_{S2}$) is lower than the potential of the signal line 16B at the time T7 ($V_{S1}$).

At the time T15, the detection signal S1 and the detection signal S2 can be obtained by the first imaging and the second imaging, respectively, which enables three-dimensional imaging using the TOF method.

At the time T16, the signal line 12A is brought low.

At the time T17, the signal line 13A is brought high (a third read starts). At this time, the transistor 105A conducts. Moreover, electrical continuity between the signal line 15A and the signal line 16A is established through the transistors 104A and the transistor 105A. Then, the potential of the signal line 16A starts to decrease. Note that the signal line 16A is precharged high before the time T17.

At the time T18, the signal line 13A is brought low (the third read terminates). Then, the transistor 105A is turned off, and the potential of the signal line 16A becomes constant. The potential of the signal line 16A at the time T18 ($V_{S3}$) is dependent on the speed at which the potential of the signal line 16A changes during a period from the time T3 to the time T16.

By obtaining the potential of the signal line 16A at the time T18 ($V_{S3}$) by detection of reflected light (visible light) entering the first photodiode 102A (a third reflected light detection), the amount of reflected light entering the first photodiode 102A during a third imaging period (the product of time and the intensity of such light) can be detected; thus, a detection signal S3 is produced. Assuming that the intensity of external light is fixed, the potential of the signal line 16A ($V_{S3}$) is substantially proportional to the length of the third reflected light detection period.

At the time T18, the detection signal S3 can be obtained by the third imaging, so that three-dimensional imaging using the TOF method can be performed while two-dimensional imaging is performed.

FIG. 12 is a timing chart of the pulse 201, the pulse 202, the pulse of the signal line 12A, and the pulse of the signal line 12B for the first photosensor 100A and the second photosensor 100B. A description is given of the features of the driving method with reference to FIG. 12. Control is performed such that the potential of the gate electrode of the transistor 103B goes high during the first reflected light detection period, the potential of the gate electrode of the transistor 103B goes high during the second reflected light detection period, and the potential of the gate electrode of the transistor 103A goes high during a period including the first imaging period and the second imaging period. Thus, three-dimensional imaging can be performed while two-dimensional imaging is performed.

A description is given with comparison among the pulses in FIG. 12, dividing the time into the following periods: irradiation periods, reflection periods, imaging periods, and reflected light detection periods.

As the pulse 201 shows, the time T2 is the first irradiation start time, the time T4 is the first irradiation end time, and a period from the time T2 to the time T4 is the first irradiation period. The time T8 is the second irradiation start time, the time T11 is the second irradiation end time, and a period from the time T8 to the time T11 is the second irradiation period. In one embodiment of the present invention, the first irradiation period and the second irradiation period need to be of the same length of time.

As the pulse 202 shows, the time T3 is the first reflection start time, the time T5 is the first reflection end time, and a period from the time T3 to the time T5 is the first reflection period. The time T9 is the second reflection start time, the time T12 is the second reflection end time, and a period from the time T9 to the time T12 is the second reflection period. The reflection period and the irradiation period are of the same length of time.

In other words, the first irradiation period and the second irradiation period are of the same length of time, and the first reflection period and the second reflection period are of the same length of time.

As the pulse of the signal line 12B (TX_3) shows, the first imaging should be started at least when the first reflection period starts or before the initiation of the first reflection period. Moreover, the second imaging should be terminated at least when the second reflection period terminates or after the end of the second reflection period.

In other words, the timing of the first imaging period is determined with respect to the timing of the first reflection period and the timing of the second imaging period is determined with respect to the timing of the second reflection period; thus, the reflected light detection is divided into two periods.

As the pulse of the signal line 12A (TX_2) shows, the time T3 is the third imaging start time, and the time T16 is the third imaging end time. The time T3 is the reflected light detection start time, the time T16 is the reflected light detection end time, and a period from the time T3 to the time T16 is the reflected light detection period.

The third imaging should be started when the first imaging period starts or at least before the initiation of the first imaging period. Moreover, the third imaging should be terminated when the second imaging period terminates or at least before the end of the second imaging period. The potentials of the signal line 11A and the signal line 12A are controlled such that the timing of the imaging period is determined as described above.

In other words, the third imaging period is determined such that it includes the first imaging period and the second imaging period; thus, three-dimensional imaging can be performed while two-dimensional imaging is performed.

Note that, in one embodiment of the present invention, the first reflected light detection period corresponds to a period in which the first irradiation period overlaps with the first reflection period. The first reflected light detection period is the first net imaging period. The second reflected light detection period corresponds to a period in the second reflection period which starts after the end of the second irradiation period. The second reflected light detection period is the second net imaging period. The first detection signal dependent on the time difference between the arrival times of light is obtained through the first reflected light detection. The second detection signal dependent on the time difference between the arrival times of light is obtained through the second reflected light detection. Thus, the distance from the semiconductor device to the object can be measured (three-dimensional imaging).

The third reflected light detection period includes the first imaging period and the second imaging period. By obtaining the third detection signal through the third reflected light detection, the lightness and color of the object can be obtained (two-dimensional imaging).

The above description shows that the photosensor can be composed of fewer elements, and a semiconductor device including the photosensor, which operates with an improved driving method, can perform three-dimensional imaging using the TOF method while performing two-dimensional imaging and serve as a semiconductor device obtaining two-dimensional information and three-dimensional information concurrently. Therefore, a problem of an increased number of the elements for the photosensor which occurs with the TOF method can be solved and a semiconductor device advantageous in reducing pixel size can be achieved.

This embodiment can be implemented in combination with any of the other embodiments in this specification as appropriate.

Embodiment 6

Figure 13A:
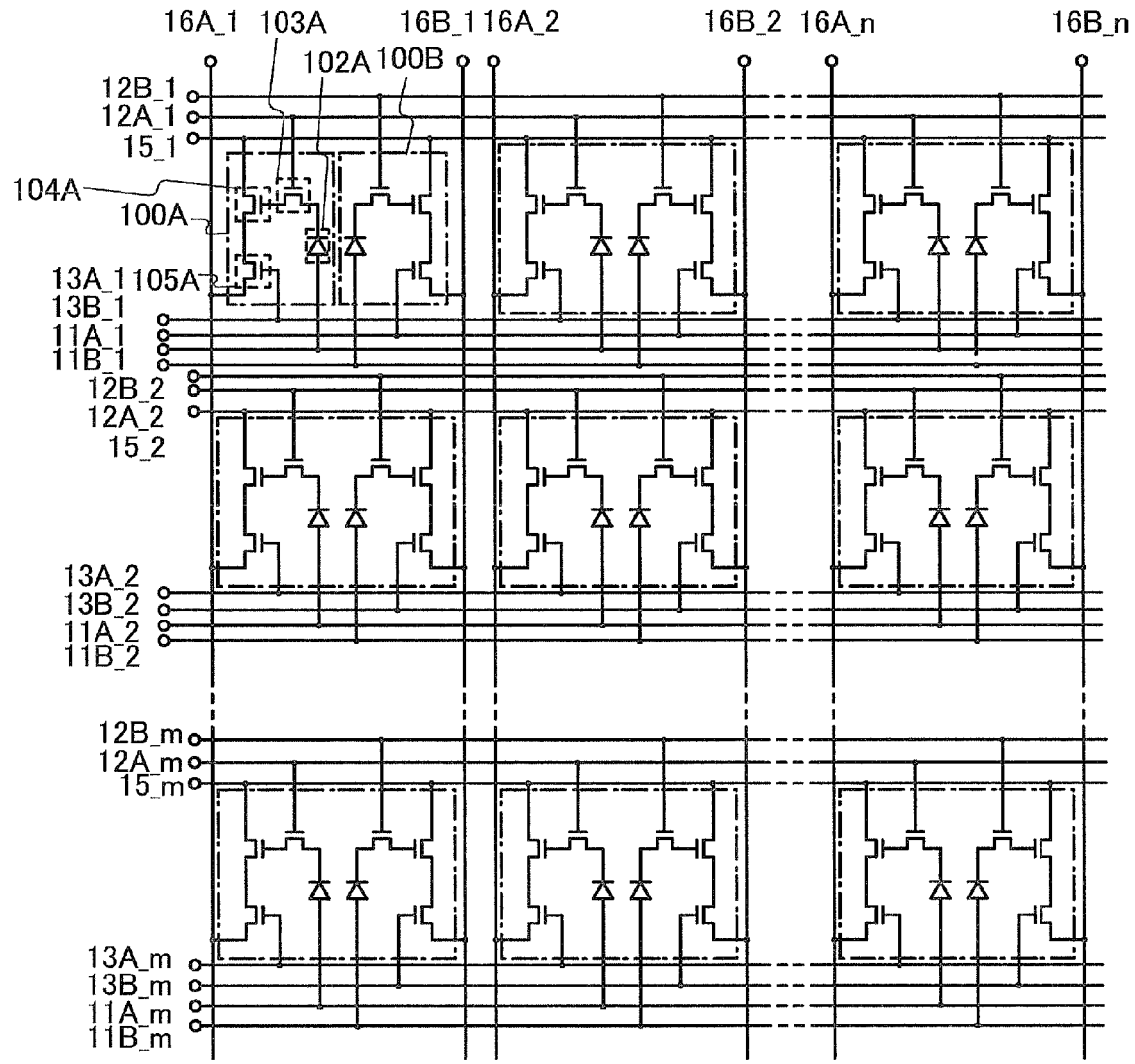
FIGS. 13A and 13B are circuit diagrams of a plurality of photosensors arranged in a matrix.
Figure 13B:
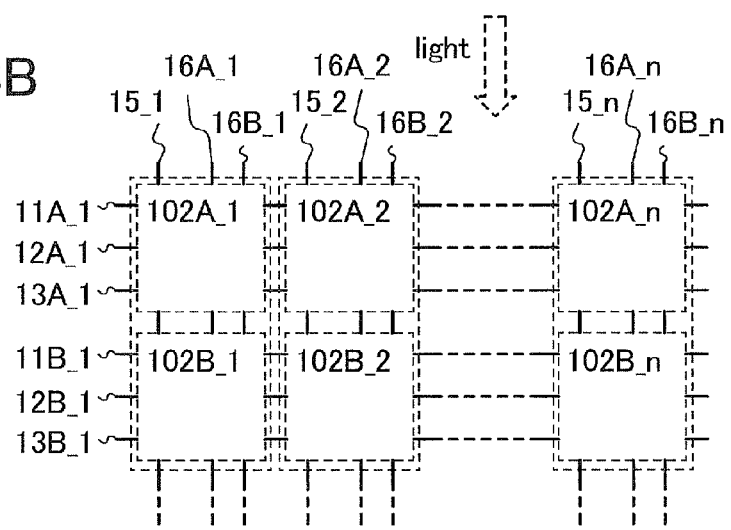
Figure 14:
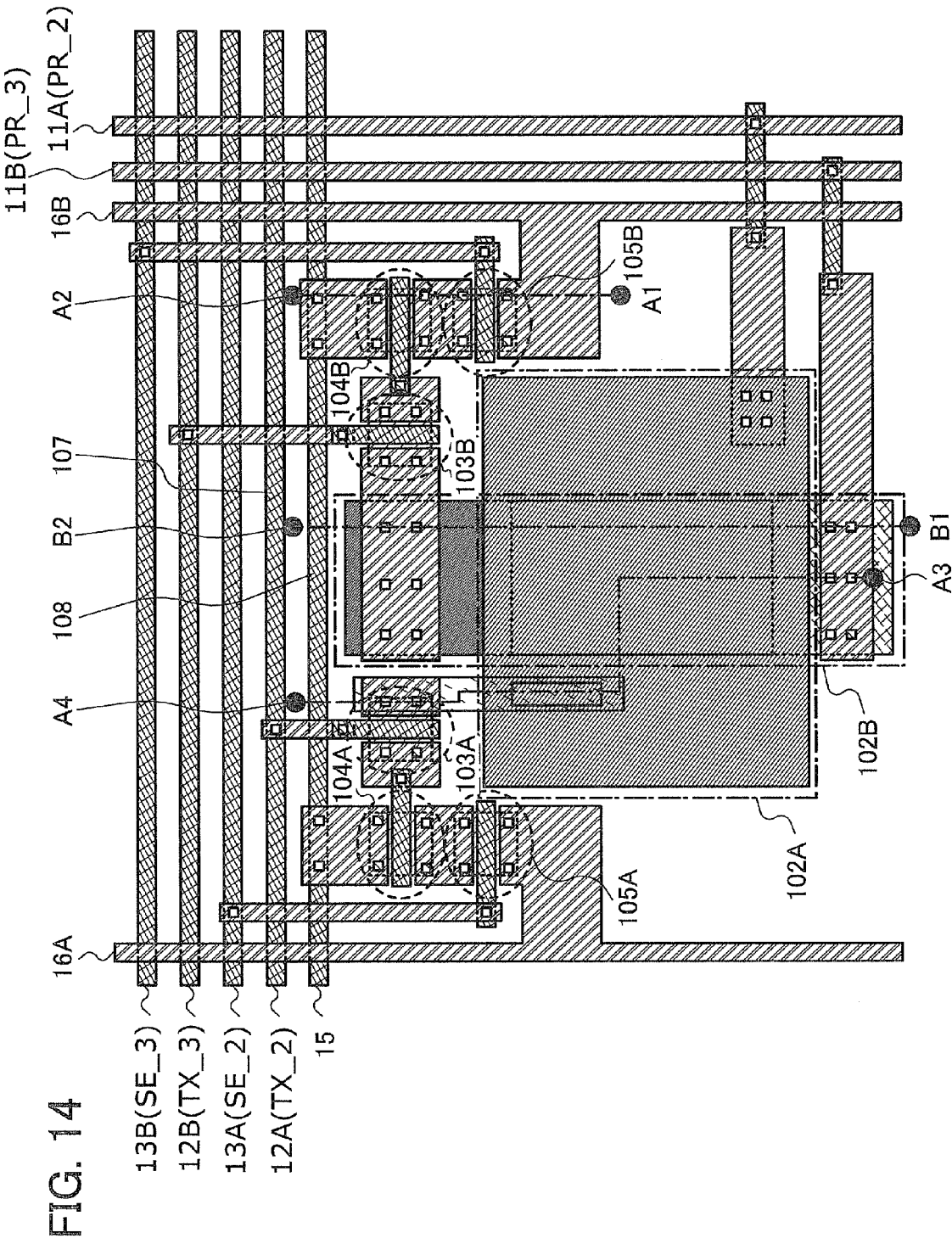
FIG. 14 is a top view of the photosensor.

This embodiment describes, with reference to FIGS. 13A and 13B, an example of a configuration in which a plurality of photosensors having the configurations described in Embodiment 5 is arranged in a matrix in a semiconductor device. A top view of the photosensors in FIGS. 13A and 13B is illustrated in FIG. 14. Refer to Embodiment 5 for the configurations of the photosensors and the driving method.

In FIG. 13A, a plurality of photosensors 100 is arranged in a matrix of m rows (m is a natural number of 2 or more) and n columns (n is a natural number of 2 or more). As an example, the photosensors 100 in each row are electrically connected to a corresponding one of a plurality of signal lines 11A (reset signal lines denoted by 11A_1 to 11A_m), a corresponding one of a plurality of signal lines 12A (charge storage signal lines denoted by 12A_1 to 12A_m), a corresponding one of a plurality of signal lines 13A (selection signal lines denoted by 13A_1 to 13A_m), a corresponding one of a plurality of signal lines 11B (reset signal lines denoted by 11B_1 to 11B_m), a corresponding one of a plurality of signal lines 12B (charge storage signal lines denoted by 12B_1 to 12B_m), a corresponding one of a plurality of signal lines 13B (selection signal lines denoted by 13B_1 to 13B_m), and a corresponding one of a plurality of signal lines 15 (photosensor reference signal lines denoted by 15_1 to 15_n). As an example, the photosensors 100 in each column are electrically connected to a corresponding one of a plurality of signal lines 16A (photosensor output signal lines denoted by 16A_1 to 16A_n), and a corresponding one of a plurality of signal lines 16B (photosensor output signal lines denoted by 16B_1 to 16B_n).

In FIGS. 13A and 13B, the photosensors 100 in each row share a signal line 11A (reset signal line), a signal line 12A (charge storage signal line), a signal line 13A (selection signal line), a signal line 11B (reset signal line), a signal line 12B (charge storage signal line), a signal line 13B (selection signal line), and a signal line 15 (photosensor reference signal line). Further, the photosensors 100 in each row share a signal line 16B (photosensor output signal line) and a signal line 16A (photosensor output signal line). Note that the connections to the signal lines are not limited to the above example.

FIGS. 13A and 13B show a configuration where the photosensors 100 in each row share the signal line 15 (photosensor reference signal line); however, the present invention is not limited to this structure. The signal line 15 (photosensor reference signal line) can be shared by the photosensors 100 in each column.

FIG. 13B shows arrangement of the first photodiodes 102A (102A_1 to 102A_n) in the first photosensors 100A and the second photodiodes 102B (102B_1 to 102B_n) in the second photosensors 100B. Here, light reflected off an object enters the first photodiodes 102A (102A_1 to 102A_n) before entering the second photodiodes 102B (102B_1 to 102B_n). Therefore, light reflected off the object includes visible light that is reflected off the object irradiated with external light, and then enters the first photodiodes 102A; and infrared light that is reflected off the object irradiated with light from a light source, and then enters the second photodiodes 102B.

Further, amorphous silicon used for semiconductor layers in the first photodiodes 102A serving as visible light sensors absorb visible light which enters from the outside and transmit infrared light which enters from the outside. Thus, the first photodiodes 102A (102A_1 to 102A_n) can absorb mainly visible light, and the second photodiodes 102B (102B_1 to 102B_n) can absorb mainly infrared light. Further, entry of visible light into the second photodiodes 102B serving as infrared light sensors can be reduced. Therefore, the first photosensors 100A can be used for two-dimensional imaging using visible light, and the second photosensors 100B can be used for three-dimensional imaging using infrared light, which reduces the area of the photosensors.

As described above, with the configuration according to this embodiment, the first photosensor 100A serving as a visible light sensor and the second photosensor 100B serving as an infrared light sensor are provided so as to overlap with each other, so that the area of the semiconductor device which is occupied by the first photosensors 100A and the second photosensors 100B can be reduced. As a result, pixel size can be reduced and two-dimensional imaging and three-dimensional imaging using the TOF method can be performed concurrently.

This embodiment can be implemented in combination with any of the other embodiments in this specification as appropriate.

Embodiment 7

This embodiment describes a method for driving a semiconductor device that enables accurate detection of the position of a fast-moving object by the TOF method.

Specifically, adjacent photosensors detect light reflected off substantially the same point of an object. One photosensor performs a first imaging to detect light reflected off an object during a period which starts after the initiation of light irradiation of the object and in which an irradiation period and a reflection period overlap with each other. The other photosensor performs a second imaging to detect light reflected off the object during a period in the reflection period which starts after the end of light irradiation of the object and which does not overlap with the irradiation period. The first imaging and the second imaging can be sequentially performed; thus, time difference is prevented during a period between the termination of the first imaging and the initiation of the second imaging. With this method, detection accuracy can be improved even when the object is a moving body.

Figure 15:
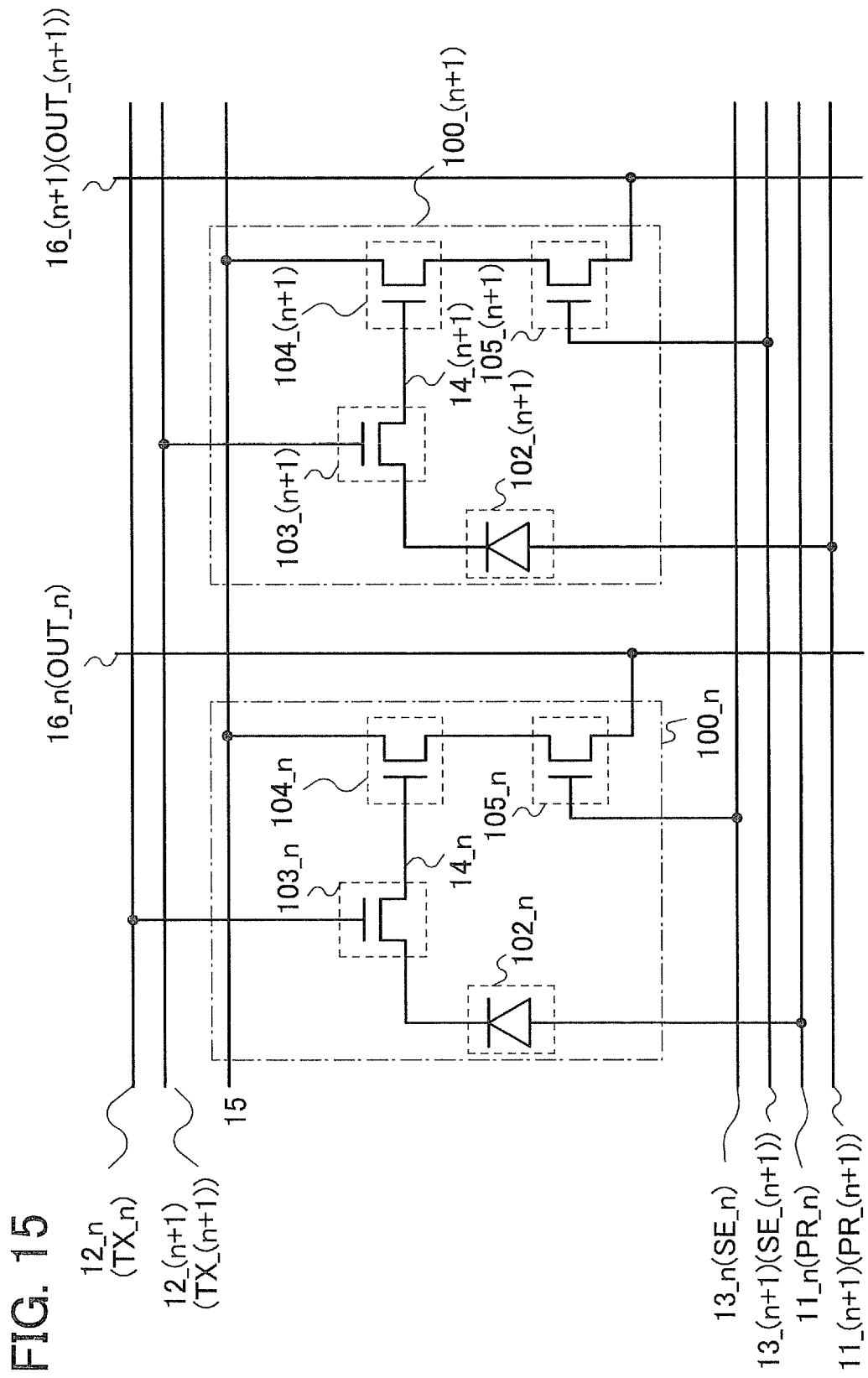
FIG. 15 is a diagram of photosensors.

The configuration of the photosensors in this embodiment is the same as that of the photosensor described in Embodiment 1 with reference to FIG. 1. Therefore, its detailed description is omitted (see Embodiment 1 for its detail). Each photosensor includes three transistors and one photodiode. FIG. 15 is an example of a circuit diagram illustrating the configurations of a photosensor 100_$n$ and a photosensor 100_($n$+1) included in a semiconductor device. A description is given of the case where the photosensor 100_$n$ and the photosensor 100_($n$+1) have the same configuration; however, they may have different configurations.

As shown in FIG. 15, the photosensor 100_$n$ and the photosensor 100_($n$+1) are arranged adjacent to each other. The photosensor 100_$n$ includes three transistors and one photodiode. Similarly, the photosensor 100_($n$+1) includes three transistors and one photodiode.

As shown in FIG. 15, the photosensor 100_$n$ includes a photodiode 102_$n$, a transistor 103_$n$, a transistor 104_$n$, and a transistor 105_$n$. The photosensor 100_($n$+1) includes a photodiode 102_($n$+1), a transistor 103_($n$+1), a transistor 104_($n$+1), and a transistor 105_($n$+1).

Note that in this embodiment, the object is irradiated with light from a light source only once. Therefore, reflected light from the object entering the photosensors refers to reflected light produced by one irradiation.

Here, light reflected off substantially the same point of the object is assumed to enter the photosensor 100_$n$ and the photosensor 100_($n$+1) adjacent to each other.

In other words, reflected light entering the photodiode 102_$n$ and reflected light entering the photodiode 102_($n$+1) are assumed to be light from the light source which enter the object and then are reflected off substantially the same point of the object.

In FIG. 15, a signal line 11_$n$ is a reset signal line (PR_n). A signal line 12_$n$ is a charge storage signal line (TX_n). A signal line 13_$n$ is a selection signal line (SE_n). A signal line 16_$n$ is a photosensor output signal line (OUT_n).

In FIG. 15, a signal line 11_($n$+1) is a reset signal line (PR_(n+1)). A signal line 12_($n$+1) is a charge storage signal line (TX_(n+1)). A signal line 13_($n$+1) is a selection signal line (SE_(n+1)). A signal line 16_($n$+1) is a photosensor output signal line (OUT_(n+1)). A signal line 15 is a photosensor reference signal line that can be shared by the photosensor 100_$n$ and the photosensor 100_($n$+1).

As illustrated in FIG. 15, in the photosensor 100_$n$, one electrode of the photodiode 102_$n$ is electrically connected to the signal line 11_$n$. The other electrode of the photodiode 102_$n$ is electrically connected to one of a source electrode and a drain electrode of the transistor 103_$n$. The other of the source electrode and the drain electrode of the transistor 103_$n$ is electrically connected to a gate electrode of the transistor 104_$n$ and the node 14_$n$. One of a source electrode and a drain electrode of the transistor 104_$n$ is electrically connected to the signal line 15. One of a source electrode and a drain electrode of the transistor 105_$n$ is electrically connected to the signal line 16_$n$. The other of the source electrode and the drain electrode of the transistor 104_$n$ is electrically connected to the other of the source electrode and the drain electrode of the transistor 105_$n$. A gate electrode of the transistor 103_$n$ is electrically connected to the signal line 12_$n$. A gate electrode of the transistor 105_$n$ is electrically connected to the signal line 13_$n$.

As illustrated in FIG. 15, in the photosensor 100_($n$+1), one electrode of the photodiode 102_($n$+1) is electrically connected to the signal line 11_($n$+1). The other electrode of the photodiode 102_($n$+1) is electrically connected to one of a source electrode or a drain electrode of the transistor 103_($n$+1). The other of the source electrode and the drain electrode transistor 103_($n$+1) is electrically connected to a gate electrode of the transistor 104_($n$+1) and the node 14_($n$+1). One of a source electrode and a drain electrode of the transistor 104_($n$+1) is electrically connected to the signal line 15. One of a source electrode and a drain electrode of the transistor 105_($n$+1) is electrically connected to the signal line 16_($n$+1). The other of the source electrode and the drain electrode of the transistor 104_($n$+1) is electrically connected to the other of the source electrode and the drain electrode of the transistor 105_($n$+1). A gate electrode of the transistor 103_($n$+1) is electrically connected to the signal line 12_($n$+1). A gate electrode of the transistor 105_($n$+1) is electrically connected to the signal line 13_($n$+1).

FIG. 15 illustrates a configuration where an anode of the photodiode 102_$n$ is electrically connected to the signal line 11_$n$ and a cathode of the photodiode 102_$n$ is electrically connected to one of the source electrode and the drain electrode of the transistor 103_$n$; however, the present invention is not limited to this. The cathode of the photodiode 102_$n$ may be electrically connected to the signal line 11_$n$, and the anode of the photodiode 102_$n$ may be electrically connected to one of the source electrode and the drain electrode of the transistor 103_$n$.

Similarly, FIG. 15 illustrates a configuration where an anode of the photodiode 102_($n$+1) is electrically connected to the first signal line 11_($n$+1) and a cathode of the photodiode 102_($n$+1) is electrically connected to one of the source electrode and the drain electrode of the transistor 103_($n$+1); however, the present invention is not limited to this. The cathode of the photodiode 102_($n$+1) may be electrically connected to the first signal line 11_($n$+1), and the anode of the photodiode 102_($n$+1) may be electrically connected to one of the source electrode and the drain electrode of the transistor 103_($n$+1).

Photosensors (e.g., the photosensor 100_$n$ and the photosensor 100_($n$+1)) are arranged adjacent to each other, so that light reflected off substantially the same point of the object can be detected by two adjacent photosensors. One of the adjacent photosensors detects light reflected before the end of light irradiation, and the other detects light reflected after the end of light irradiation. Therefore, accuracy of position detection is high even when the object is a moving body.

Next, a method for driving a semiconductor device including the photosensor 100 is described. With the driving method, the distance from the semiconductor device to an object can be measured by three-dimensional imaging using the TOF method. Even when the object is a fast-moving body, accuracy of position detection does not decrease dramatically.

The driving method is described in detail with reference to timing charts of FIG. 16 and FIG. 17. First, a description is given with reference to FIG. 16 of the operation of the photosensors. Next, a description is given with reference to FIG. 17 of the features of the driving method and a distance measuring method achieved by three-dimensional imaging using the TOF method.

Figure 16:
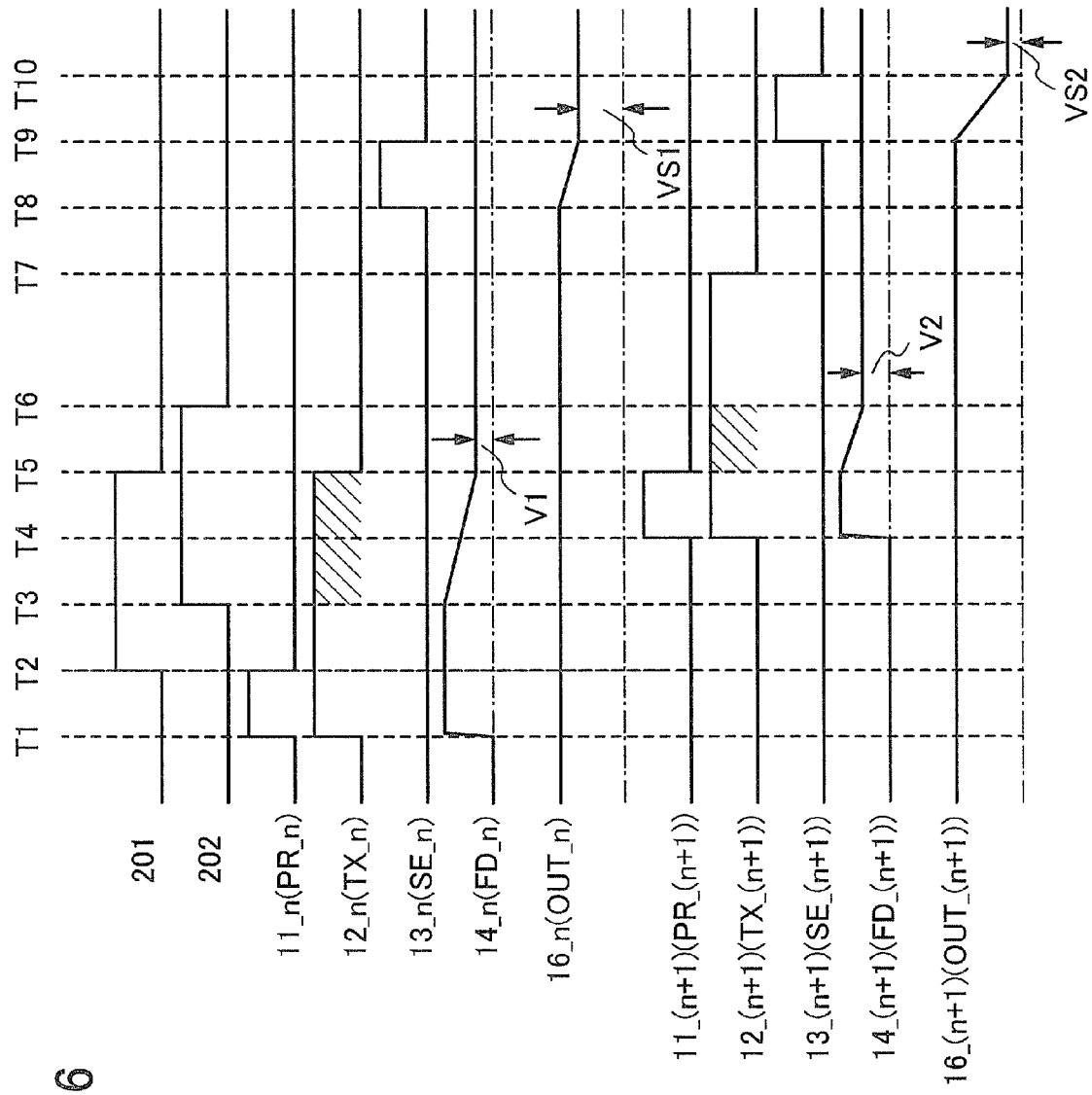
FIG. 16 is a chart illustrating pulses for the photosensors.

FIG. 16 is a timing chart of the signal line 11_$n$, the signal line 12_$n$, the signal line 13_$n$, the signal line 14_$n$, and the signal line 16_$n$ for the photosensor 100_$n$, and the signal line 11_(n+1), the signal line 12_(n+1), the signal line 13_(n+1), the signal line 14_(n+1), and the signal line 16_(n+1) for the photosensor 100_(n+1). Three-dimensional imaging is performed during a period from the time T1 to the time T10.

Figure 17:
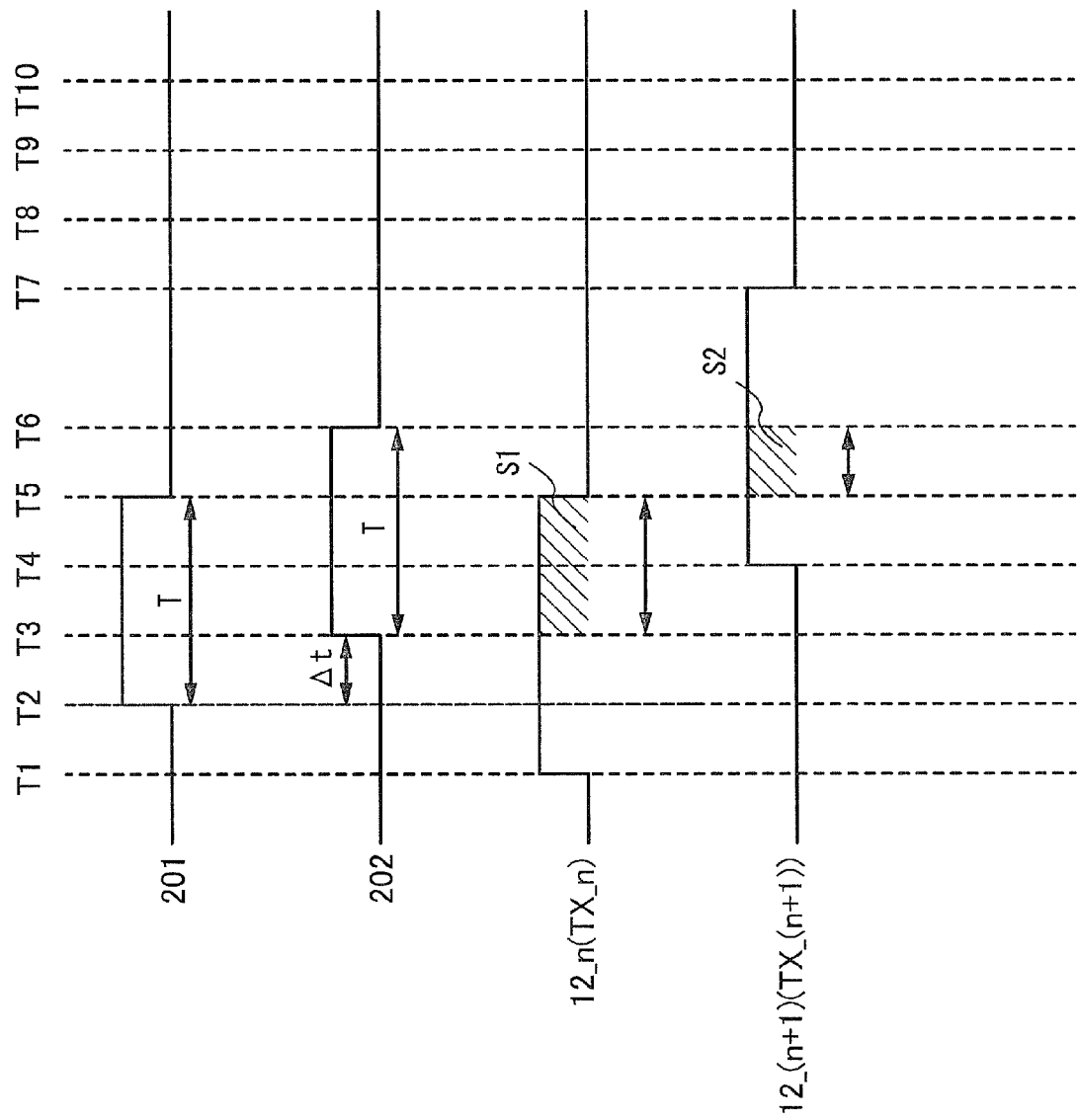
FIG. 17 is a chart illustrating pulses for the photosensors.

In the timing charts of FIG. 16 and FIG. 17, the high level of the pulse 201 and the pulse 202 represents "irradiation", while the low level thereof represents "non-irradiation". The high level of the other pulses represents a high potential, while the low level thereof represents a low potential.

In three-dimensional imaging according to one embodiment of the present invention, the object is irradiated with light from the light source once. During light irradiation, the distance between the light source and the object may change. In other words, the object may be a moving body. The moving body may move fast.

The time from the time T2 to the time T3 refers to time difference between the time at which light emitted from the light source, called "irradiation light", arrives at the object and the time at which light reflected off the object, called "reflected light", arrives at the semiconductor device.

At the time T1, the signal line 11_n is brought high. Further, the signal line 12_n is brought high (a first reset). At this time, electrical continuity between the photodiode 102_n and the transistor 103_n is established and the node 14_n goes high.

At the time T2, the object starts to be irradiated with light from the light source. The pulse 201 goes from low (non-irradiation) to high (irradiation). The time T2 is a light irradiation start time. Further, the signal line 11_n is brought low, and the signal line 12_n is held high.

At the time T3, irradiation light emitted from the light source is reflected off the object, and reflected light starts to enter the semiconductor device. The pulse 202 goes from low (non-irradiation) to high (irradiation). The time T3 is a reflection start time. The time T3 is also a first reflected light detection start time. Detection of reflected light can be started at the time T3. The potential of the node 14_n starts to decrease from high.

At the time T4, the signal line 12_n is held high. The potential of the node 14_n keeps decreasing. Further, at the time T4, the signal line 11_(n+1) and the signal line 12_(n+1) are brought high (a second reset). At this time, electrical continuity between the photodiode 102_(n+1) and the transistor 103_(n+1) is established and the node 14_(n+1) goes high.

At the time T5, irradiation of the object with light from the light source terminates. The pulse 201 goes from high (irradiation) to low (non-irradiation). The time T5 is an irradiation end time. The signal line 12_n is brought low. The time T5 is also a first reflected light detection end time.

When the signal line 12_n is brought low, parasitic capacitance between the signal line 12_n and the node 14_n causes a change in the potential of the node 14_n. A significant change in the potential inhibits accurate obtainment of photocurrent generated by the photodiode 102_n during the first and second imaging. Therefore, effective methods of reducing the influence of parasitic capacitance are, for example, to reduce the gate-source capacitance of the transistor 103_n or the gate-drain capacitance of the transistor 103_n and to connect a storage capacitor to the node 14_n. The photosensor 100_n according to one embodiment of the present invention employs these methods, making a change in the potential of the node 14_n due to parasitic capacitance negligible.

Note that the same method is employed in the case of the photosensor 100_(n+1) according to one embodiment of the present invention.

As described above, the potentials of the signal line 11_n and the signal line 12_n are controlled such that the first imaging starts when the light irradiation starts and the first imaging terminates when the light irradiation terminates.

The potential of the node 14_n becomes constant after the time T5. The potential of the node 14_n at the time T5 (V1) is dependent on photocurrent generated by the photodiode 102_n during the first reflected light detection. This means that the potential of the node 14_n is determined by the intensity of reflected light and the like.

The first detection signal is determined by the potential of the node 14_n at the time T5 (V1). As the length of the first reflected light detection period increases, the amount of change in the potential of the node 14_n increases, so that the potential of the node 14_n at the time T5 (V1) is low.

Note that from the time T1 to the time T10, all of the light entering the photodiode 102_n refers to reflected light, i.e., light reflected off an object irradiated with light from the light source.

Note that from the time T1 to the time T10, all of the light entering the photodiode 102_(n+1) also refers to reflected light, i.e., light reflected off an object irradiated with light from the light source.

At the time T5, the signal line 11_(n+1) is brought low, and the signal line 12_(n+1) is held high. The time T5 is also a second reflected light detection start time. Detection of reflected light can be started at the time T5.

From the time T5 to the time T6 (during the second reflected light detection period), the potential of the node 14_(n+1) changes according to the intensity of reflected light entering the photodiode 102_(n+1) during the second reflected light detection period. The potential of the node 14_(n+1) starts to decrease from high owing to the off-state current of the photodiode 102_(n+1). The off-state current is proportional to irradiation time and the intensity of reflected light entering the photodiode 102_(n+1). Therefore, the potential of the node 14_(n+1) changes according to the intensity of the reflected light and the length of the reflected light detection period.

Note that this embodiment shows, as an example, the case where the second reflected light detection period (from the time T5 to the time T6) is shorter than the first reflected light detection period (from the time T3 to the time T5). Therefore, the amount of change in the potential of the node 14 during the second imaging is smaller than that of change in the potential of the node 14 during the first imaging.

At the time T6, entrance of reflected light reflected off the object to the semiconductor device terminates. The pulse 202 goes from high (irradiation) to low (non-irradiation). The time T6 is a reflection end time. The time T6 is also a second reflected light detection end time. On the other hand, the signal line 12_(n+1) is held high.

The potential of the node 14_(n+1) becomes constant after the time T6. The potential of the node 14_(n+1) at the time T6 (V2) is dependent on photocurrent generated by the photodiode 102_(n+1) during the second reflected light detection. This means that the potential of the node 14_(n+1) is determined by light intensity and the like.

The second detection signal is determined by the potential of the node 14_(n+1) at the time T6 (V2). As the length of the second reflected light detection period increases, the amount of change in the potential of the node 14_(n+1) decreases, so that the potential of the node 14_(n+1) at the time T6 (V2) is low.

At the time T7, the signal line 12_(n+1) is brought low.

As described above, the potentials of the signal line 11_(n+1) and the signal line 12_(n+1) are controlled such that the second imaging starts when the light irradiation terminates and the second imaging terminates when detection of reflected light resulting from the light irradiation terminates.

At the time T8, the signal line 13_*n* is brought high (a first read starts). At this time, the transistor 105_*n* conducts. Moreover, electrical continuity between the signal line 15_*n* and the signal line 16_*n* is established through the transistor 104_*n* and the transistor 105_*n*. Then, the potential of the signal line 16_*n* decreases. Note that the signal line 16_*n* is precharged high before the time T8.

There is no limitation on the configuration of a read circuit with which the signal line 16_*n* is precharged. The read circuit can be composed of one p-channel transistor 106, like the read circuit 101 illustrated in FIG. 4.

At the time T9, the signal line 13_*n* is brought low (the first read terminates). Then, the transistor 105_*n* is turned off, and the potential of the signal line 16_*n* becomes constant. The potential of the signal line 16_*n* at the time T9 ($V_{S1}$) is dependent on the speed at which the potential of the signal line 16_*n* changes during a period from the time T8 to the time T9.

For this reason, by obtaining the potential of the signal line 16_*n* at the time T9 ($V_{S1}$) by the first reflected light detection, the amount of light entering the photodiode 102_*n* (reflected light) during the first imaging period (the product of time and the intensity of such light) can be detected; thus, a detection signal S1 is produced. Assuming that the light intensity during the light irradiation is fixed and only the first reflected light enters the photodiode 102_*n*, the potential of the signal line 16_*n* ($V_{S1}$) is substantially proportional to the length of the first reflected light detection period.

At the time T9, the signal line 13_(*n*+1) is brought high (a second read starts). At this time, the transistor 105_(*n*+1) conducts. Moreover, electrical continuity between the signal line 15_(*n*+1) and the signal line 16_(*n*+1) is established through the transistor 104_(*n*+1) and the transistor 105_(*n*+1). Then, the potential of the signal line 16_(*n*+1) starts to decrease. Note that the signal line 16_(*n*+1) is precharged high before the time T9.

At the time T10, the signal line 13_(*n*+1) is brought low (the first read terminates). Then, the transistor 105_(*n*+1) is turned off, and the potential of the signal line 16_(*n*+1) becomes constant. The potential of the signal line 16_(*n*+1) at the time T10 ($V_{S2}$) is dependent on the speed at which the potential of the signal line 16_(*n*+1) changes during a period from the time T9 to the time T10.

If the light intensity is fixed, as the length of the reflected light detection period decreases, the speed at which the potential of the signal line 16_(*n*+1) changes increases. As the speed at which the potential of the signal line 16_(*n*+1) increases, the potential of the signal line 16_(*n*+1) at the time T10 ($V_{S2}$) decreases.

For this reason, by obtaining the potential of the signal line 16_(*n*+1) at the time T10 ($V_{S2}$) by the second reflected light detection, the amount of light entering the photodiode 102_(*n*+1) (reflected light) during the second imaging period (the product of time and the intensity of such light) can be detected; thus, a detection signal S2 is produced. Assuming that the light intensity during the light irradiation is fixed and only the second reflected light enters the photodiode 102_(*n*+1), the potential of the signal line 16_(*n*+1) ($V_{S2}$) is substantially proportional to the length of the second reflected light detection period.

Note that in this embodiment, the second reflected light detection period (from the time T5 to the time T6) is shorter than the first reflected light detection period (from the time T3 to the time T5), so that the potential of the signal line 16_(*n*+1) at the time T10 ($V_{S2}$) is lower than the potential of the signal line 16_*n* at the time T9 ($V_{S1}$).

At the time T10, the detection signal S1 and the detection signal S2 can be obtained by the first imaging and the second imaging, respectively, which enables three-dimensional imaging using the TOF method.

As described above, the first reflected light detection period is a period in which light reflected off the object during light irradiation is detected, and the second reflected light detection period is a period in which light reflected off the object after the end of light irradiation is detected. In other words, light reflected off substantially the same point of the object can be detected without interruption by utilizing adjacent photosensors.

FIG. 17 is a timing chart of the pulse 201, the pulse 202, the pulse of the signal line 12_*n*, the pulse of the signal line 12_(*n*+1) for the photosensor 100_*n* and the photosensor 100_(*n*+1). A description is given of the features of the driving method with reference to FIG. 17. Detection of reflected light is divided into two periods: the first reflected light detection period and the second reflected light detection period. The main feature of the driving method according to one embodiment of the present invention is to optimize, utilizing the photosensor 100_*n* and the photosensor 100_(*n*+1) adjacent to each other, the timing of the imaging period by controlling the potentials of the signal line 11_*n*, the signal line 12_*n*, the signal line 11_(*n*+1), and the signal line 12_(*n*+1) such that the first imaging and the second imaging are sequentially performed.

A description is given with comparison among the pulses in FIG. 17 by dividing the time into the following periods: irradiation periods, reflection periods, imaging periods, and reflected light detection periods.

As the pulse 201 shows, the time T2 is an irradiation start time, the time T5 is an irradiation end time, and a period from the time T2 to the time T5 is an irradiation period. As the pulse 202 shows, the time T3 is a reflection start time, the time T6 is a reflection end time, and a period from the time T3 to the time T6 is a reflection period. The reflection period and the irradiation period are of the same length of time.

As the pulse of the signal line 12_*n* (TX_n) shows, the time T3 is the first imaging start time, the time T5 is the first imaging end time, and a period from the time T3 to the time T5 is the first imaging period. The time T3 is the first reflected light detection start time, the time T5 is the first reflected light detection end time, and a period from the time T3 to the time T5 is the first reflected light detection period.

The first imaging should be started at least when the reflection period starts or before the initiation of the reflection period. Moreover, the first imaging should be terminated when the irradiation period terminates. The potentials of the signal line 11_*n* and the signal line 12_*n* are controlled such that the timing of the imaging period is determined as described above.

As the pulse of the signal line 12_(*n*+1) (TX_(*n*+1)) shows, the time T5 is the second imaging start time, the time T6 is the second imaging end time, and a period from the time T5 to the time T6 is the second imaging period. The time T5 is the second reflected light detection start time, the time T6 is the second reflected light detection end time, and a period from the time T5 to the time T6 is the second reflected light detection period.

The second imaging should be started when the irradiation period terminates. Moreover, the second imaging should be terminated at least at the same time as or after the end of the reflection period. The potentials of the signal line 11_(*n*+1)

and the signal line 12_(n+1) are controlled such that the timing of the imaging period is determined as described above.

In other words, a period in which reflected light entering the photosensor 100_n and the photosensor 100_(n+1) during the reflection period is detected is divided into two periods. Moreover, the first reflected light during the first imaging period is detected with the photosensor 100_n, and the second reflected light during the second imaging period is detected with the photosensor 100_(n+1). Thus, the imaging can be performed without interruption.

Note that the first reflected light detection period is within the first imaging period. The second reflected light detection period is within the second imaging period. The distance from the semiconductor device to the object can be measured by obtaining the first detection signal S1 that is obtained through the first reflected light detection and is dependent on the time difference between the arrival times of light and the second detection signal S2 that is obtained through the second reflected light detection and is dependent on the time difference between the arrival times of light.

Refer to Embodiment 1 for the details of the method for measuring the distance by three-dimensional imaging using the TOF method, which is described with reference to equations.

The above description shows that the photosensor can be composed of fewer elements, and a semiconductor device including the photosensor, which operates with an improved driving method, can perform three-dimensional imaging using the TOF method and serve as a distance measuring device. Therefore, a problem of an increased number of the elements for the photosensor which occurs with the TOF method can be solved and a semiconductor device advantageous in reducing pixel size can be achieved.

In addition, one of the adjacent photosensors detects light reflected before the end of irradiation of the object with light from the light source, and the other detects light reflected after the end of the irradiation. Therefore, even when the object is a moving body, the distance from the light source to the object (a moving body) can be measured without decreasing the accuracy of position detection.

This embodiment can be implemented in combination with any of the other embodiments in this specification as appropriate.

Embodiment 8

This embodiment describes more in detail the configurations of the photosensor 100_n and the photosensor 100_(n+1) adjacent to each other, which are described in Embodiment 7. A description is given of an example of the configuration of a semiconductor device including photosensors arranged in a matrix with m rows and k columns with reference to FIG. 18, and an example of its configuration different from that illustrated in FIG. 18 with reference to FIG. 19.

Figure 18:
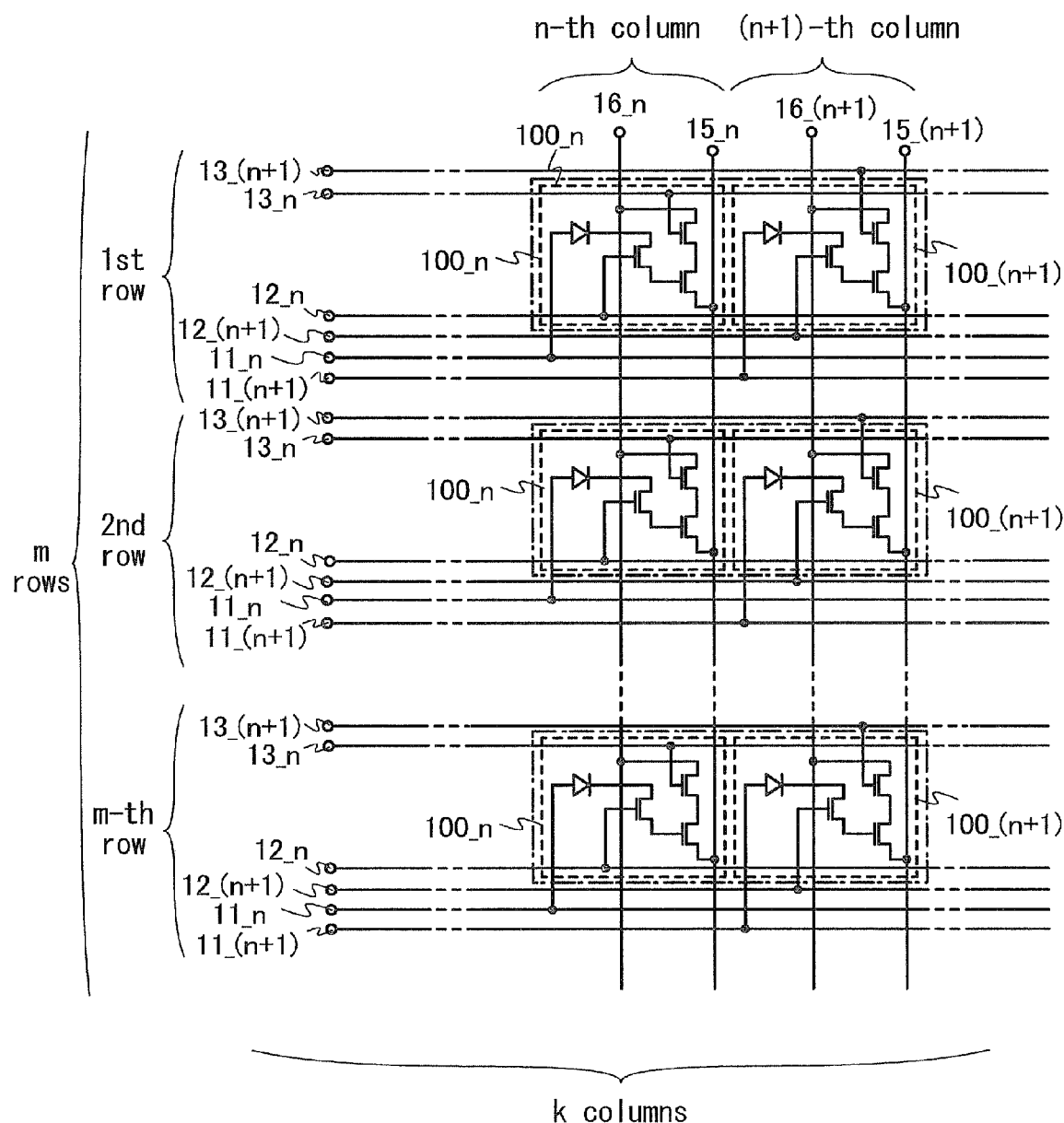
FIG. 18 is a circuit diagram of a plurality of photosensors arranged in a matrix.
Figure 19:
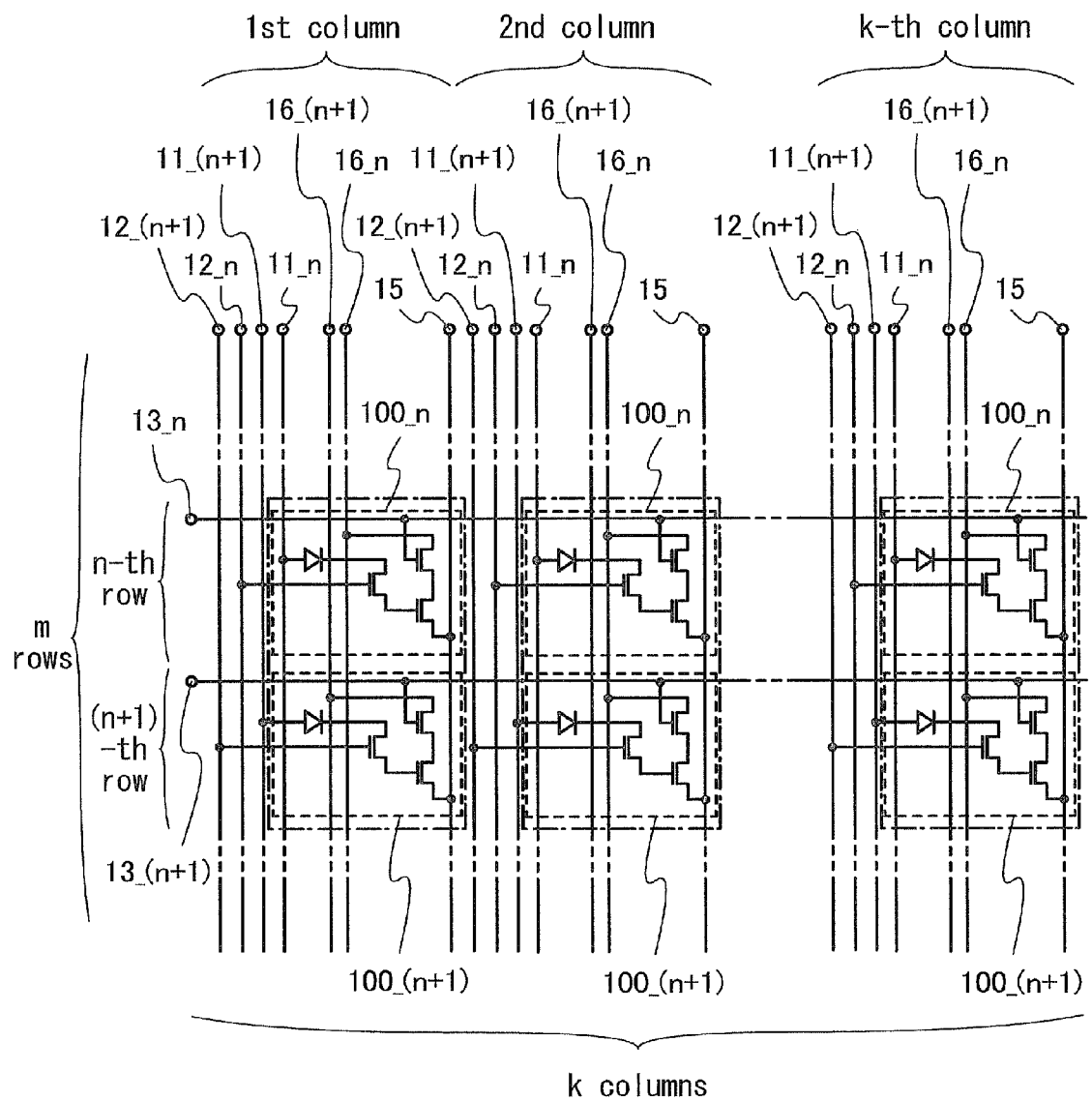
FIG. 19 is a circuit diagram of a plurality of photosensors arranged in a matrix.

FIG. 18 illustrates the case where the photosensor 100_n and the photosensor 100_(n+1) in adjacent columns detect reflected light from the same point of an object. FIG. 19 illustrates the case where the photosensor 100_n and the photosensor 100_(n+1) in adjacent rows detect reflected light from the same point of an object. Note that these structures produce the same effect; therefore, either of these structures can be used.

In FIG. 18, a plurality of photosensors is arranged in a matrix with m rows (m is a natural number of 2 or more) and k columns (k is a natural number of 2 or more). For example, the photosensor 100_n and the photosensor 100_(n+1) in the first row detect reflected light from the same point of an object. Similarly, the photosensor 100_n and the photosensor 100_(n+1) in the n-th row detect reflected light from the same point of an object.

Each of the photosensors 100_n in the n-th column (the photosensors 100_n in the first to m-th rows) is electrically connected to a corresponding one of a plurality of signal lines 11_n (the signal lines 11_n in the first to m-th rows), a corresponding one of a plurality of signal lines 12_n (the signal lines 12_n in the first to m-th rows), and a corresponding one of a plurality of signal lines 13_n (the signal lines 13_n in the first to m-th rows).

Each of the photosensors 100_(n+1) in the (n+1)-th column (the photosensors 100_(n+1) in the first to m-th rows) is electrically connected to a corresponding one of a plurality of signal lines 11_(n+1) (the signal lines 11_(n+1) in the first to m-th rows), a corresponding one of a plurality of signal lines 12_(n+1) (the signal lines 12_(n+1) in the first to m-th rows), and a corresponding one of a plurality of signal lines 13_(n+1) (the signal lines 13_(n+1) in the first to m-th rows).

The photosensors 100_n in the n-th column (the photosensors 100_n in the first to m-th rows) share a photosensor output signal line and a photosensor reference signal line. For example, the photosensor output signal line in the n-th column (denoted by 16_n) is electrically connected to the photosensors 100_n in the n-th column (the photosensors 100_n in the first to m-th rows). The photosensor reference signal line in the n-th column (denoted by 15_n) is electrically connected to the photosensors 100_n in the n-th column (the photosensors 100_n in the first to m-th rows).

The photosensors 100_(n+1) in the (n+1)-th column (the photosensors 100_(n+1) in the first to m-th rows) share a photosensor output signal line and a photosensor reference signal line. For example, the photosensor output signal line in the (n+1)-th column (denoted by 16_(n+1)) is electrically connected to the photosensors 100_(n+1) in the (n+1)-th column (the photosensors 100_(n+1) in the first to m-th rows). The photosensor reference signal line in the (n+1)-th column (denoted by 15_(n+1)) is electrically connected to the photosensors 100_(n+1) in the (n+1)-th column (the photosensors 100_(n+1) in the first to m-th rows).

In FIG. 18, the photosensors in the n-th column share the photosensor reference signal line 15_n. The photosensors in the (n+1)-th column share the photosensor reference signal line 15_(n+1). The photosensors in the n-th column share the photosensor output signal line 16_n. The photosensors in the (n+1)-th column share the photosensor output signal line 16_(n+1).

However, the invention is not limited to this. For example, a plurality of photosensor reference signal lines 15 may be provided in each column and electrically connected to different photosensors. A plurality of photosensor output signal lines 16 may be provided in each column and electrically connected to different photosensors.

Although FIG. 18 shows a configuration in which the photosensor reference signal line 15 and the photosensor output signal line 16 are shared by the photosensors in each column, the present invention is not limited to this. The photosensor reference signal line 15 and the photosensor output signal line 16 may be shared by the photosensors in each row.

As described above, wirings are shared between photosensors to reduce the number of wirings, so that a driver circuit for driving the photosensors arranged in a matrix with m rows and k columns can be simplified.

Next, a description is given with reference to FIG. 19 of an example of the configuration of a semiconductor device including photosensors arranged in a matrix with m rows and k columns, which is different from that in FIG. 18. In FIG. 19, a plurality of photosensors 100 is arranged in a matrix with m rows (m is a natural number of 2 or more) and k columns (k is a natural number of 2 or more). For example, the photosensor 100_n and the photosensor 100_(n+1) in the first column detect reflected light from the same point of an object. Similarly, the photosensor 100_n and the photosensor 100_(n+1) in the n-th column detect reflected light from the same point of an object.

Each of the photosensors 100_n in the n-th row (the photosensors 100_n in the first to k-th columns) is electrically connected to a corresponding one of a plurality of signal lines 11_n (the signal lines 11_n in the first to k-th columns), a corresponding one of a plurality of signal lines 12_n (the signal lines 12_n in the first to k-th columns), and a corresponding one of a plurality of photosensor output signal lines 16_n (the photosensor output signal lines 16_n in the first to k-th columns).

Each of the photosensors 100_(n+1) in the (n+1)-th row (the photosensors 100_(n+1) in the first to k-th columns) is electrically connected to a corresponding one of a plurality of signal lines 11_(n+1) (the signal lines 11_(n+1) in the first to k-th columns), a corresponding one of a plurality of signal lines 12_(n+1) (the signal lines 12_(n+1) in the first to k-th columns), and a corresponding one of a plurality of photosensor output signal lines 16_(n+1) (the photosensor output signal lines 16_(n+1) in the first to k-th columns).

The photosensors 100_n in the n-th row (the photosensors 100_n in the first to k-th columns) share a signal line 13_n. The photosensors 100_(n+1) in the (n+1)-th row (the photosensors 100_(n+1) in the first to k-th columns) share a signal line 13_(n+1). For example, the signal line 13_n in the n-th row is electrically connected to the photosensors 100_n in the n-th row (the photosensors 100_n in the first to k-th columns). The signal line 13_(n+1) in the (n+1)-th row is electrically connected to the photosensors 100_(n+1) in the (n+1)-th row (the photosensors 100_(n+1) in the first to k-th columns).

The photosensors in each column share a photosensor reference signal line 15. For example, as illustrated in FIG. 19, the photosensors in the first column share a photosensor reference signal line 15. The photosensors in the second column share a photosensor reference signal line 15. The photosensors in the k-th column share a photosensor reference signal line 15.

However, the invention is not limited to this. For example, a plurality of photosensor reference signal lines 15 may be provided in each column and electrically connected to different photosensors.

Although FIG. 19 shows a configuration in which the photosensor reference signal line 15 is shared by the photosensors in each column and the signal line 13 is shared by the photosensors in each row, the present invention is not limited to this. The photosensor reference signal line 15 may be shared by the photosensors in each row and the signal line 13 may be shared by the photosensors in each column.

As described above, wirings are shared between photosensors to reduce the number of wirings, so that a driver circuit for driving the photosensors arranged in a matrix with m rows and k columns can be simplified.

This embodiment can be implemented in combination with any of the other embodiments in this specification as appropriate.

This application is based on Japanese Patent Application serial no. 2011-179737 filed with Japan Patent Office on Aug. 19, 2011, Japanese Patent Application serial no. 2011-184370 filed with Japan Patent Office on Aug. 26, 2011, and Japanese Patent Application serial no. 2011-196463 filed with Japan Patent Office on Sep. 8, 2011 the entire contents of which are hereby incorporated by reference.

What is claimed is:

1. A method for driving a semiconductor device comprising a photosensor comprising a photodiode, comprising the steps of:
   performing a first reset operation by supplying a first signal to a first terminal of the photodiode from a first time to a second time;
   performing a first irradiation of an object with first light from a light source from the second time to a fourth time;
   performing a first imaging by detecting the first light reflected off the object from the second time to the fourth time;
   performing a second irradiation of the object with second light from the light source from an eighth time to an eleventh time;
   performing a second reset operation by supplying the first signal to the first terminal of the photodiode from a tenth time to the eleventh time; and
   performing a second imaging by detecting the second light reflected off the object from the eleventh time to a thirteenth time,
   wherein a time length from the second time to the fourth time and a time length from the eighth time to the eleventh time are the same.

2. The method for driving the semiconductor device according to claim 1, further comprising the steps of:
   obtaining a first detection signal by the first imaging;
   obtaining a second detection signal by the second imaging; and
   obtaining a distance from the light source to the object with the first detection signal and the second detection signal.

3. The method for driving the semiconductor device according to claim 2, further comprising the step of:
   obtaining the distance x from the light source to the object by using the following equation:

$$x = \frac{(c \times T \times S2)}{2 \times (S1 + S2)},$$

wherein S1 is the first detection signal, S2 is the second detection signal, T is the time length from the second time to the fourth time and c is a speed of light.

4. The method for driving the semiconductor device according to claim 1,
   wherein the first light reflected off the object enters the photodiode from a third time to a fifth time,
   wherein the second light reflected off the object enters the photodiode from a ninth time to a twelfth time, and
   wherein a time length from the second time to the third time, a time length from the fourth time to the fifth time, a time length from the eighth time to the ninth time, and a time length from the eleventh time to the twelfth time are the same.

5. The method for driving the semiconductor device according to claim 4,
   wherein the photosensor comprises a first transistor and a second transistor,
   wherein a first terminal of the first transistor is electrically connected to a second terminal of the photodiode,
   wherein a second terminal of the first transistor is electrically connected to a gate of the second transistor, and
   wherein the method comprises the steps of:
   performing the first imaging by supplying a second signal to a gate of the first transistor from the second time to the fourth time; and performing the second imaging by supplying the second signal to the gate of the first transistor from the eleventh time to the thirteenth time.

6. The method for driving the semiconductor device according to claim 5,
wherein the first transistor comprises an oxide semiconductor layer comprising a channel formation region.

7. A method for driving a semiconductor device comprising a first photosensor and a second photosensor adjacent to each other, the first photosensor comprising a first photodiode, the second photosensor comprising a second photodiode, comprising the steps of:
performing a first reset operation for the first photosensor by supplying a first signal to a first terminal of the first photodiode from a first time to a second time;
performing a first irradiation of an object with first light from a light source from the second time to a fifth time;
performing a first imaging for the first photosensor by detecting the first light reflected off the object from the second time to the fifth time;
performing a second reset operation for the second photosensor by supplying the first signal to a first terminal of the second photodiode from a fourth time to the fifth time; and
performing a second imaging for the second photosensor by detecting the first light reflected off the object from the fifth time to a seventh time.

8. The method for driving the semiconductor device according to claim 7, further comprising the steps of:
obtaining a first detection signal by the first imaging;
obtaining a second detection signal by the second imaging; and
obtaining a distance from the light source to the object with the first detection signal and the second detection signal.

9. The method for driving the semiconductor device according to claim 8, further comprising the step of:
obtaining the distance x from the light source to the object by using the following equation:

$$x = \frac{(c \times T \times S2)}{2 \times (S1 + S2)},$$

wherein S1 is the first detection signal, S2 is the second detection signal, T is the time length from the second time to the fifth time and c is a speed of light.

10. The method for driving the semiconductor device according to claim 7,
wherein the first light reflected off the object enters the first photodiode and the second photodiode from a third time to a sixth time,
wherein a time length from the second time to the third time and a time length from the fifth time to the sixth time are the same.

11. The method for driving the semiconductor device according to claim 10,
wherein the first photosensor comprises a first transistor and a second transistor,
wherein the second photosensor comprises a third transistor and a fourth transistor,
wherein a first terminal of the first transistor is electrically connected to a second terminal of the first photodiode,
wherein a second terminal of the first transistor is electrically connected to a gate of the second transistor,
wherein a first terminal of the third transistor is electrically connected to a second terminal of the second photodiode,
wherein a second terminal of the third transistor is electrically connected to a gate of the fourth transistor, and
wherein the method comprises the steps of:
performing the first imaging for the first photosensor by supplying a second signal to a gate of the first transistor from the second time to the fifth time; and
performing the second imaging for the second photosensor by supplying the second signal to a gate of the third transistor from the fifth time to the seventh time.

12. The method for driving the semiconductor device according to claim 11,
wherein the first transistor comprises an oxide semiconductor layer comprising a channel formation region, and
wherein the third transistor comprises an oxide semiconductor layer comprising a channel formation region.

13. A method for driving a semiconductor device comprising a first photosensor and a second photosensor, the first photosensor comprising a first photodiode, the second photosensor comprising a second photodiode, comprising the steps of:
performing a first reset operation for the first photosensor by supplying a first signal to a first terminal of the first photodiode from a first time to a second time;
performing a first irradiation of an object with first light from a light source from the second time to a fourth time;
performing a first imaging for the first photosensor by detecting the first light reflected off the object from the second time to the fourth time;
performing a second irradiation of the object with second light from the light source from an eighth time to an eleventh time;
performing a second reset operation for the first photosensor by supplying the first signal to the first terminal of the first photodiode from a tenth time to the eleventh time;
performing a second imaging for the first photosensor by detecting the second light reflected off the object from the eleventh time to a thirteenth time; and
performing a third imaging for the second photosensor by detecting third light from the second time to the fourth time and from the eleventh time to the thirteenth time,
wherein the second photodiode is formed over the first photodiode, and
wherein a time length from the second time to the fourth time and a time length from the eighth time to the eleventh time are the same.

14. The method for driving the semiconductor device according to claim 13, further comprising the steps of:
obtaining a first detection signal by the first imaging;
obtaining a second detection signal by the second imaging; and
obtaining a distance from the light source to the object with the first detection signal and the second detection signal.

15. The method for driving the semiconductor device according to claim 14, further comprising the step of:
obtaining the distance x from the light source to the object by following equation:

$$x = \frac{(c \times T \times S2)}{2 \times (S1 + S2)},$$

wherein S1 is the first detection signal, S2 is the second detection signal, T is the time length from the second time to the fourth time and c is a speed of light.

16. The method for driving the semiconductor device according to claim 13,
- wherein the first light reflected off the object enters the first photodiode from a third time to a fifth time,
- wherein the second light reflected off the object enters the first photodiode from a ninth time to a twelfth time, and
- wherein a time length from the second time to the third time, a time length from the fourth time to the fifth time, a time length from the eighth time to the ninth time, and a time length from the eleventh time to the twelfth time are the same.

17. The method for driving the semiconductor device according to claim 16,
- wherein the first photosensor comprises a first transistor and a second transistor,
- wherein a first terminal of the first transistor is electrically connected to a second terminal of the first photodiode,
- wherein a second terminal of the first transistor is electrically connected to a gate of the second transistor, and
- wherein the method comprises the steps of:
- performing the first imaging for the first photosensor by supplying a third signal to a gate of the first transistor from the second time to the fourth time; and
- performing the second imaging for the first photosensor by supplying the third signal to the gate of the first transistor from the eleventh time to the thirteenth time.

18. The method for driving the semiconductor device according to claim 17,
- wherein the first transistor comprises an oxide semiconductor layer comprising a channel formation region.

19. The method for driving the semiconductor device according to claim 18,
- wherein the first light comprises first infrared light,
- wherein the second light comprises second infrared light, and
- wherein the method comprises the steps of:
- performing the first imaging for the first photosensor by detecting the first infrared light reflected off the object and transmitted through the second photodiode; and
- performing the second imaging for the first photosensor by detecting the second infrared light reflected off the object and transmitted through the second photodiode.

20. The method for driving the semiconductor device according to claim 19,
- wherein the first photodiode comprises a single crystal silicon, and
- wherein the second photodiode comprises an amorphous silicon.

* * * * *